(12) United States Patent
Takasugi

(10) Patent No.: US 6,310,596 B1
(45) Date of Patent: Oct. 30, 2001

(54) SERIAL ACCESS MEMORY

(75) Inventor: Atsushi Takasugi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 08/141,664

(22) Filed: Oct. 26, 1993

(30) Foreign Application Priority Data

Oct. 26, 1992 (JP) .................................................. 4-287529

(51) Int. Cl.$^7$ ........................................................ G09G 3/36
(52) U.S. Cl. ............................................... 345/98; 345/566
(58) Field of Search ............................ 365/240, 189.12, 365/220, 221; 345/98, 196, 197, 198, 200, 103, 190, 193, 201, 566, 564, 565

(56) References Cited

U.S. PATENT DOCUMENTS

| | | | | |
|---|---|---|---|---|
| 4,159,538 | * | 6/1979 | Motoch | 365/230.02 |
| 4,442,503 | * | 4/1984 | Schütt et al. | 345/190 |
| 4,450,538 | | 5/1984 | Shirasaka . | |
| 4,562,435 | * | 12/1985 | McDonough | 345/200 |
| 4,562,555 | * | 12/1985 | Ouchi | 365/189.12 |
| 4,733,376 | * | 3/1988 | Ogawa | 365/221 |
| 4,746,979 | * | 5/1988 | Kashigi | 345/200 |
| 4,760,387 | * | 7/1988 | Ishii et al. . | |
| 4,896,294 | * | 1/1990 | Shimizu | 365/221 |
| 4,943,947 | * | 7/1990 | Kobayashi | 365/240 |
| 5,301,162 | * | 4/1994 | Shimizu | 365/230.03 |
| 5,319,603 | * | 6/1994 | Watanabe et al. | 365/230.09 |

FOREIGN PATENT DOCUMENTS

| | | | |
|---|---|---|---|
| 0 174 845 | 3/1986 | (EP) . | |
| 0 220 535 | 5/1987 | (EP) . | |
| 2-105388 | 4/1990 | (JP) . | |
| 3-76091 | 4/1991 | (JP) . | |
| 4275592 | * 10/1992 | (JP) | 345/200 |
| 9319452 | * 9/1993 | (WO) | 345/98 |

* cited by examiner

Primary Examiner—Chanh Nguyen
(74) Attorney, Agent, or Firm—Rabin & Champagne, P.C.

(57) ABSTRACT

A serial access memory having a first memory cell array and a second memory cell array. The serial access memory is provided with a control circuit for controlling the Most Significant Bit (MSB) of an address supplied to each of the first and second memory cell arrays. The control circuit causes the operations of circuits in the first memory cell array to become identical to those of circuits in the second memory cell array, thereby making it possible to read data at a high speed. An STN type LCD including the serial access memory, has a display device that facilitates production of memory maps in the memory cells without a need for externally-mounted elements such as a multiplexer.

19 Claims, 32 Drawing Sheets

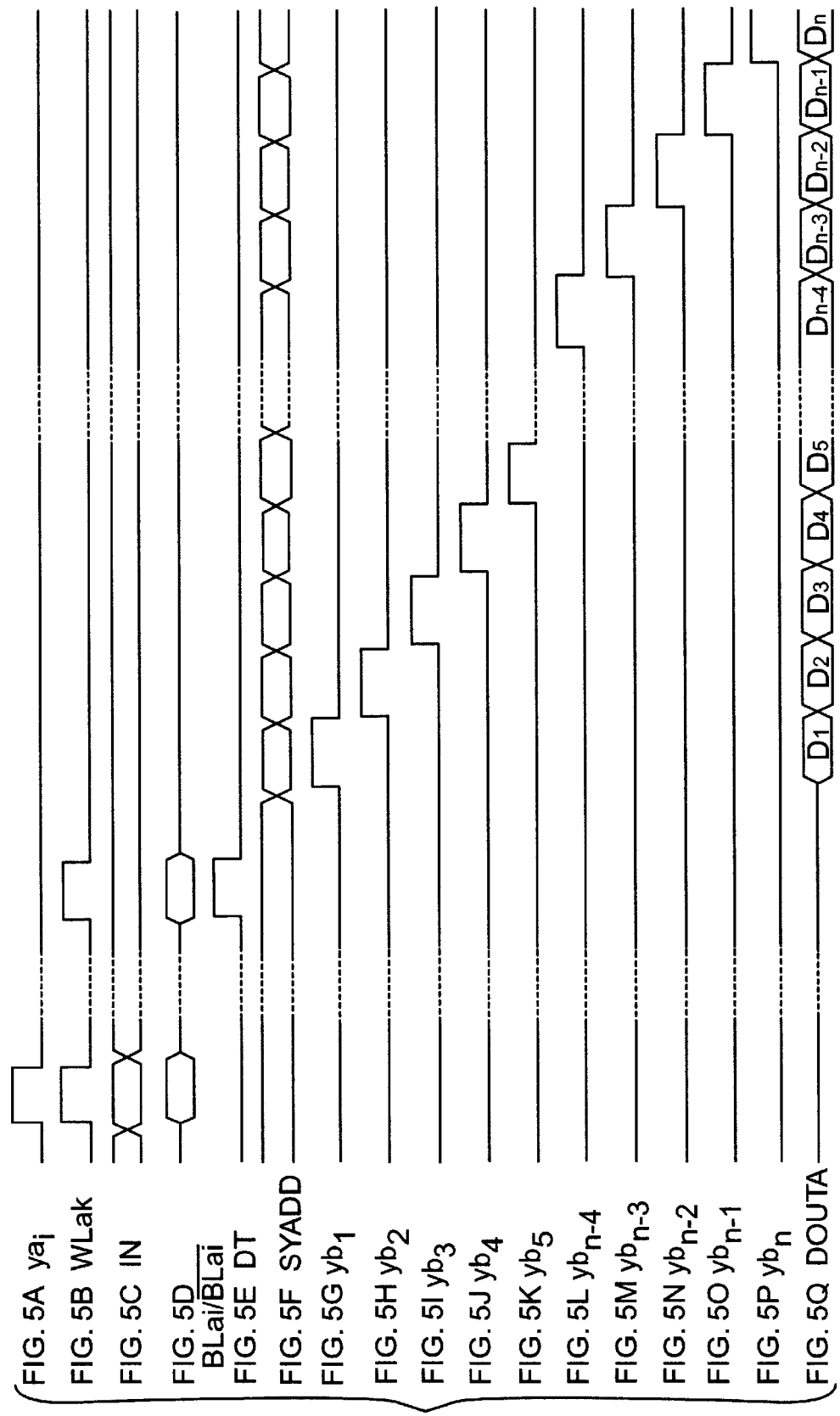

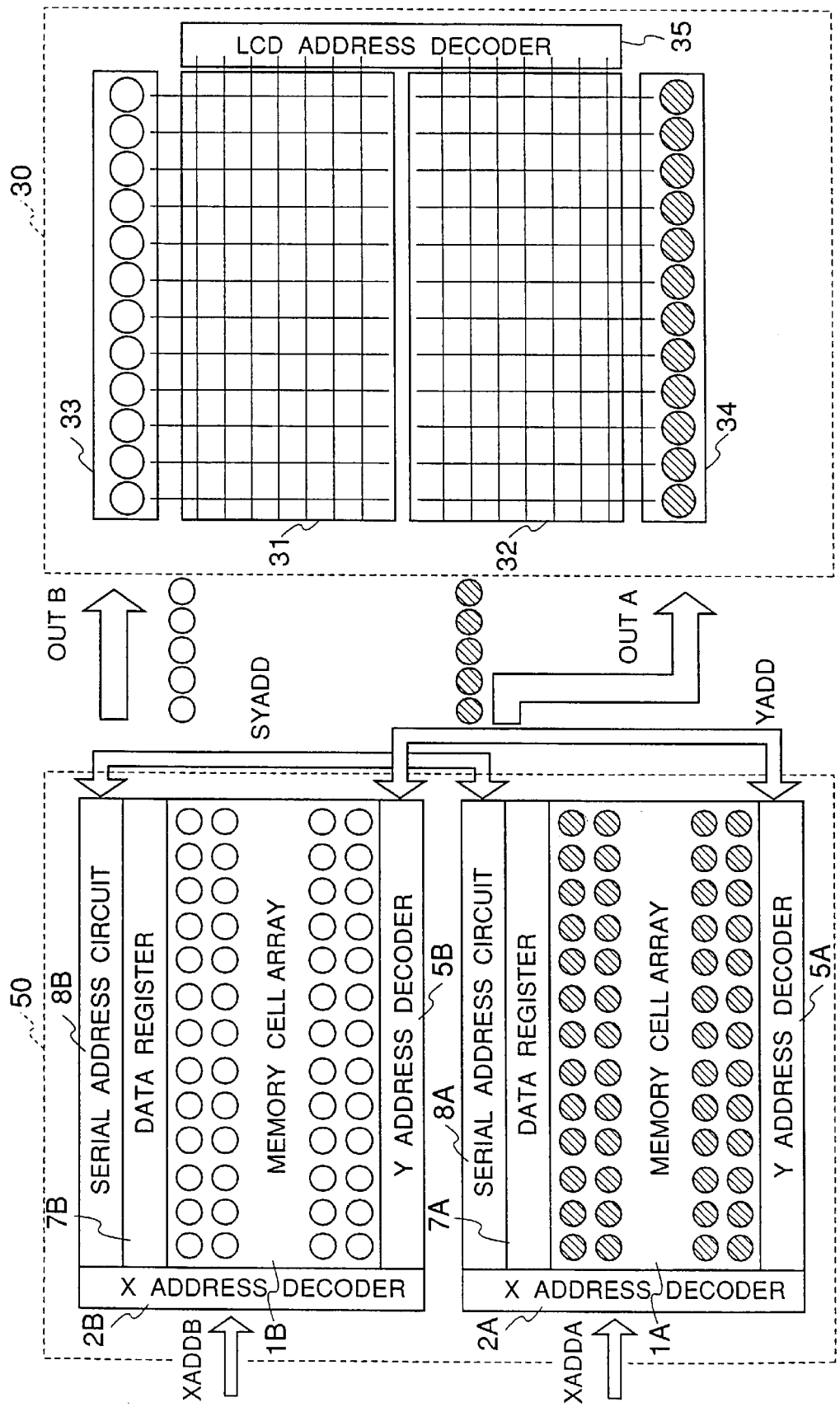

FIG. 15A(1) CLK
FIG. 15A(2) S0
FIG. 15A(3) S1

FIG. 15A(1-3)

FIG. 15B(1) CLK
FIG. 15B(2) P1
FIG. 15B(3) P2
FIG. 15B(4) P3
FIG. 15B(5) P4
FIG. 15B(6) OUT A

FIG. 15B(1-6)

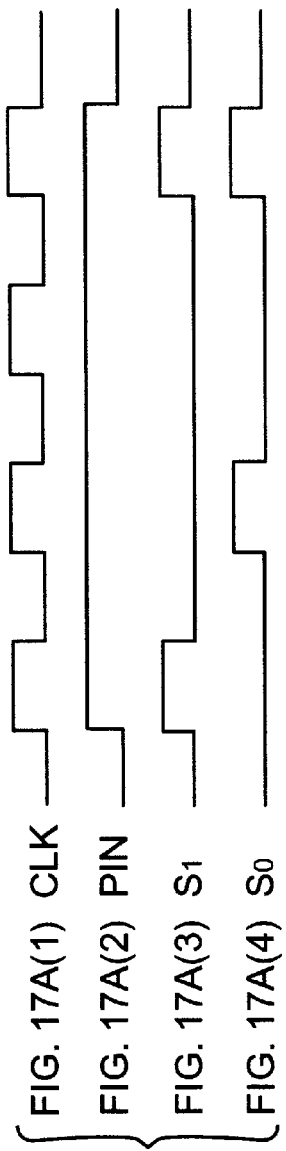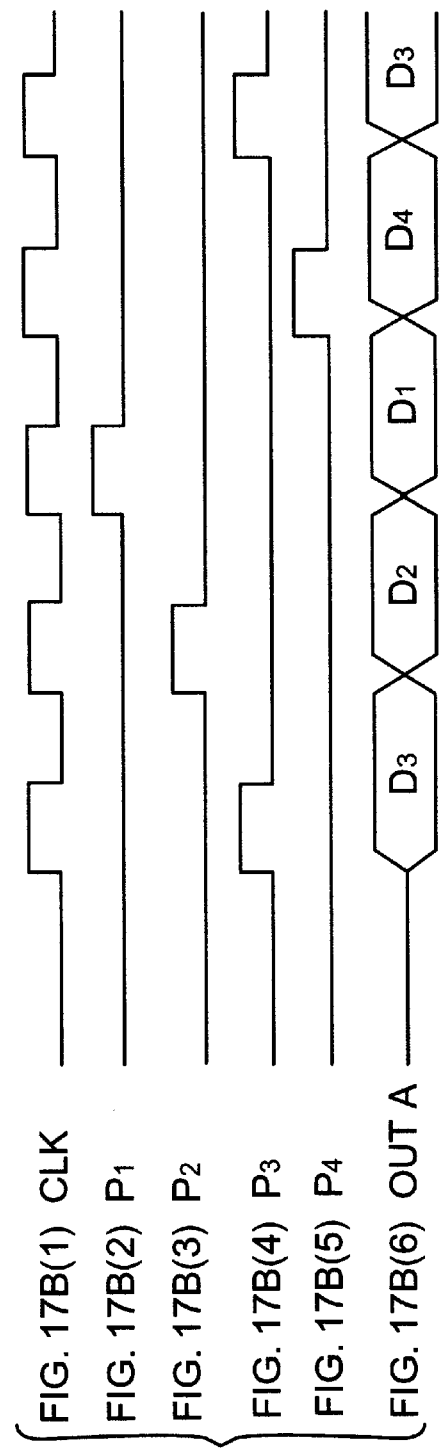

FIG. 19A-F

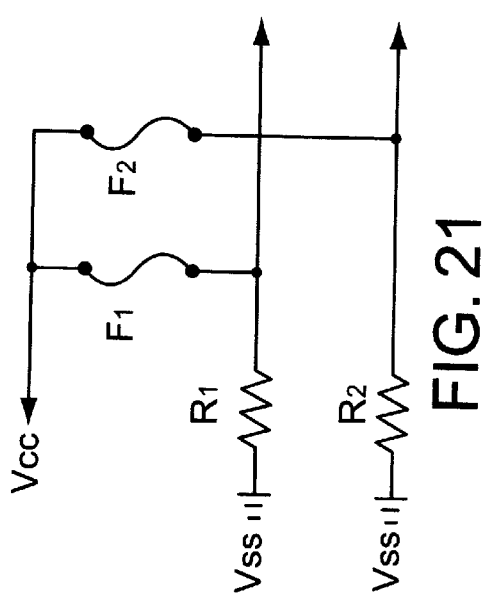
FIG. 21
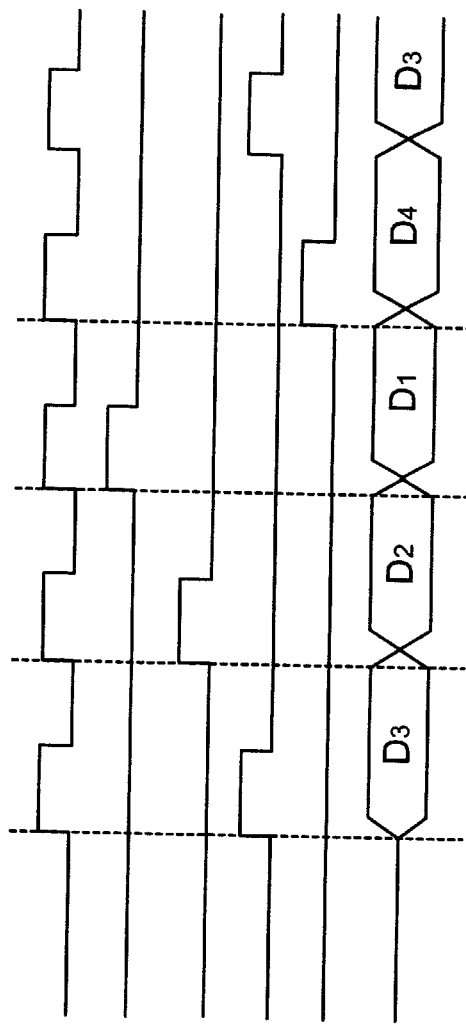
FIG. 22A-F

SERIAL ACCESS MEMORY

REFERENCE TO RELATED APPLICATIONS

This application claims the light of priority under 35 U.S.C.119, of Japanese Patent Application Ser. No. 04-287529, filed on Oct. 26, 1992.

BACKGROUND OF THE INVENTION

1. Field of the Invention

This invention relates to a semiconductor memory, and particularly to a serial access memory that can be used in image processing and operated at a high speed.

2. Description of the Related Art

A serial access memory has been widely used for image processing in personal computers, word processors and the like. The serial access memory employed in image processing needs a high image-drawing speed. To meet such a demand, a device is normally used wherein a serial access memory is electrically connected to a general-purpose dynamic random access memory (hereinafter called a "DRAM"). This type of device writes data into the DRAM and thereafter reads data corresponding to a desired row, one row at a time. Then, the read data are transferred to the serial access memory, from which the data are serially read.

This type of serial access memory has been disclosed in Japanese Patent Application Laid-Open Publication Nos. 2-105388 (Laid-Open Date: Apr. 17, 1990) and 3-76091 (Laid-Open Date: Apr. 2, 1991).

SUMMARY OF THE INVENTION

It is an object of the present invention to provide a serial access memory which can be operated at a high speed.

It is another object of the present invention to provide a serial access memory which is capable of easily producing memory maps in memory cells and makes it unnecessary to provide externally-mounted elements such as a multiplexer, etc., and particularly to provide a serial access memory applicable to a Super Twisted Nematic (STN) type liquid crystal display (LCD) which is employed in office automation (OA) devices such as a laptop personal computer, a word processor, etc.

In order to achieve the above objects, the present invention provides a serial access memory comprising first and second memory cell arrays, which memory is provided with a control circuit for controlling the Most Significant Bit (MSB) of an addess supplied to each of the first and second memory cell arrays. That is, a MSB control circuit is provided which is capable of making the MSB of each address appear invalid when data is transferred from each memory cell array. Owing to the provision of the MSB control circuit, the operations of circuits in the first memory cell array become identical to those of circuits in the second memory cell array.

Further, when the serial access memory of the present invention is applied to the STN type LCD, a display device can be achieved which is capable of easily producing memory maps in memory cells and making it unnecessary to provide externally-mounted elements such as a multiplexer, etc.

BRIEF DESCRIPTION OF THE DRAWINGS

While the specification concludes with claims particularly pointing out and distinctly claiming the subject matter which is regarded as the invention, it is believed that the invention, and the objects, features and advantages thereof will be better understood from the following description taken in connection with the accompanying drawings in which:

FIGS. 5A–5Q are a partial timing chart for describing a portion of the operation of the serial access memory according to the present invention;

FIG. 8 is a block diagram showing one example in which the serial access memory according to the present invention is applied to a Super Twisted Nematic (STN) type Liquid Crystal Display (LCD);

FIGS. 15A(1)–15A(3) and 15B(1)–15B(6) are respective partial timing charts for describing the operation of the output-sequence converting circuit shown in FIG. 14;

FIGS. 17(A)(1)–17(A)(4) and 17(B)(1)–17(B)(6) are respectively partial timing charts for describing the operation of the output-sequence converting circuit shown in FIG. 16;

FIG. 21 is a block diagram showing the configuration of a trimming circuit which is a component of the output-sequence converting circuit shown in FIG. 20;

FIGS. 22A–22F are a partial timing chart for describing the operation of the output-sequence converting circuit shown in FIG. 20;

DETAILED DESCRIPTION OF THE PREFERRED EMBODIMENTS

Figure 1:
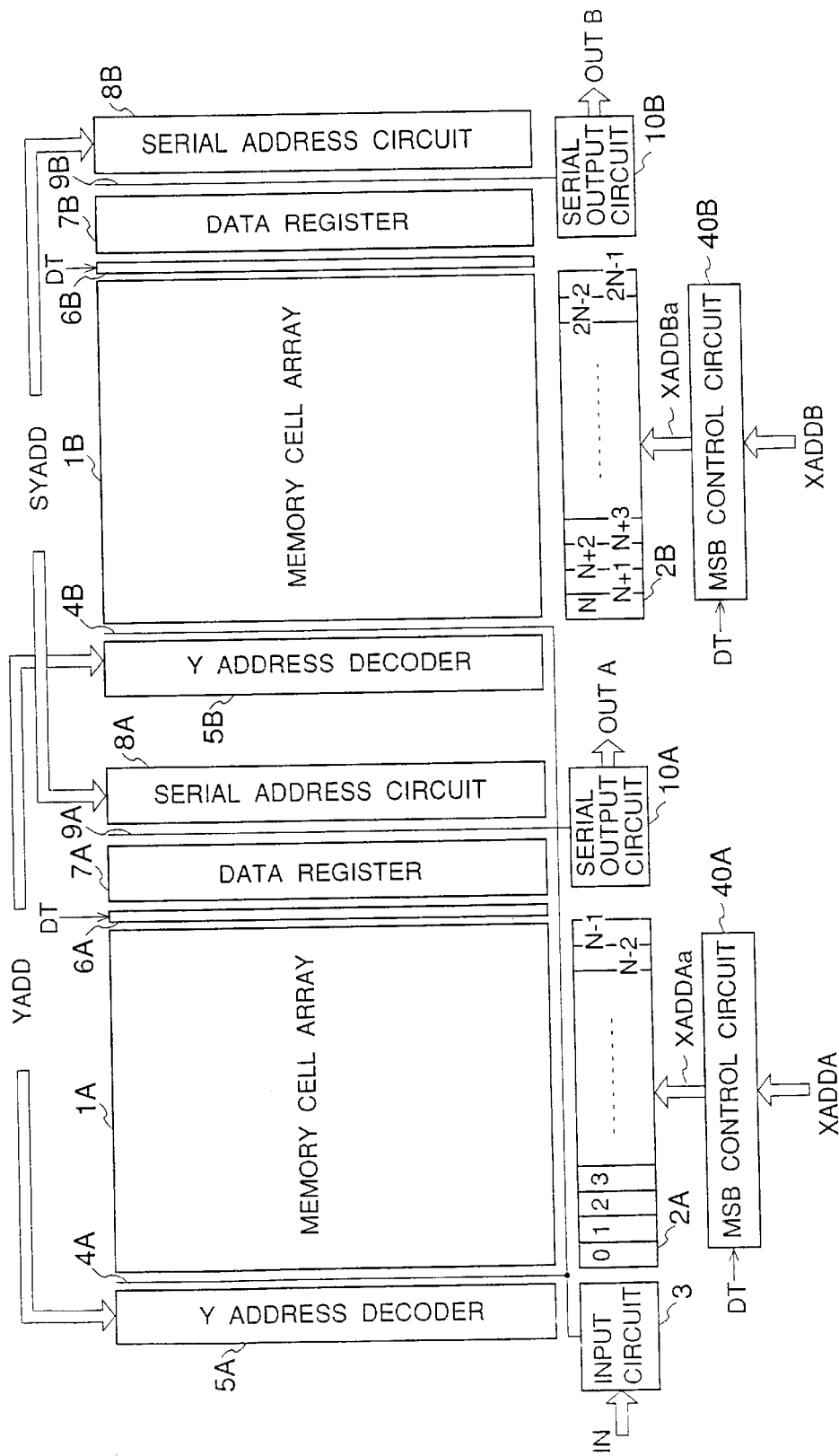
FIG. 1 is a fragmentary block diagram showing the structure of a serial access memory according to a first embodiment of the present invention.

Preferred embodiments of the present invention will hereinafter be described with reference to the accompanying drawings. Common elements employed in the respective embodiments are identified by like reference numerals. In the respective embodiments, memory control signal generating circuits and the like, which are not directly concerned with a basic operation of the present invention, are omitted to facilitate understanding of the description.

Figure 2A:
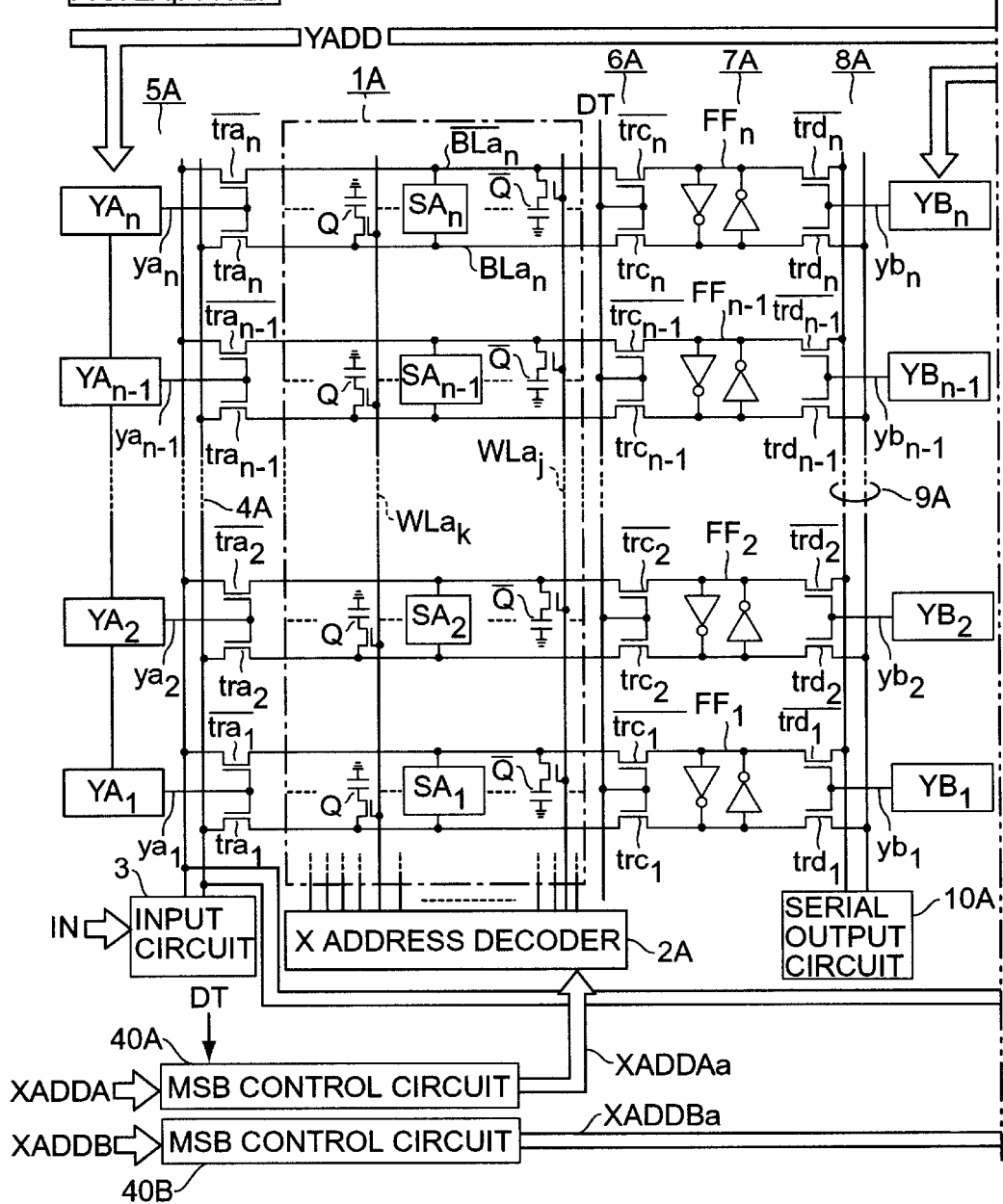
FIG. 2 is a fragmentary block diagram showing the serial access memory of FIG. 1 in detail.
Figure 2B:
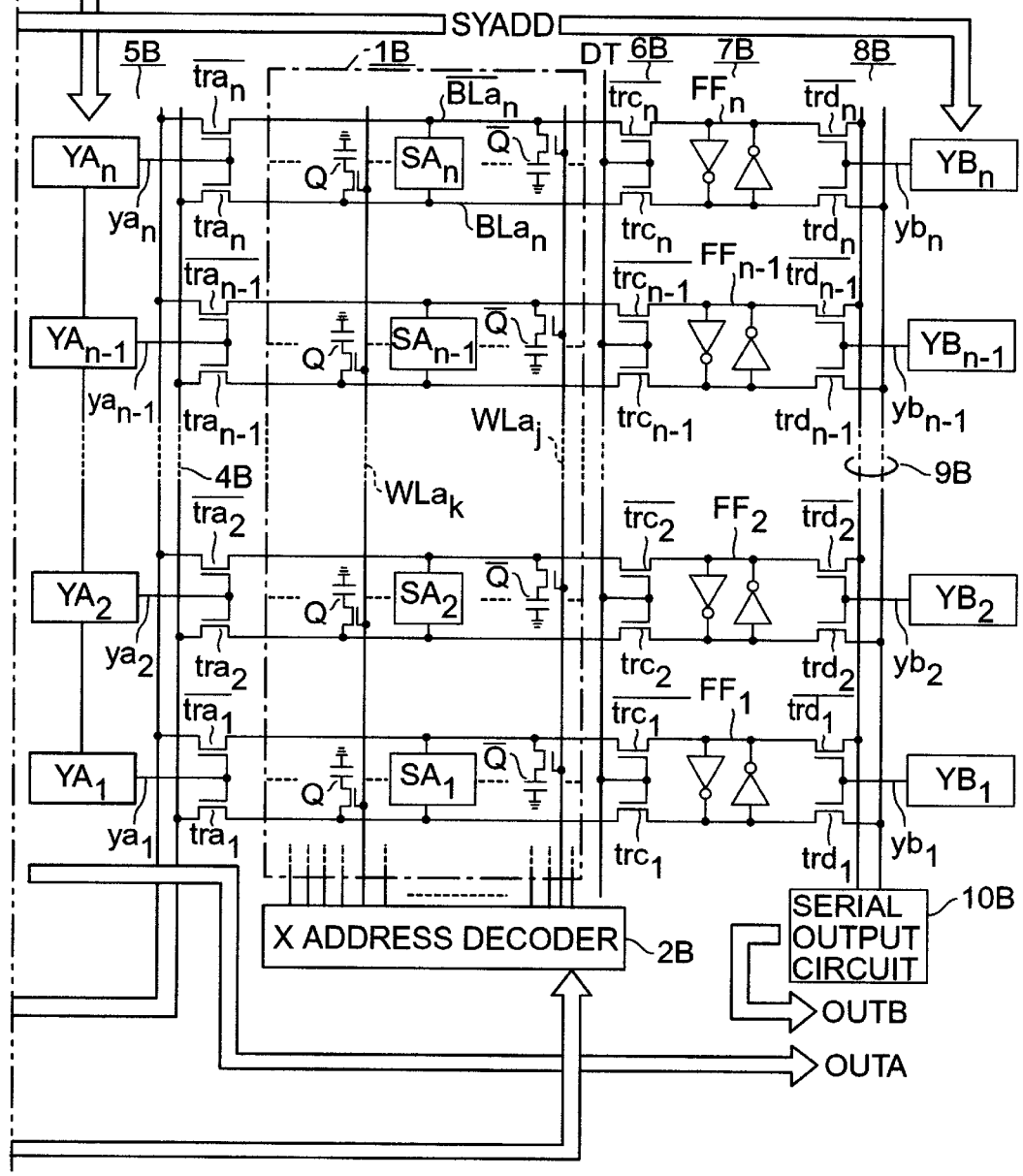

A serial access memory according to a first embodiment of the present invention will first be described with reference to FIGS. 1 and 2. FIG. 1 is a block diagram showing the structure of the serial access memory of the present invention. FIG. 2 is a block diagram illustrating, in detail, the structure of a principal part of the serial access memory shown in FIG. 1. Elements shown in FIG. 2, which are common to those shown in FIG. 1 are identified by the same reference numerals as those employed in FIG. 1.

The serial access memory according to the present embodiment has a first memory cell array 1A and a second memory cell array 1B. The memory cell arrays 1A and 1B, each have respective pluralities of word lines $WLa_j$ and $WLa_k$ (j and k range from 0 to N−1 in array 1A and from N to 2N−1 in array 1B) and a plurality of complementary bit lines pairs $BLa_i$ and $\overline{BLa_i}$ which intersect these word lines. $WLa_j$ and $WLa_j$. Memory cells Q, each comprised of a transistor and a capacitor, are respectively electrically connected to points where the word lines $WLa_k$ intersect the bit lines $BLa_i$. Further, the memory cells Q are arranged in row and column directions. Similarly, memory cells Q, each comprised of a transistor and a capacitor, are respectively electrically connected to points where the word lines $WLa_j$ intersect the bit lines $BLa_i$ respectively. The respective bit line pairs $BLa_i$ and $\overline{BLa_i}$ are respectively electrically connected to sense amplifiers $SA_i$ (i=1 to n). X address decoders 2A and 2B are respectively electrically connected to the memory cell arrays 1A and 1B. The X address decoder 2A is electrically connected to the word lines WLaj and WLak of the array 1A. Further, the X address decoder 2A has a function to decode 0th to N−1th X addresses XADDAa (binary values 0 to N−1) of an ordered X address group XADD and selecting a desired column from the memory cell array 1A. The X address decoder 2B is electrically connected to the word lines WLaj and WLak of the array 1B. Further, the X address decoder 2B has a function to decode Nth to 2N−1th X addresses XADDBa (binary values N to 2N−1) of the X address group XADD and selecting a desired column from the memory cell array 1B.

An input circuit 3 is a circuit for inputting write data inputted from an input terminal IN to the memory arrays 1A and 1B via respective write data buses 4A and 4B.

Y address decoders 5A and 5B each comprise a respective plurality of unit Y decoders $YA_i$ (i=1 to n) for decoding a common input Y address group YADD and a respective plurality of transistor pairs $tra_i$ and $\overline{tra_i}$ (i=1 to n). The transistor pairs $tra_i$ and $\overline{tra_i}$ (i=1 to n) of the decoders 5A and 5B are respectively electrically connected between write data buses 4A and 4B and the bit line pairs $BLa_i$ and $\overline{BLa_i}$ respectively of the memory cell arrays 1A and 1B. Desired transistor pairs in each unit Y decoder 5A and 5B are selected based on outputs $ya_i$ (i=1 to n) of their unit Y decoders $YA_i$. The Y address decoders 5A and 5B respectively have functions to decode the common Y address group YADD and select desired rows from the respective memory cell arrays 1A and 1B. Data on the write data buses are input to the selected rows.

Read transfer circuits 6A and 6B are each made up of a respective plurality of transistor pairs $trc_i$ and $\overline{trc_i}$ (i=1 to n) connected to their corresponding bit line pairs $BLa_i$ and $\overline{BLa_i}$. The transistor pairs $trc_i$ and $\overline{trc_i}$ are controlled in accordance with a data transfer signal DT. Each of the read transfer circuits 6A and 6B has a function to transfer data corresponding to one column selected from each of the memory cell arrays 1A and 1B, to the respective data registers 7A and 7B, in response to the data transfer signal DT.

The data registers 7A and 7B are each comprised of a plurality of flip-flops $FF_i$ (i=1 to n) connected to their corresponding transistor pairs $trc_i$ and $\overline{trc_i}$. Each of the flip-flops $FF_i$ is made up of two inverters inversely parallel-connected to each other. Each of the data registers 7A and 7B has a function for storing therein read data corresponding to one column, which is transferred from each of the read transfer circuits 6A and 6B. The data registers 7A and 7B are respectively electrically connected to serial address circuits 8A and 8B. Further, the data registers 7A and 7B are also electrically connected to their corresponding serial output circuits 10A and 10B via read data buses 9A and 9B respectively.

Each of the serial address circuits 8A and 8B comprises a plurality of unit serial address decoders $YB_i$ (i=1 to n) for decoding a serial address group SYADD and a plurality of transistor pairs $trd_i$ and $\overline{trd_i}$. The transistor pairs $trd_i$ and $\overline{trd_i}$ of the respective circuits 8A and 8B are respectively electrically connected between the flip-flops $FF_i$ of the respective data regiisters 7A and 7B and the respective read data buses 9A and 9B. Desired transistor pairs are respectively selected based on outputs $yb_i$ produced from the unit serial address decoders $YB_i$. Each of the serial address circuits 8A and 8B has a function to serially output read data corresponding to one column, which has been stored in each of the data registers 7A and 7B, to each of the read data buses 9A and 9B. Each of the serial address circuits 8A and 8B may be constructed of a shift register that is shift-activated in response to a synchronizing clock signal or a serial address pointer.

The serial output circuits 10A and 10B serially output read data that has been respectively transmitted over the respective read data buses 9A and 9B, from the respective output terminals OUTA and OUTB, in response to a synchronizing control clock signal (the outputs from the serial output circuits 10A and 10B correspond to serial data).

A first most significant bit (hereinafter abbreviated as "MSB") control circuit 40A and a second MSB control circuit 40B are respectively electrically connected to the X address decoders 2A and 2B.

The first MSB control circuit 40A is supplied with an X address group XADDA. The first MSB control circuit 40A has a function to supply an X address group XADDAa which makes the MSB of the X address group XADDA appear invalid to the X address decoder 2A, in response to the data transfer signal DT supplied when the transfer of data from the memory cell arrays 1A and 1B to the corresponding data registers 7A and 7B is performed.

Similarly, the second MSB control circuit 40B is supplied with an X address group XADDB. The second MSB control circuit 40B has a function to supply an X address group XADDBa which makes the MSB of the X address group XADDB appear invalid to the X address decoder 2B, in response to the data transfer signal DT.

Configurations of the first and second MSB control circuits 40A and 40B will hereinafter be described in detail. Since the first MSB control circuit 40A is identical in circuit configuration to the second MSB control circuit 40B, a description will hereinafter be made of the first MSB control circuit 40A alone. It is apparent that the second MSB control circuit 40B also can be easily understood from the following description.

Figure 3:
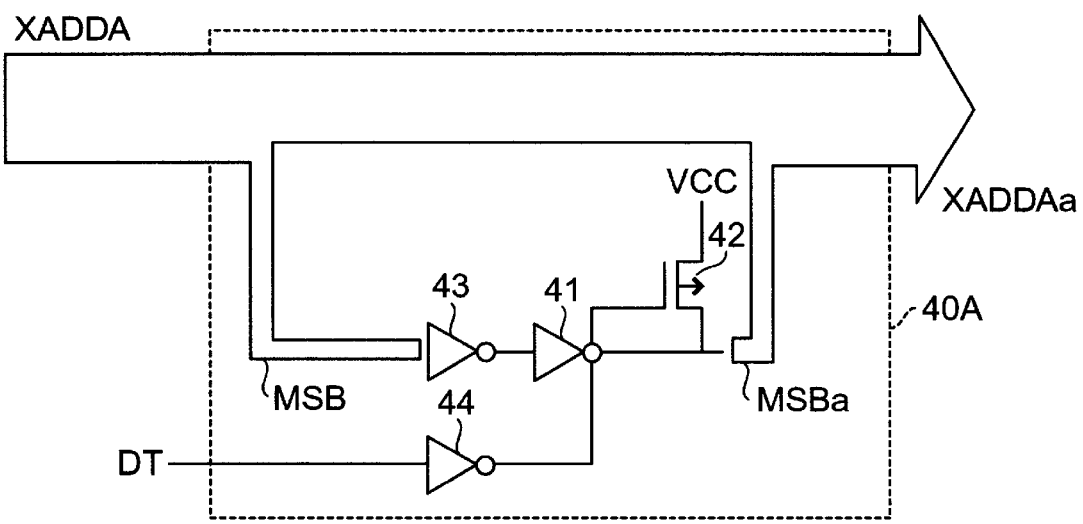
FIG. 3 is a schematic block diagram showing the structure of a Most Significant Bit (MSB) control circuit shown in FIG. 1.

FIG. 3 is a circuit diagram schematically showing the first MSB control circuit 40A. The first MSB control circuit 40A comprises an inverter 43 supplied with the MSB of the X address group XADDA input from an external source, a tristate inverter 41 electrically connected to the output of inverter 43, a P channel MOS transistor (hereinafter abbreviated as "PMOS") 42 having a drain electrode which is electrically connected to the output of the tristate inverter 41, for preventing the occurrence of a floating state, and an inverter 44 for controlling the tristate inverter 41 in response to the data transfer signal DT.

When the X address group XADDA is input to the first MSB control circuit 40A, the MSB of the X address group XADDA is input to the inverter 43. When a logical level of the data transfer signal DT is brought to a high (hereinafter abbreviated as "H") level, the output of the inverter 44 is brought to a low (hereinafter abbreviated as "L") level. As a result, the output of the tristate inverter 41 is brought into a high-impedance state. Since, at this time, the PMOS 42 is turned ON in response to the output ("L") of the inverter 44, the output of the inverter 41 is brought to a power source potential VCC. As a result, the output MSBa is forcibly brought to the "H" level. Thus, the first MSB control circuit 40A outputs internal addresses, i.e., the X address group XADDAa. When, on the other hand, the logical level of the data transfer signal DT is brought to the "L" state, the output of the inverter 44 is in an "H" state. Therefore, the tristate inverter 41 serves as an inverter which simply performs an inversion operation. Accordingly, the MSB of the X address group XADDA is inverted by the inverter 43 and inverted again by the tristate inverter 41. As a result, the output MSBa of the inverter 43 is a signal having the same phase as that of the MSB.

Similarly, when the X address group XADDB is input to the second MSB control circuit 40B, the MSB of the X address group XADDB is input to the inverter 43. At this time, the output of the inverter 44 is brought to a low (hereinafter abbreviated as "L") level when the logical level of the data transfer signal DT is high (hereinafter abbreviated as "H"). As a result, the output of the tristate inverter 41 is brought to a high-impedance state. Since, at this time, the PMOS 42 is turned ON in response to the low ("L") output of the inverter 44, the output of the tristate inverter 41 is brought to the power source potential VCC. As a result, the output MSBb of the inverter 41 is forcibly brought to the "H" level. Thus, the second MSB control circuit 40B outputs internal addresses, i.e., the X address group XADDBa. When, on the other hand, the logical level of the data transfer signal DT is "L", the output of the inverter 44 is brought to the "H" level. Therefore, the tristate inverter 41 serves as an inverter which simply performs an inversion operation. Accordingly, the MSB of the X address group XADDB is inverted by the inverter 43 and the output of the inverter 43 is inverted by tristate the inverter 41. As a result, the output MSBb of the inverter 43 is a signal whose phase is identical to that of the MSB.

Specific configurations of the first and second MSB control circuits 40A and 40B and their peripheral circuits will hereinafter be described in detail with reference to FIG. 4. In this case, the first MSB control circuit 40A is identical in structure to the second MSB control circuit 40B. Therefore, only the first MSB control circuit 40A will be described below. The second MSB control circuit 40B will be easily understood from the following description.

An X address circuit 2A comprises a gate circuit 2-1 made up of N AND gates ($AND_0$ to $AND_{N-1}$) and an X decoder 2-2 made up of N unit X decoders $XD_0$ to $XD_{N-1}$ which are composed principally of NAND gates. Each unit decoder $XD_k$ is electrically connected to its corresponding word line $WLa_k$. Thus, a desired address is selected from complementary addresses $B_0$, $\overline{B_0}$ to $B_{n-1}$, $\overline{B_{n-1}}$ forming the X address group XADDAa by the gate circuit 2-1 so as to be input to the X decoder 2-2. The complementary addresses $B_{n-1}$ and $\overline{B_{n-1}}$ of the X address group XADDAa correspond to the MSBa.

The first MSB control circuit 40A outputs complementary addresses $A_0$, $\overline{A_0}$ to $A_{n-2}$, $\overline{A_{n-2}}$ as the addresses $B_0$, $\overline{B_0}$ to $B_{n-2}$, $\overline{B_{n-2}}$ as they are, exclusive of the $A_{n-1}$, $\overline{A_{n-1}}$ corresponding to the MSB. The complementary addresses $A_{n-1}$, $\overline{A_{n-1}}$ of the X address group XADDA, which correspond to the MSB, are input to inverters 43-2 and 43-1 respectively. Then, the first MSB control circuit 40A outputs the complementary addresses $B_{n-1}$, $\overline{B_{n-1}}$ from tristate inverters 41-2 and 41-1 when the data transfer signal DT is in the "L" state. The first MSB control circuit 40A converts the complementary addresses $A_{n-1}$, $\overline{A_{n-1}}$ into the complementary addresses $B_{n-1}$, $\overline{B_{n-1}}$ and outputs the latter therefrom. When the data transfer signal DT is of the "L" state, the logical level of the data transfer signal DT is inverted by the inverter 44, and thus, the tristate inverters 41-1 and 41-2 performs normal inversion operations. Therefore, the MSB or addresses $A_{n-1}$, $\overline{A_{n-1}}$ are inverted by the inverters 43-2 and 43-1 and thereafter inverted again by tristate inverters 41-2 and 41-1. Accordingly, the first MSB control circuit 40A outputs the complementary addresses $B_{n-1}$, $\overline{B_{n-1}}$ (MSBa), which are respectively in phase with the complementary addresses $A_{n-1}$, $\overline{A_{n-1}}$ corresponding to the MSB. On the other hand, when the data transfer signal DT is of the "H" state, the logical level of the data transfer signal DT is inverted by the inverter 44. Thus, each of the outputs of the tristate inverters 41-1 and 41-2 is brought into a high-impedance state. Since PMOSs 42-1 and 42-2 are turned ON in response to the low ("L") output of the inverter 44, the complementary addresses $B_{n-1}$, $\overline{B_{n-1}}$ are both brought to the "H" level. Thus, an input terminal of the gate circuit 2-1, supplied with the addresses MSBa ($B_{n-1}$, $\overline{B_{n-1}}$), is brought to the "H" level. That is, one of the inputs of one of the AND gates in the gate circuit 2-1 is brought to the "H" level. This means a state (which corresponds to an invalid state of the MSB) equivalent to the input terminal supplied with the complementary addresses $B_{n-1}$, $\overline{B_{n-1}}$ being disconnected from the gate circuit 2-1. That is, this is equivalent to the complementary addresses $A_{n-1}$, $\overline{A_{n-1}}$ being in a degenerated state.

Similarly, the second MSB control circuit 40B is supplied with the X address group XADDB. The first MSB control circuit 40B has a function to supply an X address group XADDBa which makes the MSB of the X address group XADDB appear invalid to the X address decoder 2B, in response to the data transfer signal DT.

The operation of the above-described serial access memory will be described below with reference to a timing chart shown in FIGS. 5A–5Q. In this case, the operation of the first memory cell array 1A is basically identical to that of the second memory cell array 1B. Therefore, a typical operation of the first memory cell array 1A will be described below. The operation of the second memory cell array 2B also will be easily understood from the following description.

The first MSB control circuit 40A in the serial access memory of the present invention is supplied with 0th to N–1th X addresses XADDA of the X address group XADD, whereas the second MSB control circuit 40B is supplied with Nth to 2N–1th X addresses XADDB of the X address group XADD. The first and second MSB control circuits 40A and 40B convert the respective X address groups XADDA and XADDB into respective internal X address groups XADDAa and XADDBa and output them to the respective X address decoders 2A and 2B.

When data is written into the memory cell array 1A, the X address group XADDA is supplied to the first MSB control circuit 40A and the Y address group YADD is supplied to the Y address decoder 5A. At the same time, the write data (FIG. 5C) is input from the input terminal IN. Since the data transfer signal DT (FIG. 5E) is in the "L" state, the input X address group XADDA is sent to the X address decoder 2A via the first MSB control circuit 40A as the X address group XADDAa having the same addresses as those in the X address group XADDA. The X address decoder 2A decodes the X address group XADDAa and sets a desired word line $WLa_k$ at the "H" level (FIG. 5B), so as to select a desired column. Thus, transistors in each of the memory cells Q, electrically connected to the word line $WLa_k$ are turned ON. Further, the unit Y decoder $YA_j$ in the Y address decoder SA decodes the Y address group YADD so as to bring the output $Ya_j$ of the desired unit Y decoder $YA_j$ to the "H" level (FIG. 5A). Therefore, a pair of transistors $\overline{tra_{n-1}}$ and $\overline{tra_{n-1}}$ is turned ON. Thus, since the write data bus 4A and the paired bit lines $BLa_j$, $\overline{BLa_{n-1}}$ are electrically connected to each other, the write data input from the input terminal IN is sent to the paired bit lines $BLa_j$, $\overline{BLa_j}$ (FIG. 5D) via the input circuit 3 and the write data bus 4A. As a result, the write data is written into a memory cell Q.

A description will next be made of the case where the data transfer signal DT is brought to the "H" level and data is transferred.

Figure 6A:
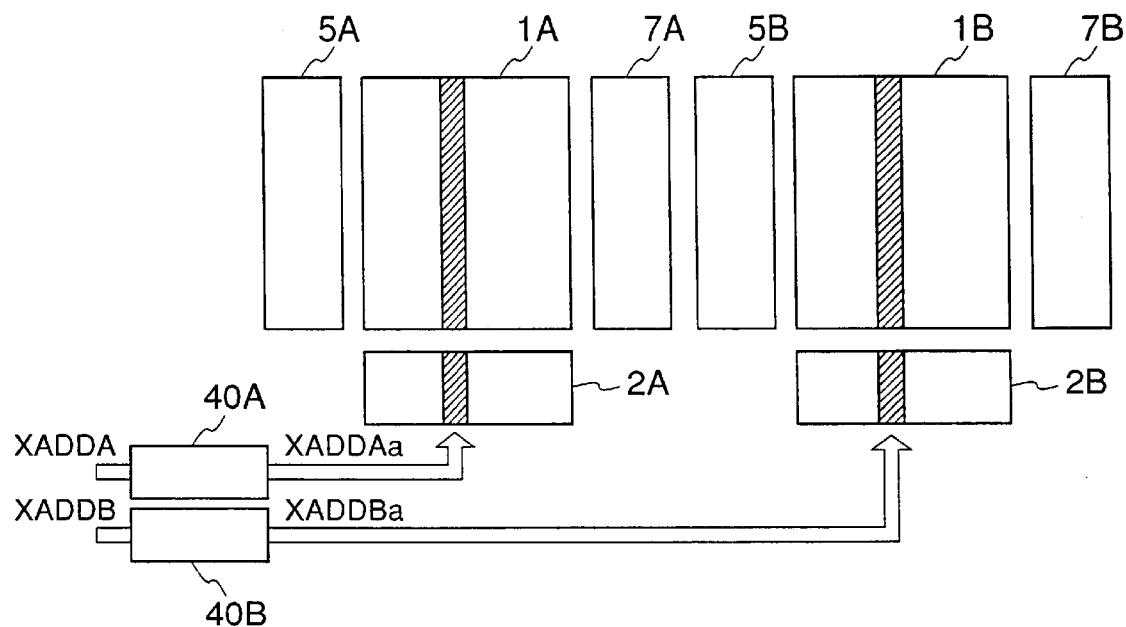
FIGS. 6(A) and 6(B) are explanatory views illustrating a typical serial access operation of the serial access memory according to the present invention.

When the data transfer signal DT is in the "H" state, i.e., when the data are transferred from the memory cell arrays 1A and 1B to the data registers 7A and 7B respectively, the MSB control circuits 40A and 40B are activated in response to the data transfer signal DT so as to output the X address groups XADDAa and XADDBa, which make the MSB's of the X address groups XADDA and XADDB invalid, to the respective X address decoders 2A and 2B. Therefore, the X address decoders 2A and 2B become identical to each other in their circuit operation. That is, the X address group XADDAa input to the X address decoder 2A and the X address group XADDBa input to the X address decoder 2B become equal to each other by the first and second MSB control circuits 40A and 40B. Thus, the identical columns are respectively selected from the memory cell arrays 1A and 1B as shown in FIG. 6A. This will be described specifically by the following simple example. When the X address group XADDA is represented as "00000, 00001, 00010, 00011 to 01111" and the X address group XADDB is represented as "10000, 10001, 10010, 10011 to 11111", the X address groups XADDAa and XADDBa, which have made the MSBs of the respective address groups invalid, are both brought to the same values, i.e., "x0010, x0011, x00010, x00011 to x1111". The term "x" means that the MSB's have been made invalid. That is, the MSB's can be made invalid by bringing one of the inputs of the gate circuit 2-1 into the "H" state.

Figure 6B:
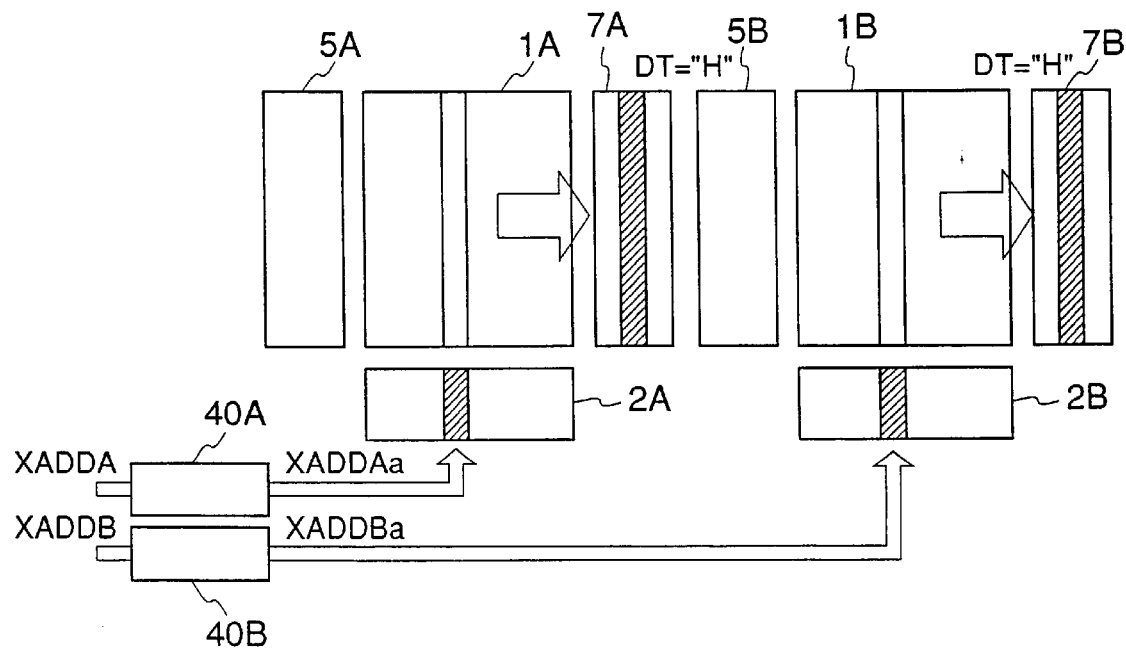

When the 0th to N–1th X addresses XADDA of the X address group XADD are supplied to the first MSB control circuit 40A during a transfer cycle, the first MSB control circuit 40A outputs the X address group XADDAa, which makes the MSB of the X address group XADDA invalid, to the X address decoder 2A. The X address decoder 2A selects a desired word line $WLa_k$ based on the X address group XADDAa. Thus, the data stored in the memory cells Q which are electrically connected to the selected word line $WLa_k$ is output to the bit lines $BLa_j$. Thereafter the output data is amplifiers by the corresponding sense amplifier $SA_j$. When, on the other hand, the Nth to 2N–1th X addresses XADDB of the X address group XADD are supplied to the second MSB control circuit 40B, the second MSB control circuit 40B invalidatesits MSB to form the X address group XADDBa is identical to the X address group XADDAa, and outputs the same to the X address decoder 2B. The X address decoder 2B selects a desired word line $WLa_k$ from the memory cell array 1B, corresponding to the selected line of memory cell array 1A, based on the X address group XADDBa. As a result, the data stored in the memory cells Q electrically connected to the selected word line $WLa_j$ is output to the paired bit lines $BLa_j$, $\overline{BLa_j}$, and is thereafter amplifiers by the corresponding sense amplifier $SA_j$, similarly to the outputting and amplification of data in memory cell array 1A. Since, at this time, the data transfer signal DT is in the "H" state, the read transfer circuits 6A and 6B are both brought into an ON state. Thus the amplified data on the bit line pairs $BLa_j$, $\overline{BLa_j}$ in the respective memory cell arrays 1A and 1B are respectively transferred to the data registers 7A and 7B at the same time, and stored in the corresponding flip-flops $FF_i$ of the data registers 7A and 7B as shown in FIG. 6B.

When the serial address group SYADD (FIG. 5F) is then supplied to the serial address circuits 8A and 8B, it is decoded by the serial address circuits 8A and 8B. Further, the outputs ybj of the unit serial address decoders $YB_i$ are successively brought to the "H" level (FIGS 5G–5P). As a result, the transistor pairs $trd_i$ and $\overline{trd}_i$ are successively turned ON. Thus, the read data stored in the data registers 7A and 7B are respectively transferred to the read data buses 9A and 9B. Thereafter, the data are serially output from the output terminals OUTA (FIG. 5Q) and OUTB of the output circuits 10A and 10B. The timing diagram shown in FIGS. 5A–5Q represents operating times related to the memory cell array 1A.

Figure 7A:
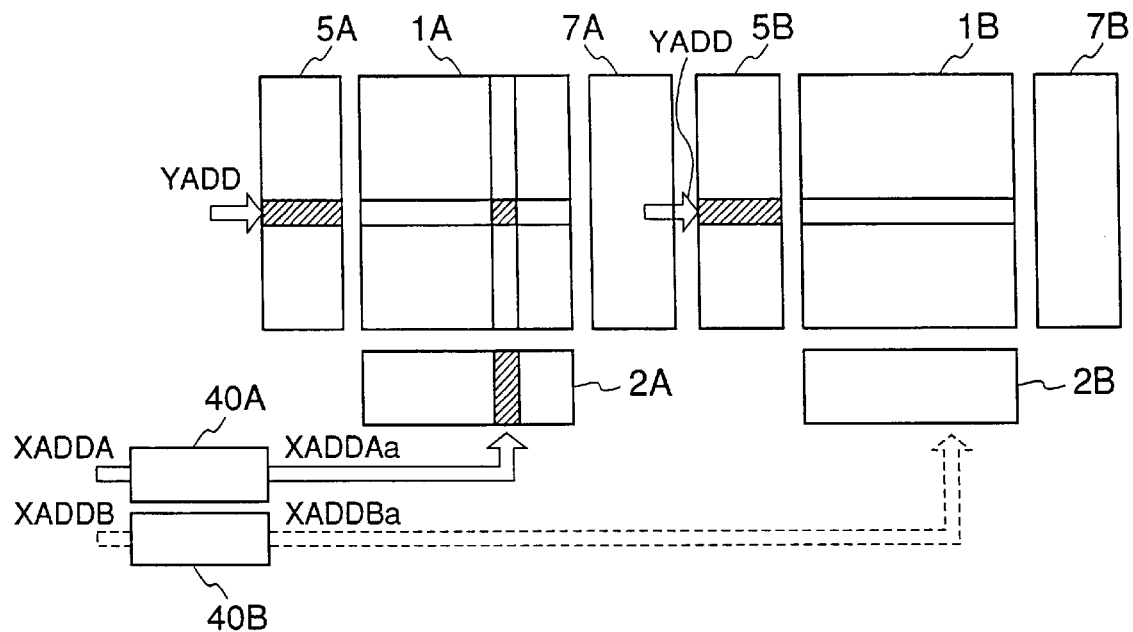
FIGS. 7(A) and 7(B) are respectively explanatory views illustrating a typical random access operation of the serial access memory according to the present invention.
Figure 7B:
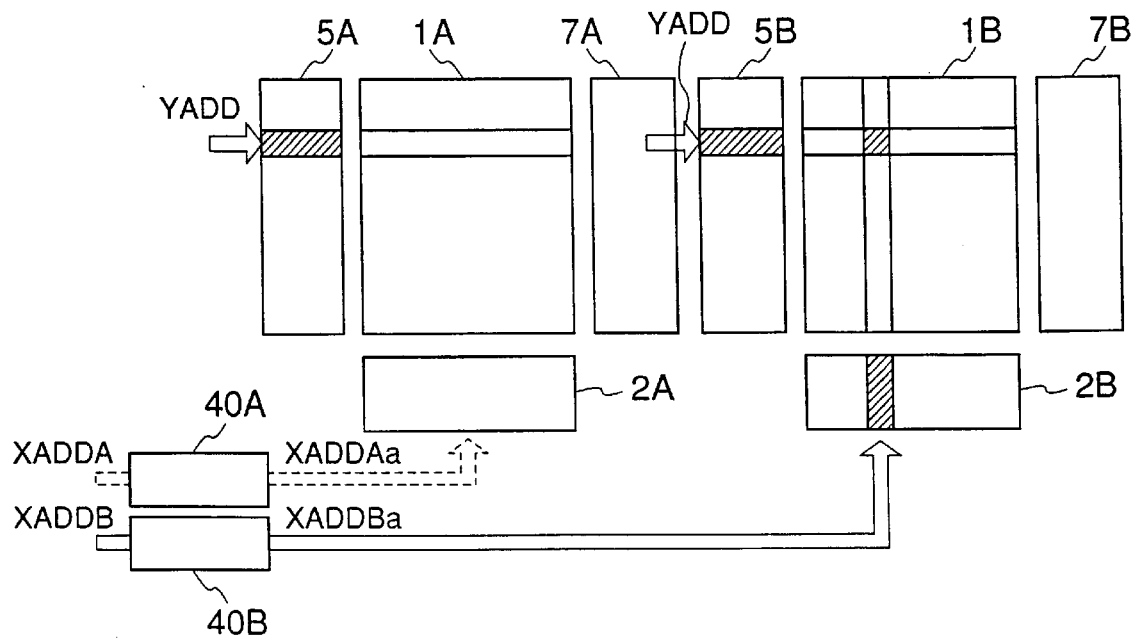

A brief description will now be made of the case where the serial access memory performs random access, by way of illustrative example, with reference to FIGS. 7A and 7B. Similarly to the access operation of a normal DRAM circuit, the serial access memory selects a desired memory cell based on the X address group XADD and the Y address group YADD. Then, data is stored in the selected memory. When the X address group XADD corresponds to the 0th to N–1th X addresses XADDA, a memory cell in the memory cell array 1A is accessed as shown in FIG. 7A. When, on the other hand, the X addresses group XADD corresponds to the Nth to 2N–1th X addresses XADDB, a memory cell in the memory cell array 1B is accessed as shown in FIG. 7B. Thus, when the serial access memory of the present invention performs random access, the memory cell arrays 1A and 1B can be accessed as if they were one memory cell array.

Next, one example of an STN type LCD to which the serial access memory of the present invention is applied, will be described with reference to FIG. 8. The STN type LCD 30 is divided into a first LCD 31 and a second LCD 32. As shown in FIG. 8, the first and second LCDs have been schematically drawn or laid out in the form of a matrix. The STN type LCD 30 is driven by first and second LCD driving circuits 33 and 34, provided so as to correspond to the divided two screens, and an LCD address decoder 35. Pixels for forming the screens of the first and second LCDs 31 and 32 are respectively provided at points where grids lines forming the matrix intersect with each other. A pixel selected by the first and second LCD driving circuits 33 and 34 and the LCD address decoder 35 provides a luminescent spot. Where the serial access memory 50 of the present invention is applied to the STN type LCD 30, the memory cell array 1B and the memory cell array 1A are respectively provided so as to correspond to the first and second LCD's 31 and 32. Further, as described above, the first and second MSB control circuits 40A and 40B are respectively activated in response to the data transfer signal DT to thereby make the X address decoders 2A and 2B identical to each other in circuit operation. As a result, the data are directly and simultaneously output from the output terminals OUTA and OUTB to the second LCD driving circuit 34 and the first LCD driving circuit 33, respectively. Since the data are directly output to the first and second LCD driving circuits 33 and 34 from the respective output terminals, the STN type LCD 30 can be operated without providing an external signal selection circuit. Thus, the first and second LCD's 31 and 32 can be driven simultaneously. Further, since the serial access memory of the present invention can also perform random access as described above, access to a desired memory cell in each memory cell array can be easily carried out. Accordingly, image data (memory maps) written into each memory cell array for the purpose of an image display can be produced so as to exactly correspond to the visual representation of images actually displayed on the LCD. As a result, memory maps created to obtain a desired image display can be easily obtained. It is thus possible to lighten the requirements for software development and so reduce its cost.

Thus, since the serial access memory of the present invention has MSB control circuits for making invalid the MSB's of the X address groups input from the outside, in response to the data transfer signals DT, when the data is brought to a transfer mode, the circuit oparations of the first and second memory cell arrays can be made identical. As a result, the data stored in the first and second memory cell arrays can be read out in serial form.

A serial access memory according to a second embodiment of the present invention will now be described below.

In the serial access memory according to the second embodiment, independent serial address groups SYADDA and SYADDB are supplied to the corresponding serial address circuits 8A and 8B, as an alternative to the serial address group SYADD given in common to the serial address circuits 8A and 8B in the serial access memory according to the first embodiment of the present invention. Since the independent serial address groups are used, the serial address circuits 8A and 8B can select different addresses from the respective data registers 7A and 7B. Thus, the data stored in the respective data registers 7A and 7B, can be output saparately in serial form. The operation of the serial access memory according to the second embodiment is identical to that of the serial access memory according to the first embodiment. Since the serial access memory according to the second embodiment is accessed based on the independent serial address groups SYADDA and SYADDB, one pair of the data register 7A or 7B and the serial address circuit 8A or 8B can be independently operated even if the other pair of the data register 7A or 7B and the serial address circuit 8A or 8B has a defect. Further, since the serial address groups SYADDA and SYADDB are set independently, a non-synchronous serial access operation can be effected.

Figure 9:
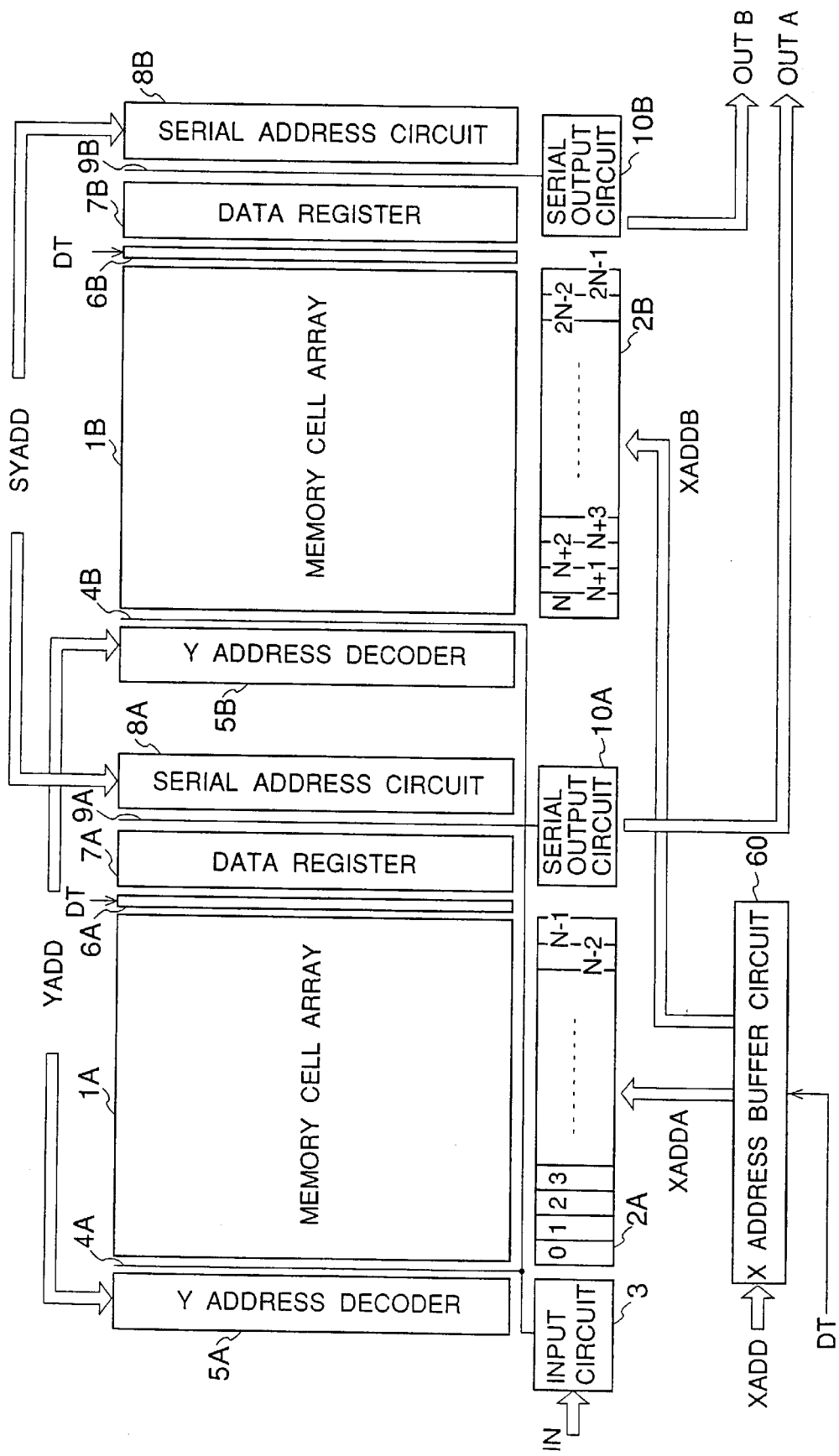
FIG. 9 is a fragmentary block diagram showing the structure of a serial access memory according to a third embodiment of the present invention.

A serial access memory according to a third embodiment of the present invention will next be described below with reference to FIG. 9 and FIGS. 10A and 10B. FIG. 9 is a block diagram showing the structure of the serial access memory according to the third embodiment.

The serial access memory shown in FIG. 9 is provided with an X address buffer circuit 60 having a function similar to that of each of the above described MSB control circuits 40A and 40B of the serial access memory according to the first embodiment, as an alternative to the MSB control circuits 40A and 40B. The X address buffer circuit 60 is supplied with an X address group XADD and a data transfer signal DT. The X address buffer circuit 60 converts the externally supplied X address group XADD into an internal X address group XADD', and supplies an internal X address group XADDA and an internal X address group XADDB to the respective X address decoders 2A and 2B. Further, the X address buffer circuit 60 has a function to subtract only a predetermined value from the X address group XADDB so that the X address group XADDB is equal to the X address group XADDA during a data transfer cycle in which data are respectively transferred from memory cell arrays 1A and 1B to data registers 7A and 7B.

A configuration of the X address buffer circuit 60 and specific configurations of its peripheral circuits will be described below with reference to FIGS. 10A and 10B.

Figure 10A:
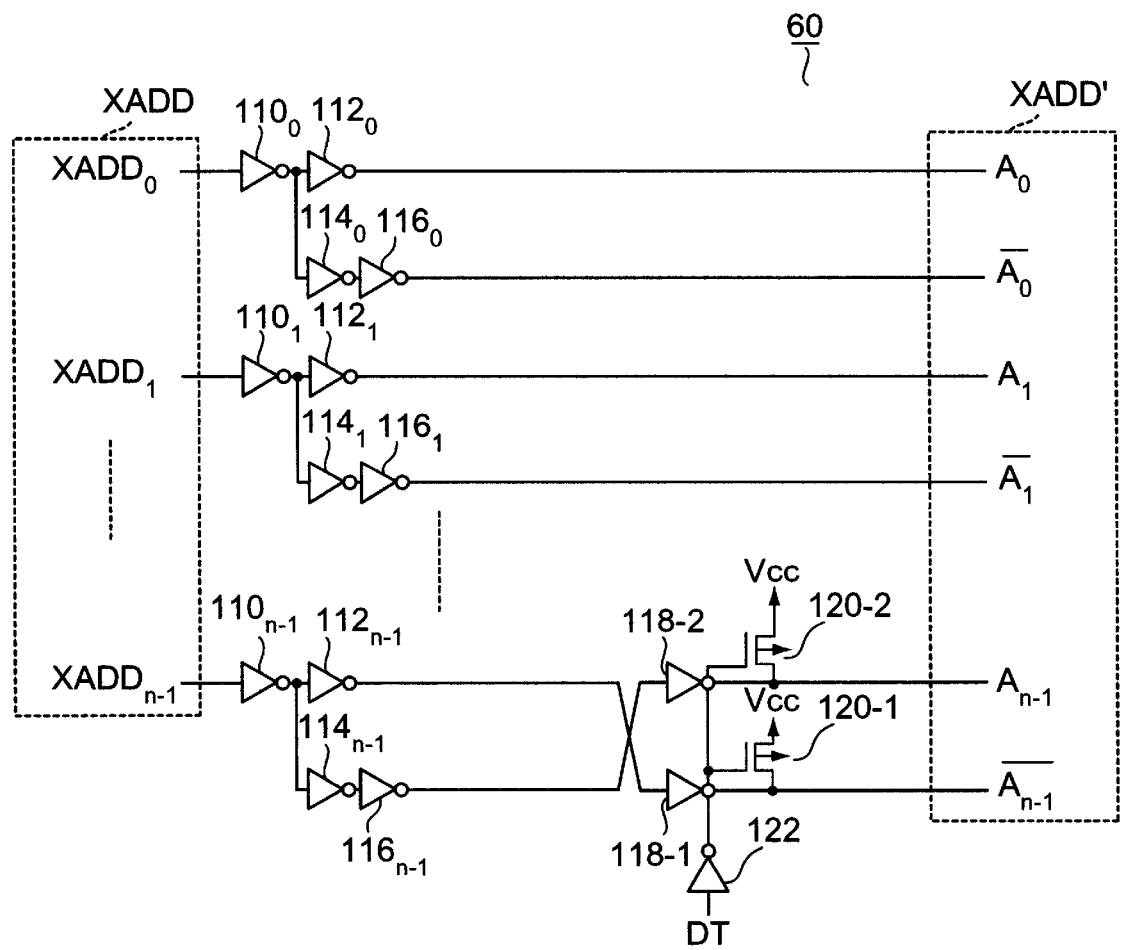
FIGS. 10(A) and 10(B) are fragmentary block diagrams showing the specific structures of the X address buffer circuit shown in FIG. 9 and its peripheral circuits.

As shown in FIG. 10A, the X address buffer circuit 60 has inverters $110_r$ (r=0 to n−1) having inputs supplied with the X address group XADD, inverters $112_r$ electrically connected to the outputs of the corresponding inverters $110_N$, inverters $114_r$ electrically series-connected to the outputs of the corresponding inverters $112_r$, and inverters $116_r$ connected to the outputs of the corresponding inverters $114_r$. Further, the X address buffer circuit 60 has a tristate inverter 118-1 electrically connected to the inverter $112_{n-1}$ so as to be supplied with a MSB ($XADD_{n-1}$) of an X address $XADD_{n-1}$, a tristate inverter 118-2 similarly electrically connected to the inverter $116_{n-1}$, and PMOSs 120-1 and 120-2 respectively electrically connected to the tristate inverters 118-1 and 118-2. The tristate inverters 118-1 and 118-2 are controlled by the data transfer signal DT supplied via an inverter 122.

Figure 4:
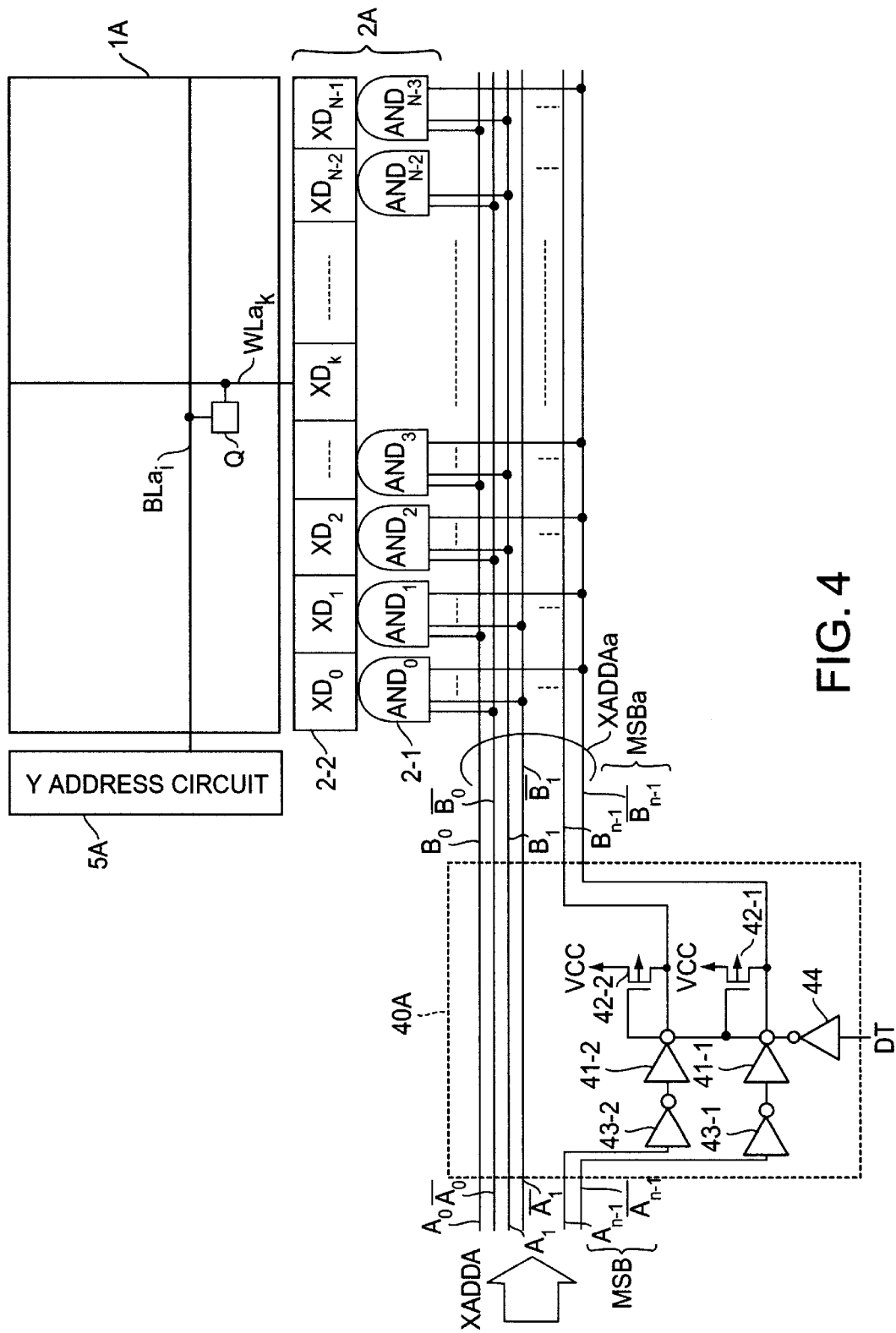
FIG. 4 is a block diagram illustrating the specific structures of the MSB control circuit shown in FIG. 3 and its peripheral circuits.

The operation of the X address buffer circuit 60 will be easily understood by reference to the description of the aforementioned MSB control circuit (see FIG. 4). That is, when the data transfer signal DT is in the "L" state, the X address buffer circuit 60 outputs the internal X address group XADD' based on the externally supplied X address group XADD. The X address group XADD' is made up of complementary addresses $A_0$, $\overline{A_0}$ to $A_{n-1}$, $\overline{A_{n-1}}$. On the other hand, when the data transfer signal DT is in the "H" state, the X address buffer circuit 60 sets the complementary addresses $A_{n-1}$, $\overline{A_{n-1}}$ corresponding to the MSB of the internal X address group XADD' to the "H" state. As a result, the same address is supplied to each of the X address decoders 2A and 2B during a data transfer cycle (when the data transfer signal DT is rendered "H") in the same manner as the first embodiment. Accordingly, the circuit operation of memory cell arrays 1A and 1B become identical during the data transfer cycle.

Figure 10B:
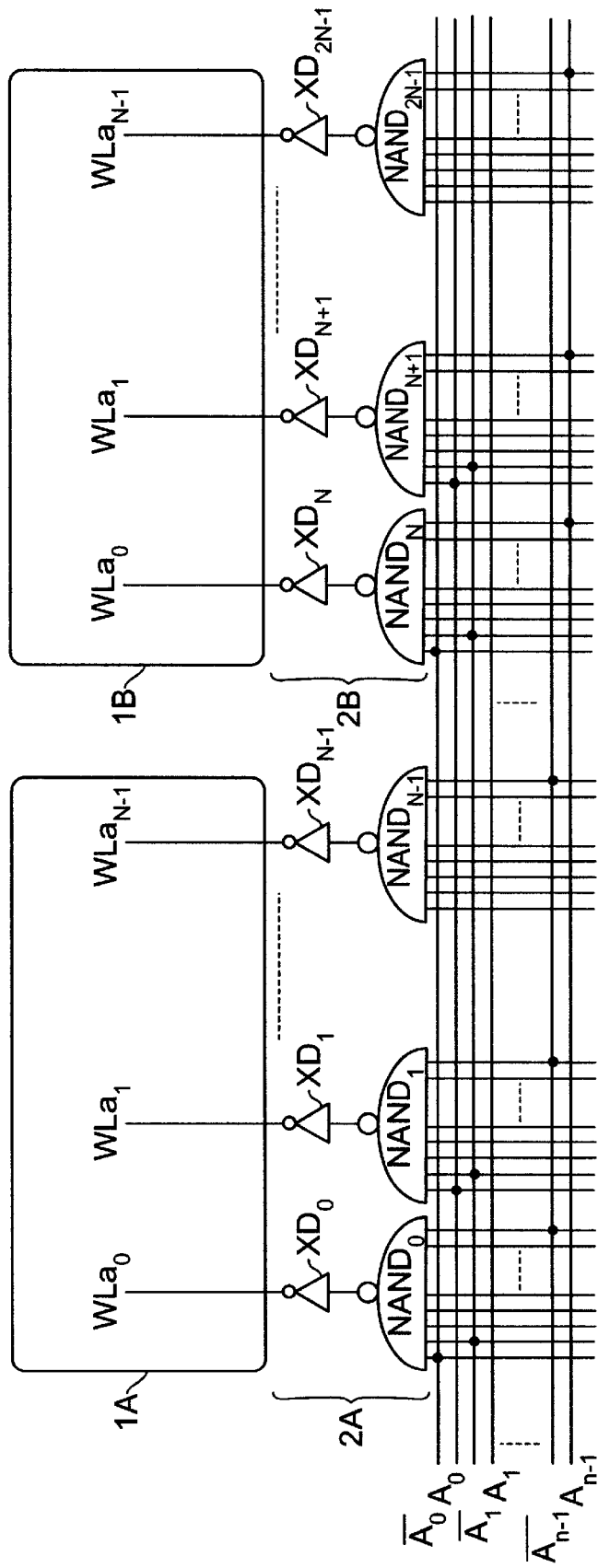

The internal X address group XADD' output from the X address buffer circuit 60 is supplied to each of the address decoders 2A and 2B via a common data bus as shown in FIG. 10B.

Thus, when the above-described X address buffer circuit is employed in the serial access memory of the present invention, only the predetermined value is subtracted from the X address group XADDB upon transmission of data, so that the X address group XADDB becomes equal to the X address group XADDA. Thus, the X address group XADDA (addresses which decode to 0 to N−1) and X address group XADDB (addresses which decode to N to 2N−1) can be set on an arbitrary basis. That is, "N" may not be an integral multiple of 2, and hence the serial access memory can be widely used for various purposes.

Even if serial address circuits 8A and 8B supplied with the common serial address group SYADD consists of address pointers including shift registers operated in response to a common synchronizing clock, the same operations and effects as described above for the first embodiment can be obtained similarly for the third embodiment.

A serial access memory according to a fourth embodiment of the present invention will next be described below.

The serial access memory according to the fourth embodiment of the present invention differs from that according to the third embodiment only in that independent serial address groups SYADDA and SYADDB are respectively input to the serial address circuits 8A and 8B.

The serial access memory according to the fourth embodiment is operated in a manner substantially similar to that according to the third embodiment. However, since the serial address groups SYADDA and SYADDB input to the corresponding serial address circuits 8A and 8B are independent, data stored in the data registers 7A and 7B at addresses different from each other can be output in serial form. That is, since data stored in the data registers 7A and 7B at respective different addresses can be selected, one pair of the data register 7A or 7B and the serial address circuit 8A or 8B can be independently operated even if the other pair of the data register 7A or 7B and the serial address circuit 8A or 8B has a defect. Further, since a serial address group is not applied in common to both serial address circuits, the serial address circuits 8A and 8B can obtain serial access to stored data asynchronously with respect to each other.

A serial access memory according to a fifth embodiment of the present invention will now be described with reference to FIGS. 11 and 12.

Figure 11:
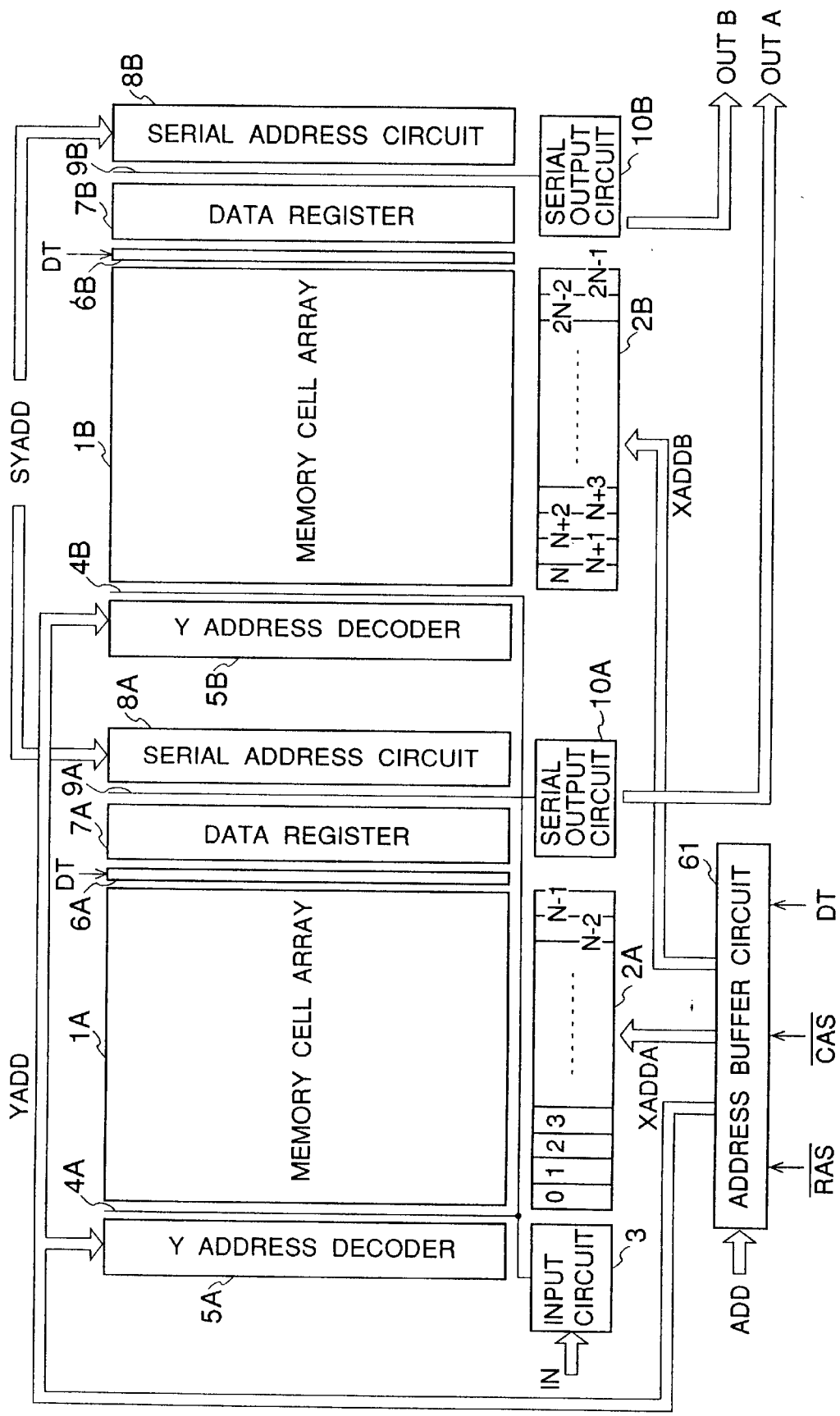
FIG. 11 is a fragmentary block diagram showing the structure of a serial access memory according to a fifth embodiment of the present invention.

FIG. 11 is a block diagram schematically showing the structure of the serial access memory according to the fifth embodiment of the present invention. Elements common to those shown in FIG. 9 illustrating the third embodiment, are identified by common reference numerals.

The serial access memory according to the fifth embodiment has an address buffer circuit 61 which performs the same function as the X address buffer circuit 60 which has been described above with respect to the third embodiment. The address buffer circuit 61 is externally supplied with an address group ADD, iand also supplied with a data transfer signal DT, a row address strobe signal $\overline{RAS}$ and a column address strobe signal $\overline{CAS}$. The address buffer circuit 61 outputs internal X address groups XADDA and XADDB in the same manner as does the X address buffer circuit 60 of the third embodiment. Further, the address buffer circuit 61 functions to output an internal Y address group YADD, to be supplied to Y address decoders 5A and 5B. Moreover, the address buffer circuit 61 has an address fetching function identical to that of a general-purpose DRAM, for time-divisionally taking in X and Y address groups from the address group ADD supplied from the same address terminal, based on the row address strobe signal $\overline{RAS}$ and the column address strobe signal $\overline{CAS}$.

Figure 12:
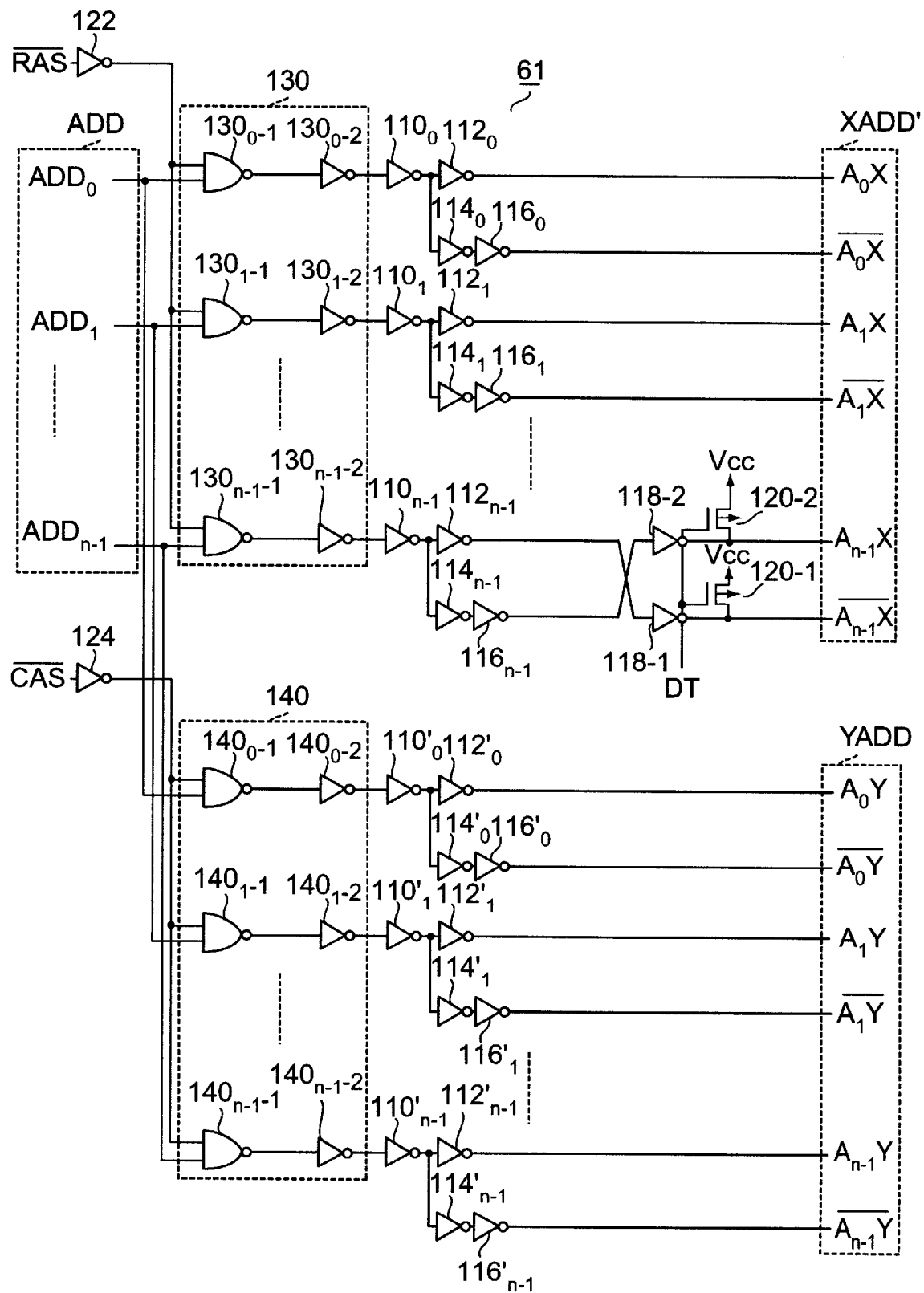
FIG. 12 is a fragmentary block diagram illustrating a specific configuration of an address buffer circuit shown in FIG. 11.

FIG. 12 illustrates a specific circuit configuration of the address buffer circuit 61. In this case, the same elements of structure as those employed in the X address buffer circuit 60 shown in FIG. 10A are identified by the same reference numerals and their description will therefore be omitted.

The address buffer circuit 61 has a gate circuit 130 externally supplied with the row address strobe signal $\overline{RAS}$, input via an inverter 122, and with the address group ADD. The gate circuit 130 comprises NANDs $130_{r-1}$ (r=0 to n−1), supplied with the inverted row address strobe signal $\overline{RAS}$ and the external address group ADD, and inverters $130_{r-2}$, respectively electrically connected between the outputs of the NANDs $130_{r-1}$ and the inverters $110_r$. Further, the address buffer circuit 61 has a gate circuit 140 supplied with the column address strobe signal $\overline{CAS}$ via an inverter 124, and with the address group ADD. The gate circuit 140 is made up of NANDs $140_{r-1}$, supplied with the inverted column address strobe signal CAS and the external address group ADD, and inverters $140_{r-2}$, respectively electrically connected between the outputs of the NAND's $140_{r-1}$ and inverters $110_r$. Components having the same functions as those of the components in the X address buffer circuit 60 are denoted by identical reference numerals with apostrophes ('), and their description will therefore be omitted.

When the address group ADD corresponding to the external input is input from the same address terminal, the address buffer circuit 61 in the serial access memory takes in the X address group on a time-sharing basis in response to the row address strobe signal $\overline{RAS}$. Next, the address buffer circuit 61 outputs the internal X address groups XADDA and XADDB in the same manner as the X address buffer circuit 60, described above with respect to the third embodiment, and supplies them to their corresponding X address decoders 2A and 2B. When the column address strobe signal $\overline{CAS}$ is input to the address buffer circuit 61, the address buffer circuit 61 brings the Y address group supplied on the time-sharing basis from the same address terminal. Thereafter, the address buffer circuit 61 outputs the internal Y address group YADD to each of the Y address decoders 5A and 5B. Thus, the access to memory cell arrays 1A and 1B is carried out in a manner similar to that carried out by the third embodiment. When the data transfer signal DT is brought into the "H" state during the data transfer cycle, a serial access operation, similar to that carried out by the third embodiment, is performed.

The present fifth embodiment has an advantage in that since the externally-input address group ADD composed of the X and Y address groups can be brought from the same address terminals on a time-sharing basis due to the provision of the address buffer circuit 61, the number of terminals can be reduced. Each of serial address circuits 8A and 8B supplied with a common serial address group SYADD may be made up of an address pointer comprised of a register supplied with a common synchronizing clock.

A serial access memory according to a sixth embodiment of the present invention will now be described below.

The serial access memory according to the sixth embodiment of the present invention is constructed in the same manner as the fifth embodiment except that independent serial address groups SYADDA and SYADDB are applied to the respective serial address circuits 8A and 8B.

The serial access memory according to the sixth embodiment is basically operated in a manner substantially similar to that according to the fifth embodiment. Since the independent serial address groups SYADDA and SYADDB are input to the respective serial address circuits 8A and 8B, the data stored in the data registers 7A and 7B, at addresses different from each other, can be output serially. Therefore, the sizth embodiment of the serial access memory has not only substantially the same advantages as those obtained by that according to the fifth embodiment, but also the following advantages. Since the data stored at the different addresses in the respective data registers 7A and 7B can be selectively output, one pair of the data register 7A or 7B and the serial address circuit 8A or 8B can be independently operated even if the other pair of the data register 7A or 7B and the serial address circuit 8A or 8B has a defect. Further, since the serial address groups SYADDA and SYADDB are different from each other, the serial address circuits 8A and 8B can also obtain serial access in asynchronism with each other, using these address groups.

A serial access memory according to a seventh embodiment of the present invention will now be described below.

Figure 13:
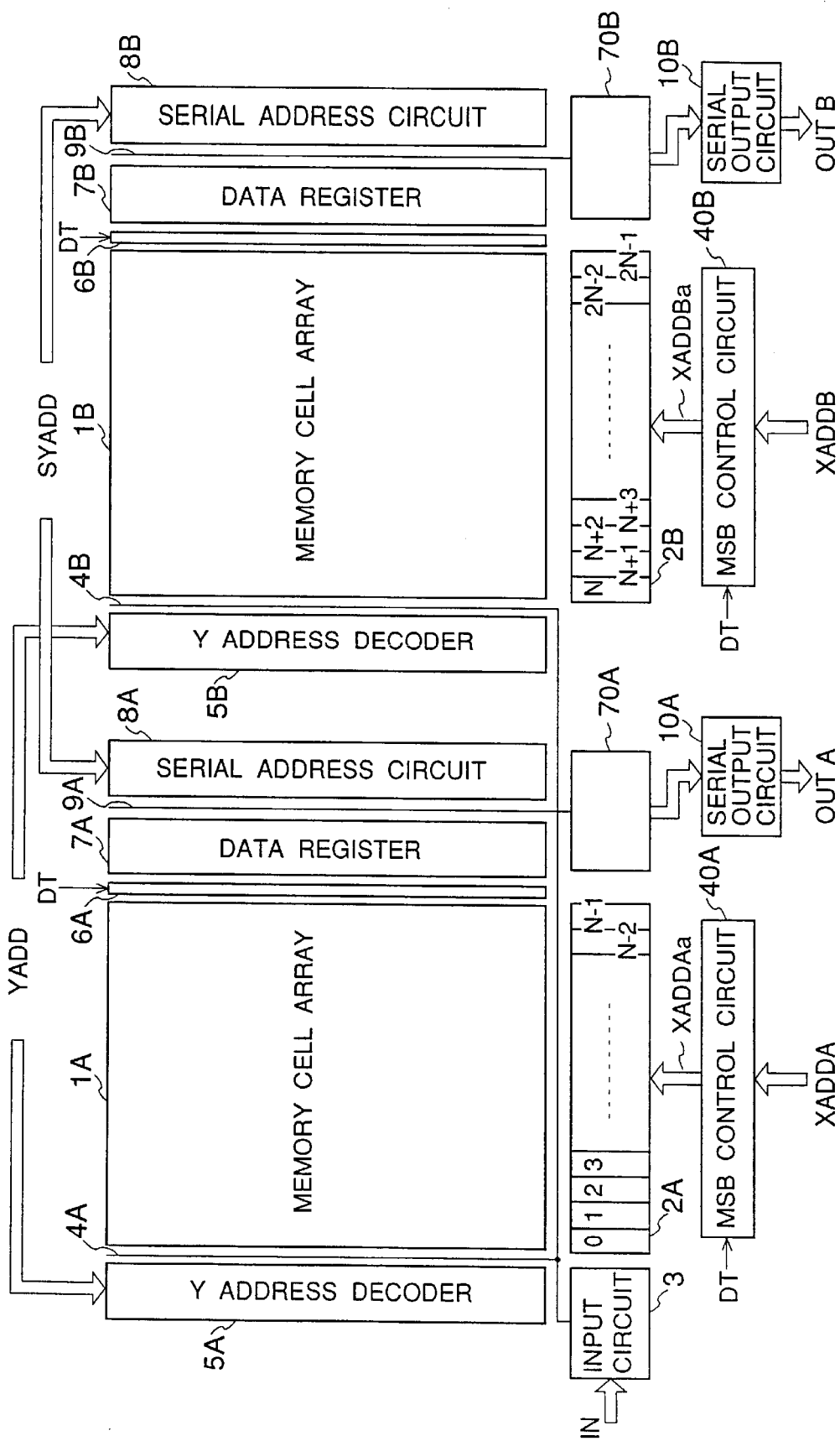
FIG. 13 is a fragmentary block diagram showing the structure of a serial access memory according to a seventh embodiment of the present invention.

FIG. 13 is a schematic block diagram showing the structure of the serial access memory according to the seventh embodiment of the present invention. Elements common to those shown in FIG. 1 illustrating the first embodiment are denoted by common reference numerals.

In the serial access memory according to the seventh embodiment, first and second output-sequence converting circuits 70A and 70B are provided between the read data bus 9A and the serial output circuit 10A, and between the read data bus 9B and the serial output circuit 10B respectively.

Each of the first and second output-sequence converting circuits 70A and 70B has a function to change the serial output sequence of read data transferred on each of the read data buses 9A and 9B based on address signals $S_0$ and $S_1$ provided for control of the serial output sequence. The circuits 70A and 70B provide the so-processed read data serially to the respective serial output circuits 10A and 10B.

Figure 14:
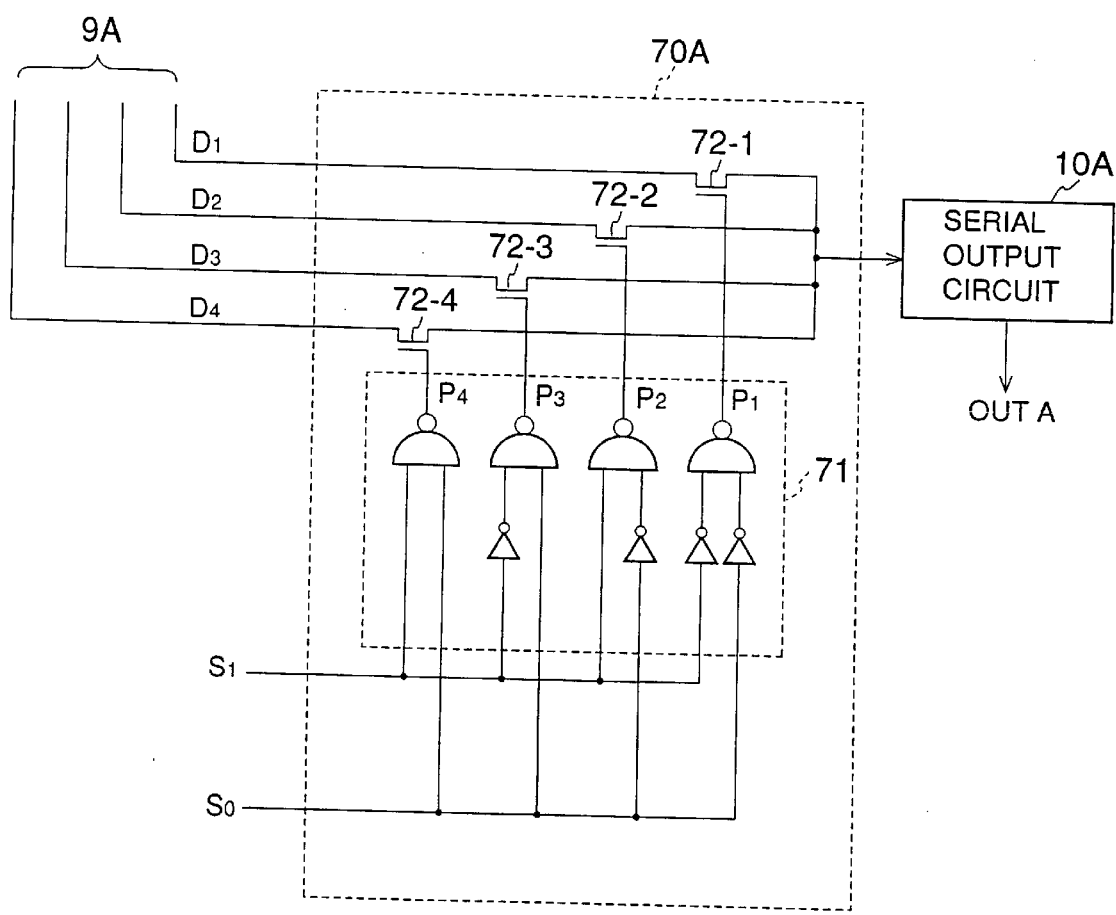
FIG. 14 is a block diagram illustrating the structure of an output-sequence converting circuit shown in FIG. 13.

FIG. 14 is a circuit diagram showing the configuration of the first output-sequence converting circuit 70A shown in FIG. 13. The second output-sequence converting circuit 70B is identical in circuit configuration to the first output-sequence converting circuit 70A.

The first output-sequence converting circuit 70A is provided between the read data bus 9A (constructed, for example, in a 4-bit arrangement) and the serial output circuit 10A. Further, the first output-sequence converting circuit 70A has a decoder 71 comprised of NAND gates or the like, for decoding the address signals $S_0$ and $S_1$, and NMOS's 72-1 to 72-4 controlled by decoded outputs $P_1$ to $P_4$ of the decoder 71 so as to connect the read data bus 9A to, and disconnect it from the serial output circuit 10A.

Figures 15A, 15B:
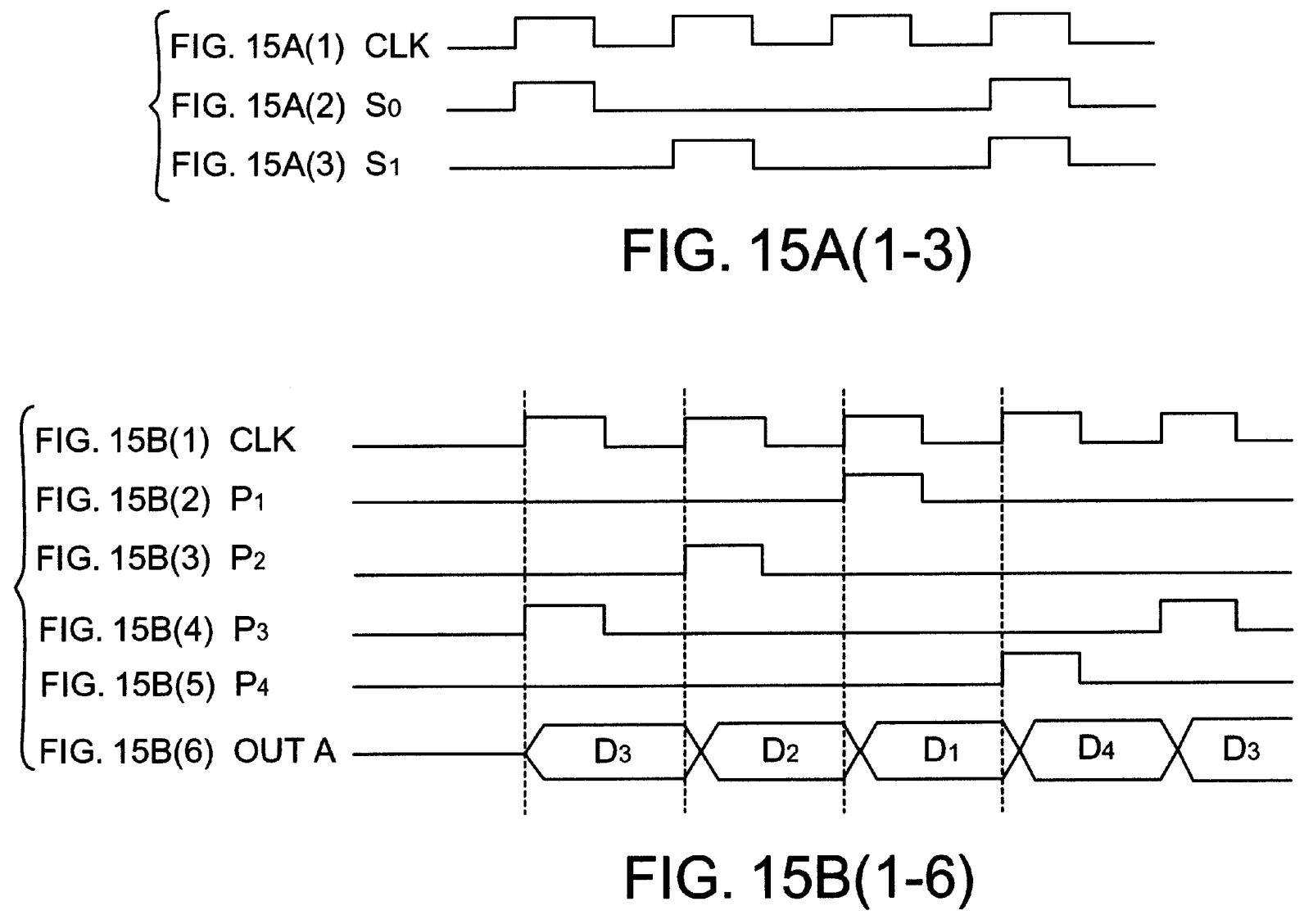

FIGS. 15A(1)–15A(3) and 15B(1)–15B(6) are timing diagrams for describing the operation of the output-sequence converting circuit 70A shown in FIG. 14. The operation of the serial access memory shown in 13 and 14 will be described below with reference to FIGS. these Figures.

The serial access memory is operated in a manner substantially similar to that according to the first embodiment but is different therefrom in the following aspects. When the common serial address group SYADD is input to each of the serial address circuits 8A and 8B during serial access operation, each of the serial address circuits 8A and 8B decodes the serial address group SYADD in synchronism with a synchronizing control clock CLK. Based on the Result of the decoding, the serial address circuits 8A and 8B respectively transfer over to the read data buses 9A and 9B the 4 bits of corresponding read data $D_1$ to $D_4$ which have been stored in the respective data registers 7A and 7B.

When the address signals $S_0$ and $S_1$ are supplied to each of the first and second output-sequence converting circuits 70A and 70B in synchronism with the synchronizing control clock CLK, as shown in FIGS. 15A(1)–15A(3), each of the first and second output-sequence converting circuits 70A and 70B is activated such that the address signals $S_0$ and $S_1$ are decoded by the decoder 71 and the NMOSs 72-1 to 72-4 are respectively turned on or off by the resultant decoded outputs $P_1$ to $P_4$ (FIGS. 15B(2)–15B(5)). Therefore, the order or sequence for outputting the 4-bit read data $D_1$ to $D_4$, which have been simultaneously transferred over each of the read data buses 9A and 9B, is changed (FIG. 15B(6)). The read data thus subjected to the output-sequence change processing are output from each of output terminals OUTA and OUTB of the serial output circuits 10A and 10B.

The seventh embodiment has advantages substantially similar to those obtained in the first embodiment and the following additional advantges. The sequence of serially outputting the read data can be controlled by each of the first and second output-sequence converting circuits 70A and 70B. Thus, the above processing to change output-sequence is effective, for example, in a case where the output sequence should be changed when RGB (red, green and blue) data corresponding to image data are respectively written into the corresponding memory cell arrays 1A and 1B in serial form and used in drawing an image on a liquid crystal screen or the like.

The embodiment shown in FIG. 14 illustrates the case where each of the read data buses 9A and 9B is constructed in a 4-bit arrangement or unit. However, the read data buses 9A and 9B can be applied even to the case where the number of bits is 8, 16 or other desired number. Each of the serial address circuits 8A and 8B, supplied with the common serial address group SYADD, may comprise an address pointer including a register supplied with the common synchronizing clock in a manner similar to that described above with respect to the first embodiment.

Figure 16:
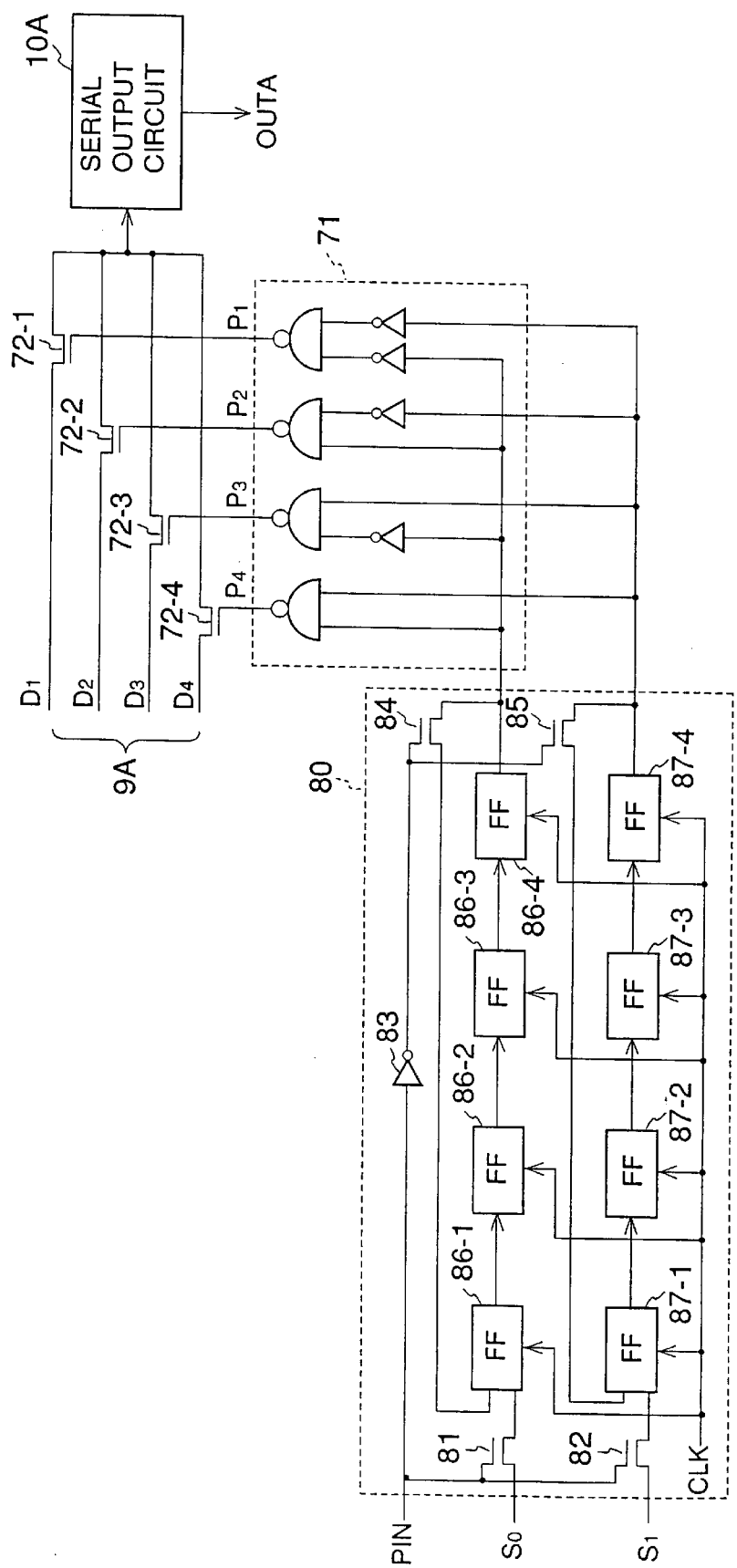
FIG. 16 is a block diagram illustrating the structure of an output-sequence converting circuit employed in a serial access memory according to an eighth embodiment of the present invention.

FIG. 16 shows an eighth embodiment of the present invention and illustrates one example of another structure of each output-sequence converting circuit described in the seventh embodiment. Elements common to those shown in the seventh embodiment are denoted by common reference numerals. In this case, a typical first output-sequence converting circuit 70A will be described below. A second output-sequence converting circuit 70B is substantially the same as the first output-sequence converting circuit 70A.

The first output-sequence converting circuit 70A is provided with an address shift circuit 80, in addition to a decoder 71 and NMOS's 72-1 to 72-4 like those of circuit 70A shown in FIG. 14. The address shift circuit 80 is provided on the input side of the decoder 71 and serves as a circuit for inputting address signals $S_0$ and $S_1$ to the decoder 71. The address signals $S_0$ and $S_1$ control a serial read-data output sequence in response to an enable signal PIN for the input of an address sequence. The serial read-data output sequence is determined by the circuit 80 based on the address signals $S_0$ and $S_1$. The circuit 80 supplies the result of its decision to the decoder 71 in synchronism with a synchronizing control clock CLK.

The address shift circuit 80 comprises NMOS's 81 and 82 gate-controlled by the enable signal PIN so as to be supplied with the respective address signals $S_0$ and $S_1$. Circuit 80 also includes an inverter 83 for inverting the enable signal PIN, NMOSs 84 and 85 gate-controlled by the output of the inverter 83, and four cascade-connected flip-flops 86-1 to 86-4 for shifting the input address signal $S_0$ in response to the synchronizing control clock CLK. Four cascade-connected flip-flops 87-1 to 87-4 are also included in the circuit 80 for shifting the input address signal $S_1$ in response to the synchronizing control clock CLK. The four cascade-connected flip-flops 86-1 to 86-4 are electrically connected to each other so that with the NMOS 84 they form a ring. Similarly, the four cascade-connected flip-flops 87-1 to 87-4 are also electrically connected to each other so that a ring is formed with the NMOS 85.

FIGS. 17A(1)–17A(4) and 17B(1)–17B(6) are timing diagrams for describing the operation of the output-sequence converting circuit shown in FIG. 16. The operation of the output-sequence converting circuit illustrated in FIG. 16 will be described below with reference to these Figures.

The output-sequence converting circuit shown in FIG. 16 is basically operated in a manner substantially similar to the above-described of operating the output-sequence converting circuit shown in FIG. 14.

Described specifically, when the enable signal PIN (FIG. 17A(1)) is brought to the "H" level, the NMOS's 81 and 82 are turned ON. Further, the enable signal PIN is inverted by the inverter 83 so that the NMOSs 84 and 85 are turned OFF. When the NMOS's 81 and 82 are turned ON, the address signals $S_0$ and $S_1$ (FIGS. 17A(3) and 17A(4)) are input to the respective flip-flops 86-1 and 87-1. Further, the address signals $S_0$ and $S_1$ are respectively shifted to the flip-flops 86-2 to 86-4 and 87-2 to 87-4 corresponding to the subsequent stages based on the synchronizing control clock CLK (FIGS. 17A(1) and 17B(1)) to thereby determine a serial read-data output sequence. Thereafter, the determined sequence is supplied to the decoder 71 from the flip-flops 86-4 and 87-4, which correspond to the final stage. The decoder 71 decodes the determined serial output sequence as a four bit output P1 to P4 (FIGS. 17B(2)–17B(5)) and turns ON or OFF the NMOS's 72-1 to 72-4 in accordance with this decoded output. Thus, the sequence for serially outputting 4 bit read data $D_1$ to $D_4$, which have been simultaneously transferred over each of read data buses 9A and 9B constructed in 4-bit units from each of data registers 7A and 7B, is changed by the NMOS's 72-1 to 72-4. The read data, thus subjected to processing to change the output-sequence, are output from each of output terminals OUTA (FIG. 17B(6)) and OUTB of serial output circuits 10A and 10B.

On the other hand, when the enable signal PIN is brought to the "L" level, the NMOS's 81 and 82 are turned OFF. Further, the enable signal PIN is inverted by the inverter 83 so that the NMOS's 84 and 85 are turned ON. When the NMOS's 81 and 82 are turned OFF, the address signals $S_0$ and $S_1$ are prevented from being input to the NMOS's 81 and 82. When the NMOS's 84 and 85 are brought to the ON state, the flip-flops 86-1 to 86-4 are electrically connected to each other in a ring-like arrangement by the NMOS 84, so that the serial output sequence is held as it is. Further, the flip-flops 87-1 to 87-4 are electrically connected to each other in a ring-like arrangement by the NMOS 85 so that the serial output sequence is held as it is. Thereafter, the above results are supplied to the decoder 71. When it is desired to change the resultant serial output sequence, the enable signal PIN may be set to the "H" level, so that the address signals $S_0$ and $S_1$ are input to the decoder 71.

The serial access memory according to the eighth embodiment has the following advantage in addition to advantages similar to these obtained by the serial access memory according to the first embodiment. The sequence for outputting the read data $D_1$ to $D_4$ which have been simultaneously transferred over the read data buses 9A and 9B, can be controlled during the serial access operation. Therefore, the above processing to change the output sequence is effective, for example, in a case where the output sequence should be changed when RGB data corresponding to image data are serially written into the corresponding memory cell arrays 1A and 1B, and the data are to be used in drawing an image on a liquid crystal screen or the like. In the output-sequence converting circuit shown in FIG. 14, which is employed in the seventh embodiment, the address signals $S_0$ and $S_1$ for control of the serial output sequence should be supplied externally. In the output-sequence converting circuit employed in the eighth embodiment, the serial output sequence can be changed by simply inputting the enable signal PIN into the address shift circuit 80.

Incidentally, each of the read data buses 9A and 9B is provided in a 4-bit arrangement or unit. However, the eighth embodiment can be applied even to read data buses provided in other bit units or arrangements such as 8-bit and 16-bit arrangements. Each of the serial address circuits 8A and 8B supplied with the common serial address group SYADD may cosist of an address pointer including a register supplied with a common synchronizing clock.

A serial access memory according to a ninth embodiment of the present invention will now be described below.

Figure 18:
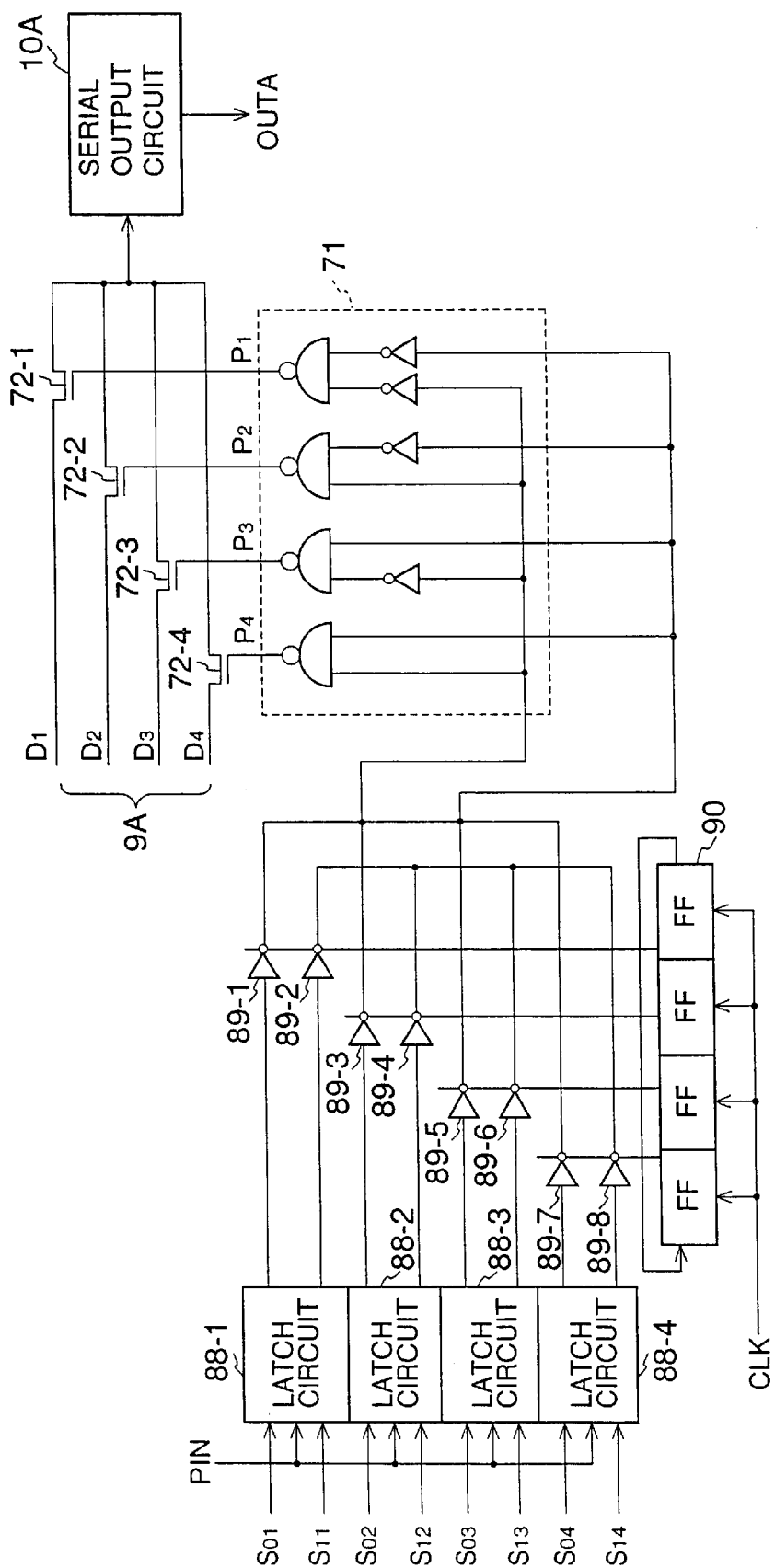
FIG. 18 is a block diagram depicting the structure of an output-sequence converting circuit employed in a serial access memory according to a ninth embodiment of the present invention.
Figure 19:
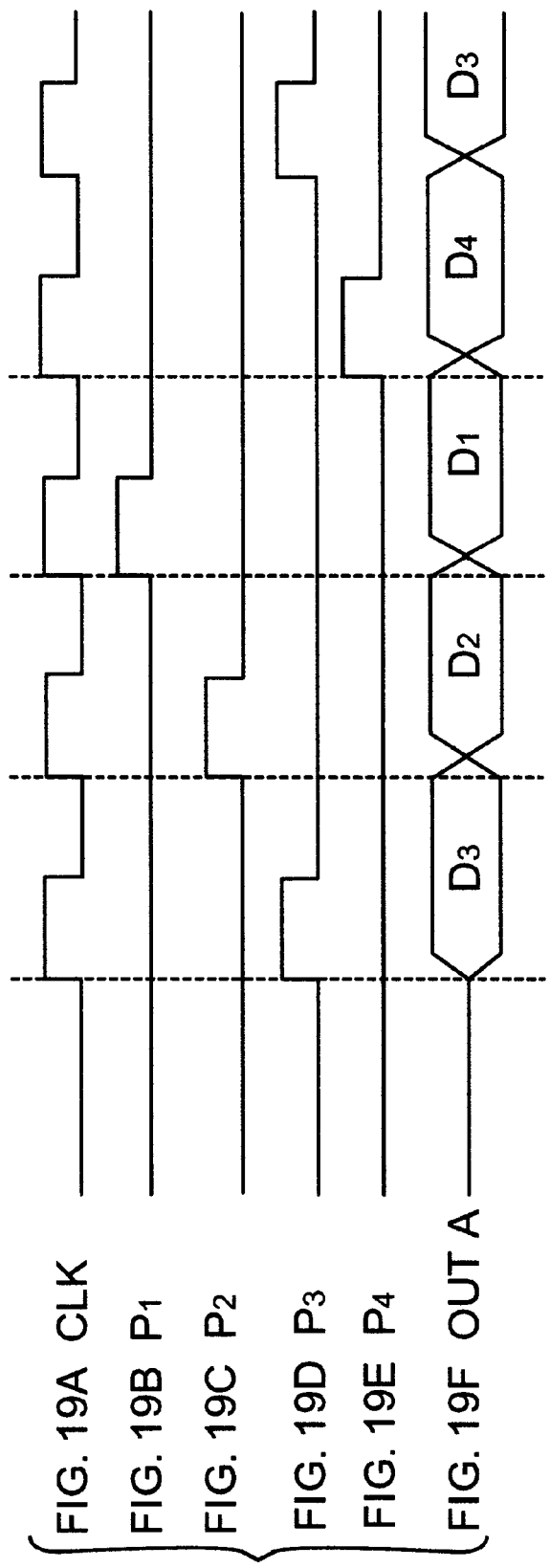
FIGS. 19A–19F are a partial timing chart for explaining the operation of the output-sequence converting circuit shown in FIG. 18.

FIG. 18 shows the ninth embodiment of the present invention and is a circuit diagram showing one example of a further structure of the first output-sequence converting circuit 70A which has been described in the description of the seventh embodiment. Elements common to those shown in FIGS. 14 and 16, which are employed in the seventh and eighth embodiments, are denoted by common reference numerals. Incidentally, the second output-sequence converting circuit 70B of this embodiment is substantially the same as the first output-sequence converting circuit 70A.

The first output-sequence converting circuit 70A is basically similar to the output-sequence converting circuit employed in the eighth embodiment except as to the address shift circuit 80. The first output-sequence converting circuit 70A of the eighth embodiment is provided with four latch circuits 88-1 to 88-4, a four-stage type shift circuit 90 and four pairs of gate tristate inverters 89-1 to 89-8, for example, as an alternative to the address shift circuit 80. The four latch circuits 88-1 to 88-4 are of circuits which take in serial output-sequence decision addresses $S_{01}$, $S_{11}$, ..., $S_{04}$, $S_{14}$ in response to an enable signal PIN for the input of address sequence. A decoder 71 is electrically connected to the outputs of the four latch circuits 88-1 to 88-4 via the four sets of tristate inverters 89-1 to 89-8. The shift circuit 90 consists of four flip-flops electrically connected to each other in a ring-like arrangement. Further, the shift circuit 90 has a function to perform a shift operation in response to a synchronizing control clock CLK, and successively to turn on and off the tristate inverters 89-1 to 89-8 two-by-two. When the outputs of the shift circuit 90 are in the "H" state, the tristate inverters 89-1 to 89-8 perform normal signal inversion operations. When, on the other hand, the outputs of the shift circuit 90 are brought to the "L" level, each of the outputs of the tristate inverters 89-1 to 89-8 is brought into a high-impedance state.

FIGS. 19A–19F are a timing diagram for explaining the operation of the output-sequence converting circuit shown in FIG. 18. The operation of the output-sequence converting circuit shown in FIG. 18 will now be described below with reference to these Figures.

When the output-sequence converting circuit is supplied with the serial output-sequence decision addresses $S_{01}$, $S_{11}$, ... $S_{04}$, $S_{14}$, and the synchronizing control clock CLK (FIG. 19A), during a serial access operation, the latch circuits 88-1 to 88-4 take in the serial output-sequence decision addresses $S_{01}$, $S_{11}$, ..., $S_{04}$, $S_{14}$ in response to the enable signal PIN. The shift circuit 90 is sequentially shifted in response to the synchronizing control clock CLK, so that the tristate inverters 89-1 to 89-8 are successively operated based on the outputs of the shift circuit 90. As a result, the outputs of the latch circuits 88-1 to 88-4 are inverted and the inverted outputs are supplied to the decoder 71. Then, the decoder 71 decodes the inverted outputs from the tristate inverters 89-1 to 89-8, so as to produce decoded outputs $P_1$ to $P_4$ (FIGS. 19B–19E) corresponding to 4 bits, thereby turning ON or OFF the four NMOS's 72-1 to 72-4 in accordance with the decoded outputs $P_1$ to $P_4$. Similar processing is performed by the second output sequence converting circuit 70B. As a result, the sequences for serially outputting the read data $D_1$ to $D_4$ transferred over the read data buses 9A and 9B is changed and the read data $D_1$ to $D_4$, thus subjected to processing to change the output sequence, are output from output terminals OUTA (FIG. 19F) and OUTB of the serial output circuits 10A and 10B.

Thus, the serial output-sequence decision addresses $S_{01}$, $S_{11}$, ..., $S_{04}$, $S_{14}$ are brought into the corresponding latch circuits 88-1 to 88-4 based on the enable signal PIN. Further, the serial output sequence of the read data $D_1$ to $D_4$ is changed in synchronism with the synchronizing control clock CLK based on the serial output-sequence decision addresses $S_{01}$, $S_{11}$, ..., $S_{04}$, $S_{14}$. Therefore, the ninth embodiment has the following advantage in addition to advantages substantially similar to those obtained by the seventh embodiment. Since the serial output-sequence decision addresses $S_{01}$, $S_{11}$, ..., $S_{04}$, $S_{14}$ are supplied externally, from the outside and the serial output sequence is changed based on such addresses, an output-sequence switching operation can be carried out at a high speed.

The read data bus 9A shown in FIG. 18 is constructed in a 4-bit arrangement or unit, but may be arranged in a form which groups another desired number of bits. Similarly to the seventh embodiment shown in FIG. 13, each of the serial address circuits 8A and 8B is supplied with a common serial address group SYADD, and may consist of an address pointer including a shift register supplied with a common synchronizing clock.

A serial access memory according to a tenth embodiment of the present invention will now be described below.

Figure 20:
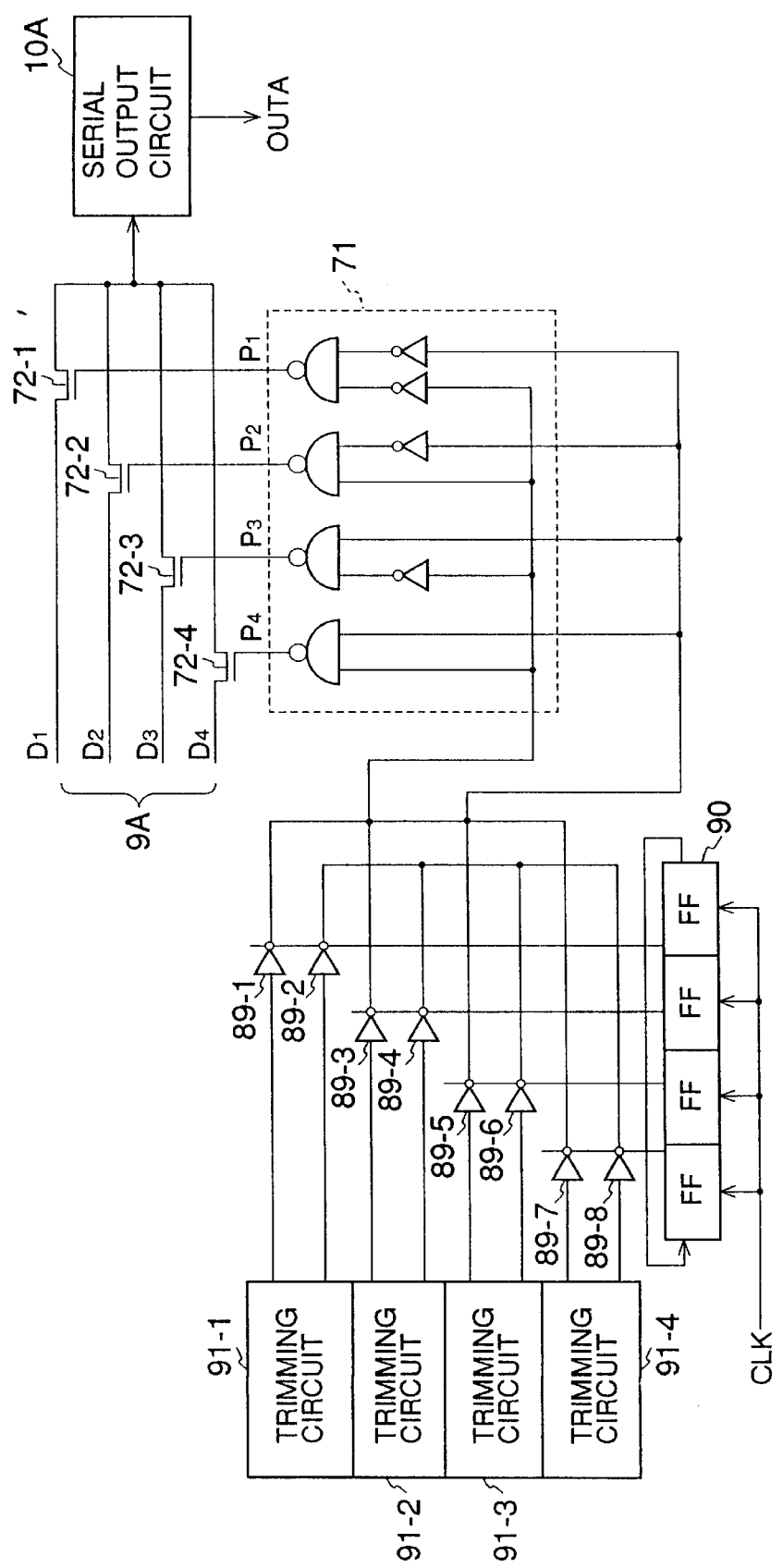
FIG. 20 is a block diagram showing the structure of an output-sequence converting circuit employed in a serial access memory according to a tenth embodiment of the present invention.

FIG. 20 shows the tenth embodiment of the present invention and is a circuit diagram illustrating one example of a still further structure of the first output-sequence converting circuit 70A employed in the seventh embodiment. Elements common to those shown in the ninth embodiment are denoted by common reference numerals. The second output-sequence converting circuit 70B is of a circuit substantially the same as to the first output-sequence converting circuit 70A.

The first output-sequence converting circuit 70A is basically similar to that in the ninth embodiment except that trimming circuits 91-1 to 91-4 replace the latch circuits 88-1 to 88-4. Trimming circuits 91-1 to 91-4 are used for determining the serial output sequence. Each trimming circuit has a function similar to that of the respective latch circuit it replaces.

FIG. 21 is a circuit diagram showing one example of the structure of each of the trimming circuits 91-1 to 91-4. Each of the trimming circuits 91-1 to 91-4 has fuses F1 and F2 used for determination of the serial output sequence. Each fuse has one end electrically connected to a power source potential VCC. The other end of fuse F1 is electrically connected to ground potentials VSS via resistor R1. The other end of fuse F2 is connected to ground potenrial VSS through a register R2. Thus, for example, when the fuse F1 of each of the trimming circuit 91-1 to 91-4 is shut off, an address "01" is output.

FIGS. 22A–22F are a timing diagram for describing the operation of the output-sequence converting circuit shown in FIG. 20. The operation of the output-sequence converting circuit illustrated in FIG. 20 will now be described below.

The operation of the output-sequence converting circuit is basically identical substantially to that of the output-sequence converting circuit employed in the ninth embodiment. If serial output-sequence decision addresses are set in advance depending on the fuses F1 and F2 of the individual trimming circuits 91-1 to 91-4, then the output sequence (see FIGS. 22B–22E) of read data $D_1$ to $D_4$ is changed in synchronism with a synchronizing control clock CLK (FIG. 22A); on the basis of the serial output-sequence decision addresses set by the trimming circuits 91-1 to 91-4. Thereafter, the read data thus subjected to processing to change the output sequence, are sequentially output from each of output terminals OUTA (FIG. 22F) and OUTB of serial output circuits 10A and 10B.

The present tenth embodiment has the following advantage in addition to advantages similar to those provided by the seventh embodiment. Since the serial output-sequence decision addresses can be set by the trimming circuit 91-1 to 91-4, it is unnecessary to input the serial output-sequence decision $S_{01}$, $S_{11}$, ..., $S_{04}$, $S_{14}$ externally as in the ninth embodiment.

Incidentally, the read data bus 9A may be set in a form having a desired number of bits other than 4 bits. Similarly to the seventh embodiment shown in FIG. 13, each of the serial address circuits 8A and 8B is supplied with the common serial address group SYADD, and may cocsist of an address pointer including a shift register supplied with a common synchronizing clock.

Serial access memories according to an eleventh embodiment of the present invention will now be described below.

The serial access memories according to the eleventh embodiment of the present invention are constructed in the following manner. Independent serial address groups SYADDA and SYADDB are employed (as an alternative to the common serial address group SYADD input to each of the serial address circuits 8A and 8B shown in FIG. 13), in any of the seventh, eighth, ninth and tenth embodiments (see FIGS. 14, 16, 18 and 20). Further, the serial address group SYADDA is input to the serial address circuit 8A, whereas the remaining serial address group SYADDB is input to the serial address circuit 8B.

The serial access memories according to the present embodiment is basically operated in a manner substantially similar to that of the above described operation of the serial access memories according to the seventh, eighth, ninth and tenth embodiments. Since, however, the serial address groups SYADDA and SYADDB are not in common, data stored in data registers 7A and 7B at different addresses respectively can be serially output. That is, since the data stored at different addresses in the respective data registers 7A and 7B can be selectively output, one of the data registers 7A or 7B and the corresponding serial address circuit 8A or 8B can be independently operated even if the other data register 7A or 7B and the corresponding serial address circuit 8A or 8B has a defect. Further, since the serial address groups SYADDA and SYADDB are different from each other, the serial address circuits 8A and 8B can also obtain serial access in asynchronism with each other.

A serial access memory according to a twelfth embodiment of the present invention will now be described below.

Figure 23:
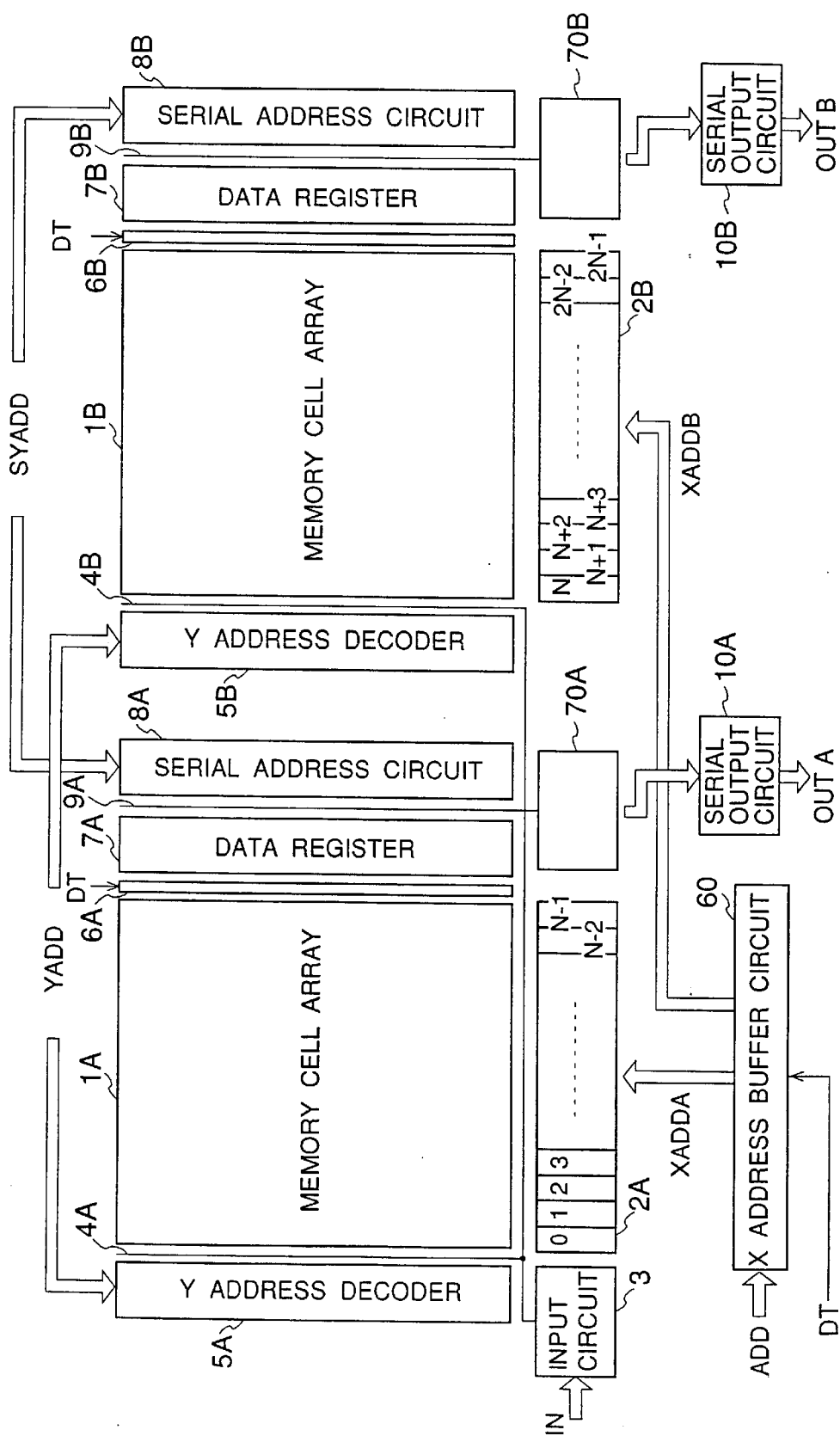
FIG. 23 is a fragmentary block diagram showing the structure of a serial access memory according to a twelfth embodiment of the present invention.

FIG. 23 is a block diagram schematically showing the structure of the serial access memory according to the twelfth embodiment of the present invention. Elements common to those shown in FIG. 9, illustrating the third embodiment, and FIGS. 13 and 14, illustrating the seventh embodiment, are denoted by common reference numerals.

The serial access memory according to the present embodiment corresponds to the serial access memory of FIG. 9 illustrating the third embodiment, wherein the first and second output-sequence converting circuits 70A and 70B in FIGS. 13 and 14, illustrating the seventh embodiment, are respectively connected between the read data buses 9A and 9B and the serial output circuits 10A and 10B.

The serial access memory according to the present twelfth embodiment is operated in a manner substantially similar to the serial access memory according to the third embodiment (see FIG. 9). Since there are provided the first and second output-sequence converting circuits 70A and 70B of the configuration employed in the seventh embodiment, the sequence for serially outputting read data transferred over each of read data buses 9A and 9B from each of data registers 7A and 7B is changed, during the serial access operation, by each of the first and second output-sequence converting circuits 70A and 70B each of which is controlled by address signals $S_0$ and $S_1$ for control of the serial output sequence. Thereafter, the read data thus subjected to processing for changing the output sequence, are output from each of output terminals OUTA and OUTB of serial output circuits 10A and 10B.

The present twelfth embodiment has advantages substantially similar to those obtained in the third embodiment. Further, since the serial output sequence can be controlled by each of the output-sequence converting circuits 70A and 70B, the above processing for changing the output sequence, is effective in, for example, a case where the output sequence should be changed when RGB data corresponding to image data are serially written into the corresponding memory cell arrays 1A and 1B and the data are to be used in drawing an image on a liquid crystal screen or the like.

A serial access memory according to a thirteenth embodiment of the present invention will now be described below.

The serial access memory according to the thirteenth embodiment of the present invention is schematically represented by FIG. 23 illustrating the twelfth embodiment, wherein the output-sequence converting circuits 70A and 70B are constructed according to the circuit diagram shown in FIG. 16, which illustrates the eighth embodiment.

The operation of the serial access memory according to the present thirteenth embodiment is substantially similar to that according to the twelfth embodiment, except as to the operation of the output-sequence converting circuits 70A and 70B, which have a different circuit configuration. That is, in the present embodiment, data stored in data registers 7A and 7B are respectively transferred over read data buses 9A and 9B in serial form during serial access operation, so as to be supplied to the output-sequence converting circuits 70A and 70B. Each of the output-sequence converting circuits 70A and 70B receives address signals $S_0$ and $S_1$ for control of the serial output sequence, in response to an enable signal PIN, to thereby determine a serial read-data output sequence in synchronism with a synchronizing control clock CLK. Thereafter, each of the output-sequence converting circuits 70A and 70B accordingly changes the sequence for serially outputting read data, and outputs the supplied read data in the determined sequence from each of output terminals OUTA and OUTB of serial output circuits 10A and 10B.

The present embodiment has the advantages provided by the eighth embodiment as well as an advantage substantially similar to that provided by the twelfth embodiment. Thus, the present embodiment can be effectively applied to, for example, a case where the output sequence should be changed when RGB data corresponding to image data are serially written into the corresponding memory cell arrays 1A and 1B and used in drawing an image on a liquid crystal screen or the like.

A serial access memory according to a fourteenth embodiment of the present invention will now be described below.

The serial access memory according to the fourteenth embodiment of the present invention have a configuration like that illustrated in FIG. 23, but with output-sequence converting circuits 70A and 70B, each of which is represented by the circuit diagram shown in FIG. 18 (which illustrates the ninth embodiment).

The basic operation of the serial access memory according to the fourteenth embodiment is substantially similar to that of the serial access memory according to the twelfth embodiment. However, the opeartion of the output-sequence converting circuits 70A and 70B is in accordance with the ninth embodiment. That is, when the output-sequence converting circuits 70A and 70B are respectively supplied with data stored in data registers 7A and 7B via read data buses 9A and 9B during serial access operation, each of the output-sequence converting circuits 70A and 70B receives serial output-sequence decision addresses $S_{01}, S_{11}, \ldots, S_{04}, S_{14}$, in response to an enable signal PIN. Thereafter, each of the output-sequence converting circuits 70A and 70B changes the serial read-data output sequence in synchronism with a synchronizing control clock CLK on the basis of the serial output-sequence decision addresses $S_{01}, S_{11}, \ldots, S_{04}, S_{14}$. Then, the read data, thus processed to change the output sequence, are output from the respective output terminals OUTA and OUTB of serial output circuits 10A and 10B. Therefore, the present embodiment can bring about the advantages obtained in the ninth and the twelfth embodiments.

A serial access memory according to a fifteenth embodiment of the present invention will next be described below.

The serial access memory according to the fifteenth embodiment of the present invention has a basic configuration like that of FIG. 23, illustrating the twelfth embodiment, but with output-sequence converting circuits 70A and 70B of the circuit configuration shown in FIG. 20 illustrating the tenth embodiment.

The basic operation of the serial access memory according to the present fifteenth embodiment is substantially similar to that according to the twelfth embodiment. However, the operation of the output-sequence converting circuits 70A and 70B are in accordance with the tenth embodiment. That is, when data stored in each of data registers 7A and 7B is sent to the corresponding one of the output-sequence converting circuits 70A and 70B via each of read data buses 9A and 9B, during serial access operation, each of the output-sequence converting circuits 70A and 70B changes the serial read-data output sequence in synchronism with a synchronizing control clock CLK, on the basis of serial output-sequence decision addresses set by trimming circuits 91-1 to 91-4. Then, the read data thus processed to change the output sequence, are output from each of output terminals OUTA and OUTB of serial output circuits 10A and 10B. Therefore, the present embodiment has the advantages provided by the tenth and twelfth embodiments.

A serial access memory according to a sixteenth embodiment of the present invention will now be described below.

The serial access memory according to the sixteenth embodiment of the present invention has a basic configuration as shown in FIG. 23. According to the sixteenth embodiment, independent serial address groups SYADDA and SYADDB are employed, as an alternative to the common serial address group SYADD, for separate input respectively the serial address circuit 8A andthe serial address circuit 8B, employed in the serial access memory shown in FIG. 23. This embodiment may be applied in cases in which the output-sequence converting circuits 70A and 70B are constructed according to any of the twelfth, thirteenth, fourteenth and fifteenth embodiments.

The serial access memory according to the present sixteenth embodiment is operated basically in a manner substantially similar to the manner of operating the serial access memories according to the twelfth, thirteenth, fourteenth and fifteenth embodiments. Since, however, the serial address groups SYADDA and SYADDB are not used in common, data stored in data registers 7A and 7B at different addresses can be serially output. That is, since the data stored at the different addresses in the data registers 7A and 7B can be selectively output, one of the data registers 7A or 7B and the corresponding serial address circuit 8A or 8B can be independently operated even if the other data register 7A or 7B and the corresponding serial address circuit 8A or 8B has a defect. Further, since the serial address groups SYADDA and SYADDB are different from each other, the serial address circuits 8A and 8B can also obtain serial access asynchronously.

A serial access memory according to a seventeenth embodiment of the present invention will now be described below.

Figure 24:
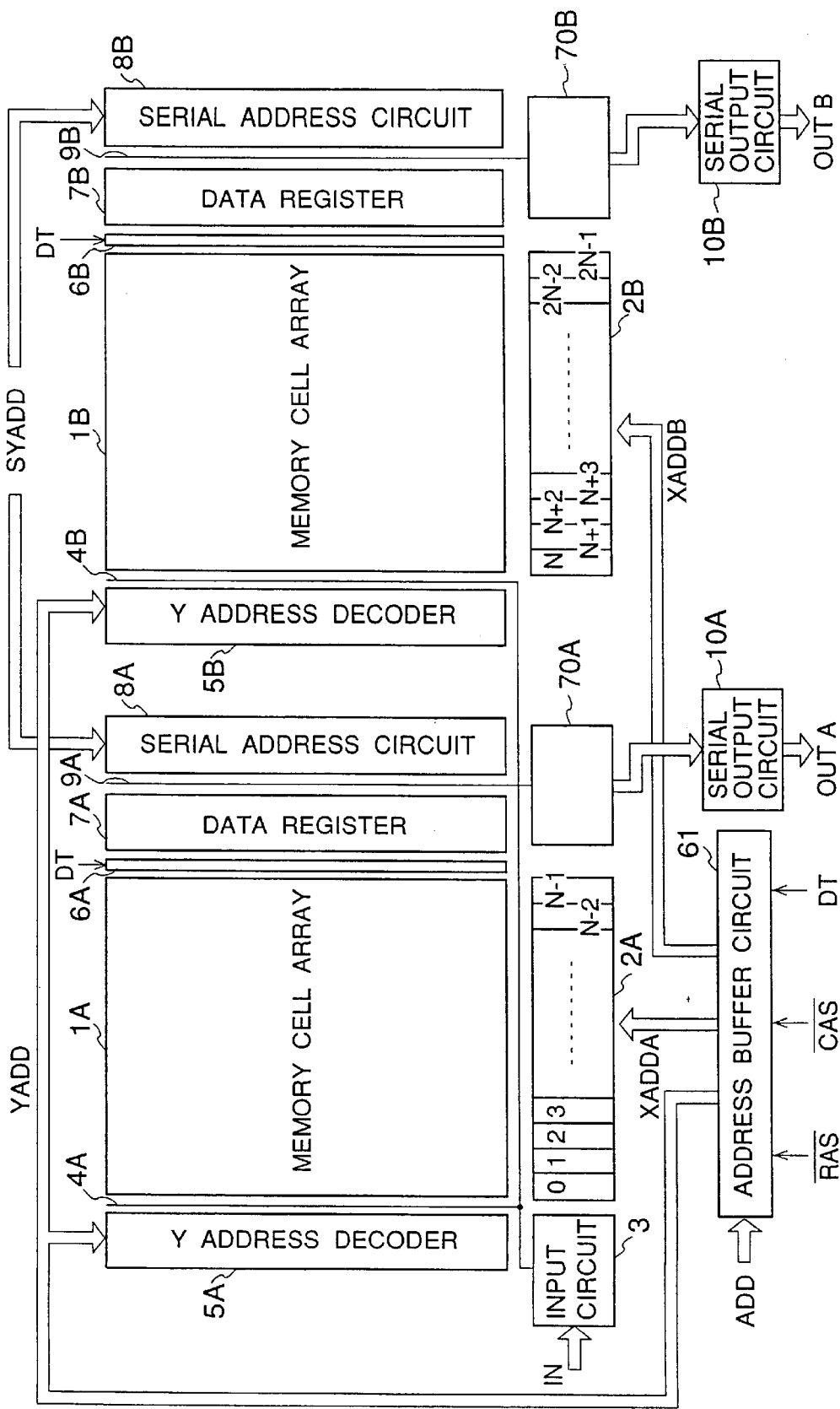
FIG. 24 is a fragmentary block diagram illustrating the structure of a serial access memory according to a seventeenth embodiment of the present invention.

FIG. 24 is a block diagram schematically showing the structure of the serial access memory according to the seventeenth embodiment of the present invention. All elements common to those shown in FIG. 11 illustrating the fifth embodiment, except the output-sequence converting circuits 70A and 70B, are denoted by common reference numerals.

The serial access memory according to the present embodiment is constructed by modification of the fifth embodiment illustrated in FIG. 11, such that output-sequence converting circuits 70A and 70B are respectively connected between the read data buses 9A and 9B and the serial output circuits 10A and 10B.

The serial access memory according to the present embodiment basically operates in a manner substantially similar to the serial access memory according to the fifth embodiment. However, since the output-sequence converting circuits 70A and 70B are provided, the serial access memory according to the present embodiment differs in its operation from that according to the fifth embodiment. That is, when data stored in data registers 7A and 7B are respectively transferred to the output-sequence converting circuits 70A and 70B via read data buses 9A and 9B during serial access operation, each of the output-sequence converting circuits 70A and 70B changes the serial read-data output sequence, based on the address signals $S_0$ and $S_1$ provided for control of the serial read-data output sequence. The circuits 70A and 70B then output the read data, in changed-sequence, from each of OUTA and OUTB of serial output circuits 10A and 10B.

The serial access memory according to the present embodiment has the following advantage in addition to advantages substantially similar to those provided by the fifth embodiment. Since output-sequence converting circuits 70A and 70B are provided, the serial output sequence can be controlled. Such serial output-sequence control is effective in, for example, a case where the output sequence should be changed when RGB data corresponding to image data are serially written into the corresponding memory cell arrays 1A and 1B and used in drawing an image on a liquid crystal screen or the like.

A serial access memory according to an eighteenth embodiment of the present invention will now be described below.

The eighteenth embodiment of the present invention has a construction like that of the serial access memory of FIG. 24 (illustrating the seventeenth embodiment), wherein the output-sequence converting circuits 70A and 70B each has the construction shown in FIG. 16 (which illustrates the eighth embodiment).

The serial access memory according to the present embodiment basically operates in a manner substantially similar to that according to the seventeenth embodiment. Since, however, the output-sequence converting circuits 70A and 70B of the seventeenth and eighteenth embodiments differ in circuit configuration, the operation of the serial access memory of the eighteenth embodiment differs from the operation of the serial access memory according to the seventeenth embodiment. That is, when data stored in data registers 7A and 7B of the eighteenth embodiment are respectively transferred to the output-sequence converting circuits 70A and 70B via read data buses 9A and 9B during the serial access operation, each of the output-sequence converting circuits 70A and 70B receives address signals $S_0$ and $S_1$ for control of the serial read-data output sequence, in response to an enable signal PIN, to thereby determine a serial read-data output sequence in synchronism with a synchronizing control clock CLK. Thereafter, each of the output-sequence converting circuits 70A and 70B changes the sequence for serially outputting read data, based on the result of the determination and outputs the read data in the changed sequence, from each of output terminals OUTA and OUTB of serial output circuits 10A and 10B.

The present embodiment has the following advantage in addition to the advantages provided by the seventeenth embodiment. The serial read-data output sequence can be controlled by each of the output-sequence converting circuits 70A and 70B in the same manner as the eighth embodiment. Thus, such output-sequence control is effective in, for example, a case where the output sequence should be changed when RGB data corresponding to image data are serially written into the corresponding memory cell arrays 1A and 1B and used in drawing an image on a liquid crystal screen or the like.

A serial access memory according to a nineteenth embodiment of the present invention will now be described below.

The nineteenth embodiment of the present invention has a construction like that of the serial access memory of FIG. 24 (illustrating the seventeenth embodiment), wherein the output-sequence converting circuits 70A and 70B has the construction shown in FIG. 18 (which illustrates the ninth embodiment).

The serial access memory according to the present nineteenth embodiment basically operates in a manner substantially similar to the operation of the serial access memory according to the seventeenth embodiment. Since, however, both output-sequence converting circuits 70A and 70B of the seventeenth and nineteenth embodiments differ in circuit configuration, the operation of the serial access memory according to the present embodiment differs from that of the seventeenth embodiment. That is, when the output-sequence converting circuits 70A and 70B of the nineteenth embodiment are respectively supplied with data stored in data registers 7A and 7B, via read data buses 9A and 9B, each of the output-sequence converting circuits 70A and 70B is activated so as to bring serial output-sequence decision addresses $S_{01}$, $S_{11}$, ..., $S_{04}$, $S_{14}$ into their corresponding latch circuits 88-1 to 88-4, in response to an enable signal PIN. Thereafter, each of the output-sequence converting circuits 70A and 70B changes the serial read-data output sequence in synchronism with a synchronizing control clock CLK on the basis of the serial output-sequence decision addresses $S_{01}$, $S_{11}$, ..., $S_{04}$, $S_{14}$. Then, the read data, thus processed to change the output sequence, are output from the respective output terminals OUTA and OUTB of serial output circuits 10A and 10B. Therefore, the present embodiment can bring about the same advantages as those provided by the ninth and seventeenth embodiments.

A serial access memory according to a twentieth embodiment of the present invention will now be described below.

The twentieth embodiment of the present invention has a construction like that of the serial access memory of FIG. 24 (illustrating the seventeenth embodiment), wherein the output-sequence converting circuits 70A and 70B each has the construction shown in FIG. 20 (illustrating the tenth embodiment).

The serial access memory according to the present twentieth embodiment basically operates in a manner substantially similar to the operation of the seventeenth embodiment. Since, however, both output-sequence converting circuits 70A and 70B of the present and seventeenth embodiments differ in circuit configuration, the opeation of the serial access memory according to the present embodiment differs from that of the seventeenth embodiment. That is, when data stored in the data registers 7A and 7B of the present embodiment are transferred to the corresponding output-sequence converting circuits 70A and 70B via read data buses 9A and 9B during the serial access operation, each of the output-sequence converting circuits 70A and 70B changes the serial read-data output sequence in synchronism with a synchronizing control clock CLK, on the basis of serial output-sequence decision addresses set by the trimming circuits 91-1 to 91-4 shown in FIG. 21. Then, the read data thus processed to change the output-sequence change processing are output from each of output terminals OUTA and OUTB of serial output circuits 10A and 10B. Therefore, the present embodiment has the advantages provided the tenth and seventeenth embodiments.

Serial access memory according to a twenty-first embodiment of the present invention will now be described below.

The serial access memories according to the twenty-first embodiment of the present invention have a basic construction as shown in FIG. 24. According to the twenty-first embodiment, independent serial address groups SYADDA and SYADDB are employed, as an alternative to the common serial address group SYADD for separative input respectively to the serial address circuit 8A and the serial address circuit 8B, employed in the serial access memory shown in FIG. 24. This embodiment may be applied in cases in which the output-sequence converting circuits 7A and 7B are constructed according to the seventeenth, eighteenth, nineteenth and twentieth embodiments.

Thus, the serial access memories according to the present embodiment basically operates in a manner substantially similar to the serial access memories according to the seventeenth, eighteenth, nineteenth and twentieth embodiments. Since, however, the serial address groups SYADDA and SYADDB are in common, data stored in data registers 7A and 7B at different addresses can be output serially. That is, since the data stored at the different addresses in the respective data registers 7A and 7B can be selectively output, one of the data registers 7A or 7B and the corresponding serial address circuits 8A or 8B can be independently operated even if the other of the data register 7A or 7B and the corresponding serial address circuit 8A or 8B has a defect. Further, since the serial address groups SYADDA and SYADDB are different from each other, the serial address circuits 8A and 8B can also obtain serial access asynchronously.

A serial access memory according to a twenty-second embodiment of the present invention will now be described below.

Figure 25:
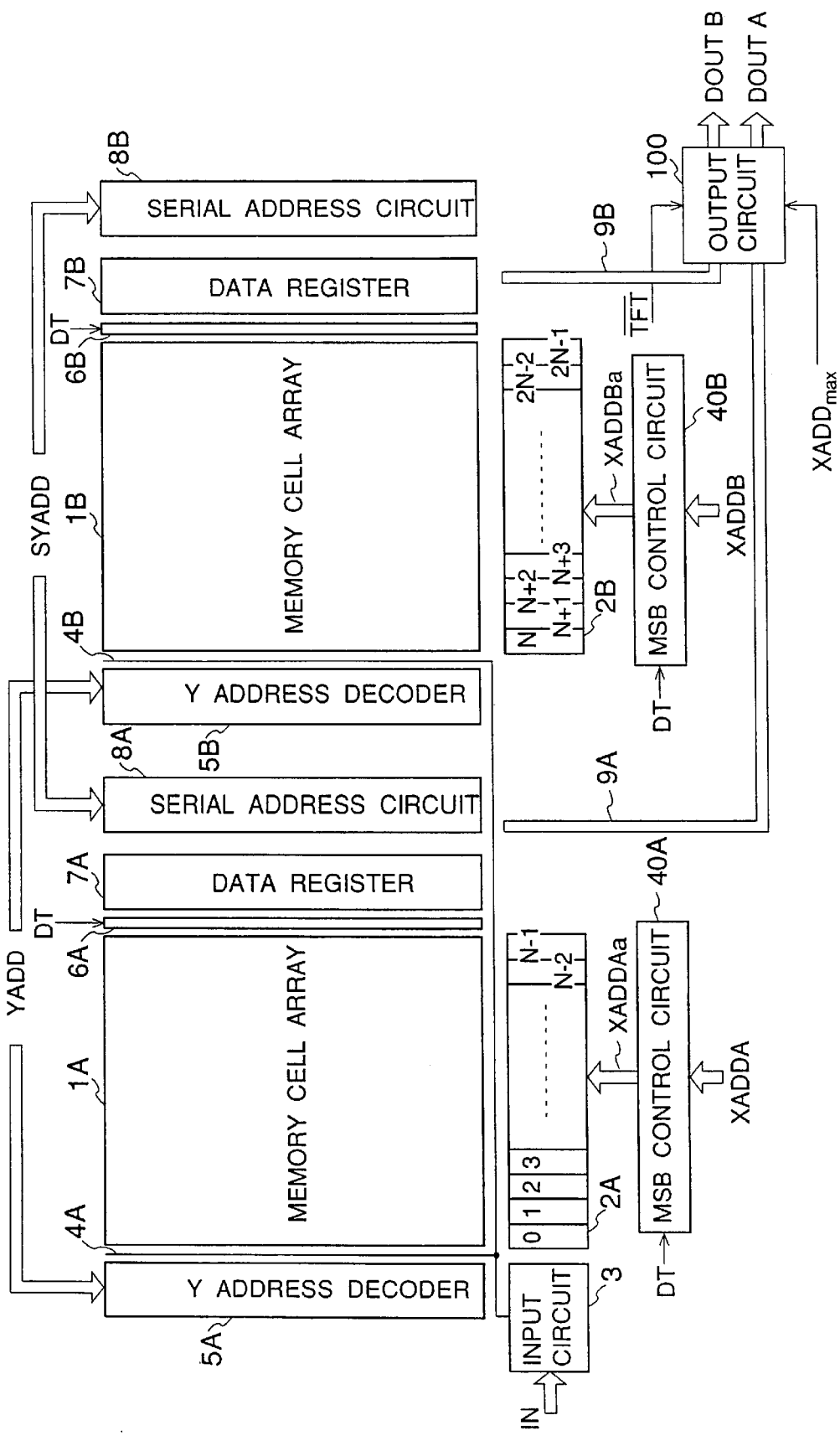
FIG. 25 is a fragmentary block diagram depicting the structure of a serial access memory according to a twenty-second embodiment of the present invention.

FIG. 25 is a block diagram schematically showing the structure of the serial access memory according to the twenty-second embodiment of the present invention. Elements common to those shown in FIG. 1 illustrating the first embodiment, are denoted by common reference numerals.

The serial access memory according to the twenty-second embodiment differs from that according to the first embodiment in that a common output circuit 100 is provided as an alternative to the serial output circuits 10A and 10B shown in FIG. 1. The common output circuit 100 has an input electrically connected to read data buses 9A and 9B and an output electrically connected to two output terminals DOUTA and DOUTB. Further, the common output circuit 100 has a function to provide the output thereof at either one port or two ports in response to an output mode, conversion signal $\overline{\text{TFT}}$ and a maximum X address $\text{XADD}_{max}$ (MSB).

Figure 26:
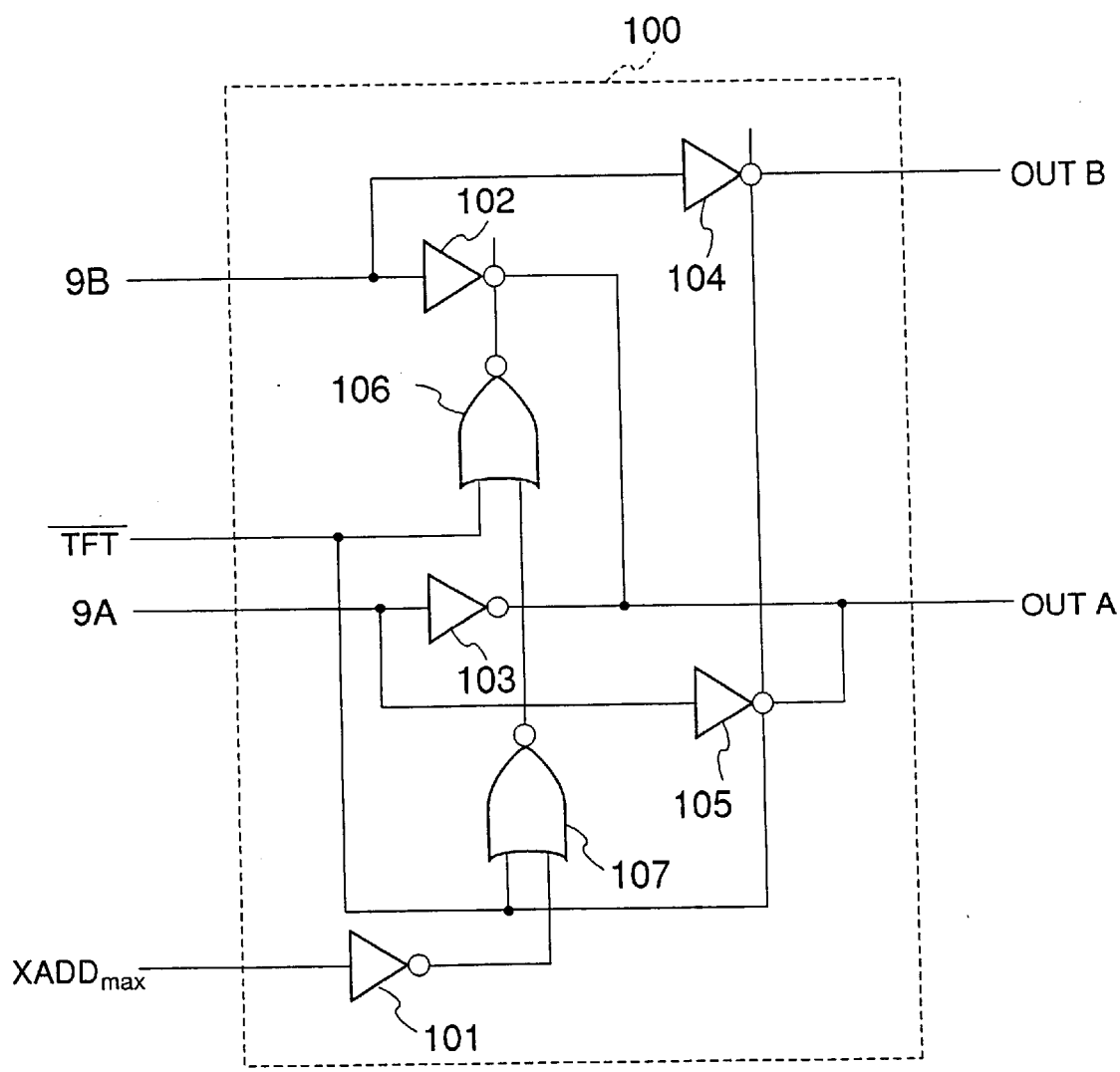
FIG. 26 is a block diagram specifically showing the configuration of an output circuit shown in FIG. 25.

FIG. 26 is a circuit diagram showing the configuration of the output circuit 100 shown in FIG. 25. In the output circuit 100, the maximum X address $\text{XADD}_{max}$ is input to an inverter 101, the output of which is electrically connected to one of the inputs of a NOR gate 107. The read data bus 9B is electrically connected to the respective inputs of tristate inverters 102 and 104, whereas the read data bus 9A is electrically connected to the respective inputs of tristate inverters 103 and 105. The output mode conversion signal $\overline{\text{TFT}}$ and the output of the NOR gate 107 are input to the corresponding inputs of a NOR gate 106. The tristate inverter 102 is switched or turned on and off in response to the output of the NOR gate 106. Further, the output mode conversion signal $\overline{\text{TFT}}$ and the output of the inverter 101 are input to corresponding inputs of a NOR gate 107. The tristate inverter 103 is operably controlled in response to the output of the NOR gate 107. Each of the tristate inverters 104 and 105 is operably controlled in response to the output mode conversion signal $\overline{\text{TFT}}$. The outputs of the tristate inverters 102 and 105 are electrically connected in common to an output terminal DOUTA. The output of the tristate inverter 104 is electrically connected to an output terminal OUTB.

The serial access memory according to the present twenty-second embodiment basically operates in a manner substantially similar to that according to the first embodiment. However, since the present embodiment is provided with the common output circuit 100, its output operation differs from that of the first embodiment. That is, refering to FIG. 26, when the output mode conversion signal $\overline{\text{TFT}}$ is in an "L" state, the NOR gates 106 and 107 are enabled and the outputs of the tristate inverters 104 and 105 are brought into a high-impedance state. When the NOR gates 106 and 107 are enabled, the outputs of the NOR gates 106 and 107 vary according to the maximum X address $\text{XADD}_{max}$. As a result, the tristate inverters 102 and 103 are turned on and off in response to the outputs of the NOR gates 106 and 107. On the other hand, when the output mode conversion signal $\overline{\text{TFT}}$ is in an "H" state, the NOR gates 106 and 107 are disabled so that the outputs thereof are brought into the "L" state. Thus, the outputs of the tristate inverters 102 and 103 are brought into a high-impedance state and each of the tristate inverters 104 and 105 is turned on so as to perform a normal inversion operation.

Thus, when read data are serially transferred over the read data buses 9A and 9B from data registers 7A and 7B, respectively, a serial read output on either one of the read data buses 9A and 9B can be output from the output terminal DOUTA based on the maximum X address $\text{XADD}_{max}$ and a two-port output type device can be activated to provide one port by controlling the level of the output mode conversion signal $\overline{\text{TFT}}$. Here, the output terminal DOUTB corresponding to the other port is brought into a high-impedance state. Such output operations can be effected even in the case of a serial access memory of such a type that the serial outputs are respectively generated from the same X addresses (the same relative locations) relatively identical to each other in the memory cell arrays 1A and 1B, as has been described with respect to the first embodiment.

The serial access memory according to the present embodiment has the following advantages due to the provision of the common output circuit 100, in addition to advantages substantially similar to those provided by the first embodiment. Either one of the input serial read outputs can be output from the output terminals DOUTA based on the maximum X address $\text{XADD}_{max}$, as though the two-port output type device could be activated in the form of one port, by controlling the level of the output mode conversion signal $\overline{\text{TFT}}$. The output terminal DOUTB corresponding to the other port is brought into the high-impedance state. Thus, the output circuit 100 can be freely set to operate as either one port or two ports, depending on the purpose, by simply controlling the level of the output mode conversion signal $\overline{\text{TFT}}$. Therefore, the serial access memory is easy to put into free use and can be widely used for various purposes. Further, the serial access memory can be made inexpensive from the standpoint of its manufacture. Here, the value of the output mode conversion signal $\overline{\text{TFT}}$ may be decided by an externally-input type control system, or may be determined by laser fuse trimming, an option mask or the like, in a final manufacturing step.

A serial access memory according to a twenty-third embodiment of the present invention will now be described below.

The serial access memory according to the twenty-third embodiment of the present invention has a basic construction as shown in FIG. 26. According to the twenty-third embodiment, independent serial address groups SYADDA and SYADDB are employed, as an alternative to the common serial address group SYADD, for separate input respectively to the serial address circuit 8A and the serial address circuit 8B, employed in the serial access memory of FIG. 25.

The serial access memory according to the present embodiment basically operates in a manner substantially similar to the serial access memory according to the twenty-second embodiment. However, since the serial address groups SYADDA and SYADDB are not in common, data stored at different addresses in the respective data registers 7A and 7B, can be output serially. Thus, the present embodiment has the advantages obtained in the second and twenty-second embodiments.

A serial access memory according to a twenty-fourth embodiment of the present invention will now be described below.

Figure 27:
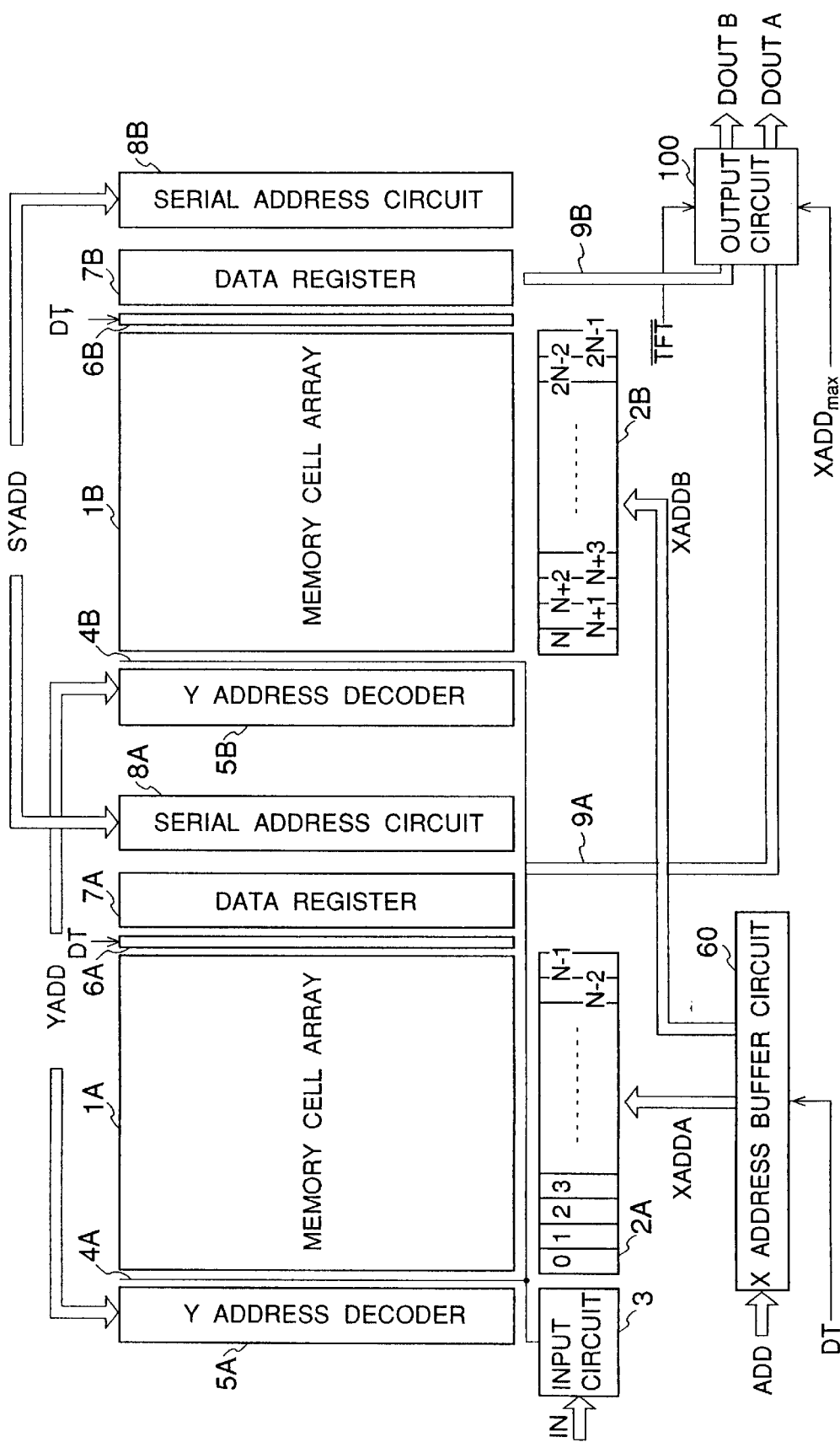
FIG. 27 is a fragmentary block diagram illustrating the structure of a serial access memory according to a twenty-fourth embodiment of the present invention.

FIG. 27 is a block diagram schematically showing the serial access memory according to the twenty-fourth embodiment of the present invention. Elements common to those in FIG. 9 illustrating the third embodiment, are identified by common reference numerals.

In the serial access memory referred to above, the output circuit 100 of FIG. 26 illustrating the twenty-second embodiment, is electrically connected to read data buses 9A and 9B as an alternative to the serial output circuits 10A and 10B shown in FIG. 9 illustrating the third embodiment.

The serial access memory according to the present twenty-fourth embodiment basically operates in a manner substantially similar to that according to the third embodiment. However, the output circuit 100 is electrically connected to the read data buses 9A and 9B. Therefore, a serial read output on either one of the read data buses 9A and 9B can be output from an output terminal DOUTA based on the maximum X address $\text{XADD}_{max}$, in a manner similar to output operations of the twenty-second embodiment, as if the output circuit 100 of a two-port output type could be activated in the-form of one port, by controlling the level of an output mode conversion signal $\overline{\text{TFT}}$. Accordingly, the present embodiment has both the above-described advantages provided by the third embodiment, and the above-described advantages provided by the output circuit in FIG. 27 illustrating the twenty-second embodiment.

A serial access memory according to a twenty-fifth embodiment of the present invention will now be described below.

The serial access memory according to the twenty-fifth embodiment of the present invention has a basic construction as shown in FIG. 27. According to the twenty-fifth embodiment, independent serial address groups SYADDA and SYADDB are employed, as an alternative to the common serial address group SYADD for separative input respectively to the serial address circuit 8A and the serial address circuit 8B.

The serial access memory according to the present embodiment basically operates in a manner substantially similar to the serial access memory according to the fourth embodiment. However, since the output circuit 100 is provided in place of output circuits 10A and 10B, a serial read output on either one of read data buses 9A and 9B can be output from an output terminal DOUTA based on the maximum X address $\text{XADD}_{max}$ in a manner similar to the twenty-fourth embodiment. That is, the two-output port type output circuit 100 can be activated in the form of one port, by controlling the level of the output mode conversion signal $\overline{\text{TFT}}$. Accordingly, the present embodiment has the advantages provided by the fourth embodiment and that provided by the output circuit of the twenty-second embodiment.

A serial access memory according to a twenty-sixth embodiment of the present invention will now be described below.

Figure 28:
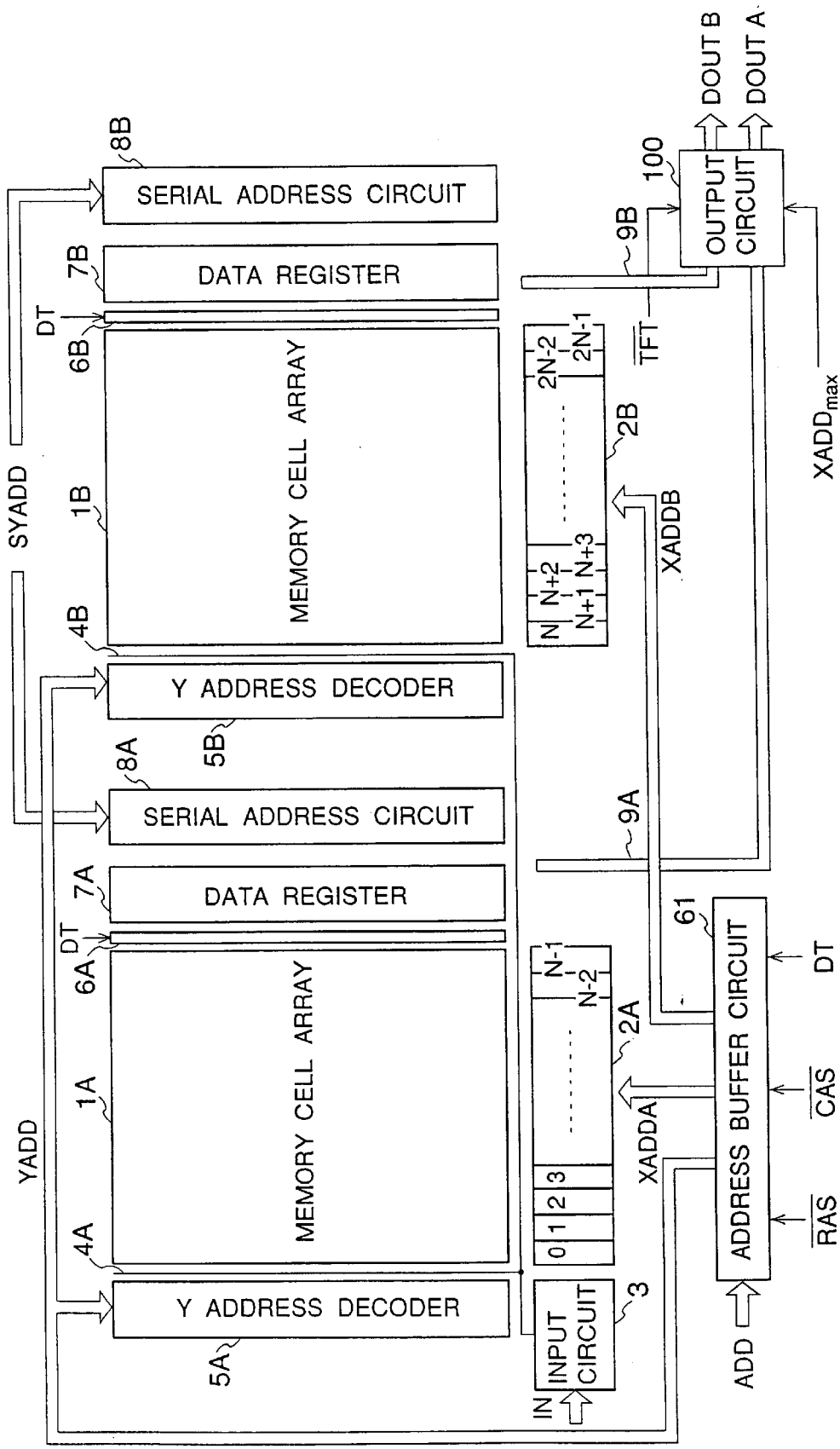
FIG. 28 is a block diagram depicting the structure of a serial access memory according to a twenty-sixth embodiment of the present invention.

FIG. 28 is a block diagram schematically illustrating the structure of the serial access memory according to the twenty-sixth embodiment of the present invention. Elements common to those shown in FIG. 11 illustrating the fifth embodiment and FIG. 26 illustrating the twenty-second embodiment, are identified by common reference numerals.

In the serial access memory according to the present embodiment, the output circuit 100 shown in FIG. 26, illustrating the twenty-second embodiment, is provided as an alternative to the serial output circuits 10A and 10B, shown in FIG. 11 illustrating the fifth embodiment. Further, the output circuit 100 is electrically connected to both read data buses 9A and 9B.

The serial access memory according to the present embodiment is activated in basically the same manner as is that according to the fifth embodiment. Since the output circuit 100 is provided in place of the serial output circuits 10A and 10B, a serial read output on either one of the read data buses 9A and 9B can be output from an output terminal DOUTA based on the maximum X address $\text{XADD}_{max}$ as if the output circuit 100 of a two-port output type could be activated in the form of one port by controlling the level of an output mode conversion signal $\overline{\text{TFT}}$. Such operation is possible even in the case of a serial access memory of such a type that serial outputs are respectively generated from the same X addresses (the same relative locations) in the memory cell arrays 1A and 1B. Thus, the present embodiment has not only advantages substantially similar to those provided by the fifth embodiment, but also the advantage obtained in the twenty-second embodiment, due to the provision of the common output circuit 100.

A serial access memory according to a twenty-seventh embodiment of the present invention will now be described below.

The serial access memory according to the twenty-seventh embodiment of the present invention has a basic construction as shown in FIG. 28. According to the twenty-seventh embodiment, independent serial address groups SYADDA and SYADDB are employed as an alternative to the common serial address group SYADD input to each of the serial address circuits 8A and 8B, in the serial access memory of FIG. 28 illustrating the twenty-sixth embodiment. The twenty-seventh embodiment may also be viewed as a modification of the sixth embodiment wherein the output circuit 100 of FIG. 26 replace the separate output circuits 10A and 10B.

In the serial access memory according to the present embodiment, data stored at different addresses respectively in data registers 7A and 7B, can be output serially, since the serial address groups SYADD and SYADDB are different from each other. Since there is also provided a common output circuit 100, a serial read output on either one of read data buses 9A and 9B can be output from an output terminal DOUTA as if the output circuit 100, of the two-port output type, could be activated in the form of one port, by controlling the level of an output mode conversion signal $\overline{\text{TFT}}$. Accordingly, the present embodiment can provide the same advantages provided by the sixth and twenty-second embodiments.

A serial access memory according to a twenty-eighth embodiment of the present invention will now be described below.

Figure 29:
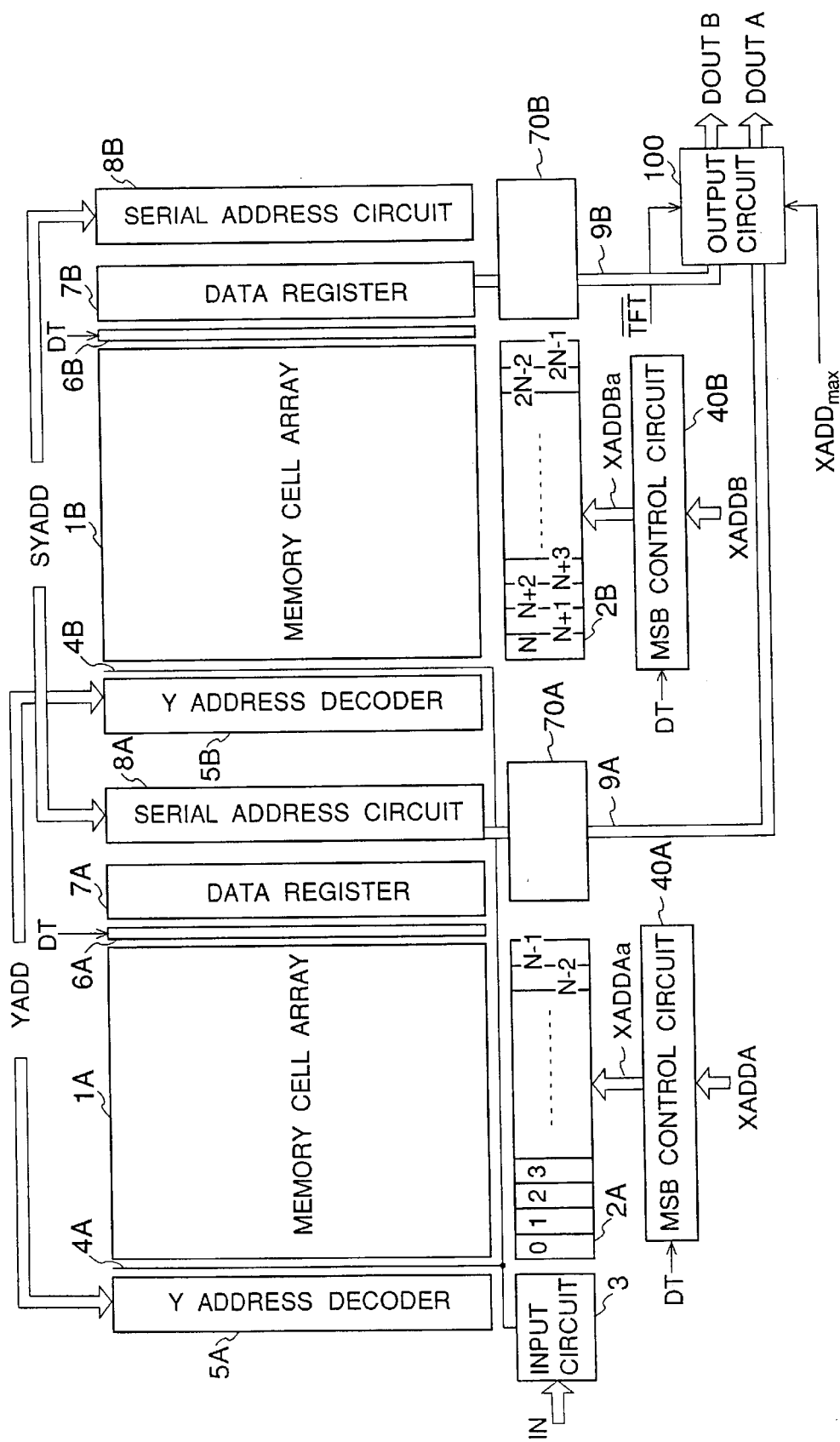
FIG. 29 is a block diagram showing the structure of a serial access memory according to a twenty-eighth embodiment of the present invention.

FIG. 29 is a block diagram schematically showing the structure of the serial access memory according to the twenty-eighth embodiment of the present invention. Elements common to those shown in FIGS. 13 and 14 illustrating the seventh embodiment and FIG. 26 illustrating the twenty-second embodiment, are denoted by common reference numerals.

In the serial access memory according to the present embodiment, the output circuit 100 in FIG. 26, illustrating the twenty-second embodiment, is provided as an alternative to the serial output circuits 10A and 10B shown in FIG. 13, illustrating the seventh embodiment The output circuit 100 is electrically connected to read data buses 9A and 9B.

Since there are provided output-sequence converting circuits 70A and 70B in the serial access memory according to the present embodiment, in a manner similar to the seventh embodiment, the order or sequence for serially outputting read data on the read data buses 9A and 9B can be changed, and the read data thus processed can be output in the changed sequence. Further, since a common output circuit 100 is provided in a manner similar to the twenty-second embodiment, the serial read data on either one of the read data buses 9A and 9B can be output from an output terminal DOUTA based on the maximum X address $\text{XADD}_{max}$, as if the output circuit 100, of a two-port output type, could be activated in the form of one port, by controlling the level of an output mode conversion signal $\overline{\text{TFT}}$. Thus, the present embodiment can bring about the same advantages provided by the seventh and twenty-second embodiments.

A serial access memory according to a twenty-ninth embodiment of the present invention will now be described below.

The serial access memory according to the twenty-ninth embodiment of the present invention has a basic construction according to the circuit diagram of FIG. 29, wherein each of the output-sequence converting circuits 70A and 70B has a construction according to the circuit shown in FIG. 16 illustrating the eighth embodiment and the common output circuit 100 has the construction shown in FIG. 26 illustrating the twenty-second embodiment. Therefore, the serial access memory can bring about operations and effects similar to those obtained by the output-sequence converting circuits 70A and 70B employed in the eighth embodiment and to those obtained by the output circuit 100 in FIG. 26 illustrating the twenty-second embodiment.

A serial access memory according to a thirtieth embodiment of the present invention will now be described below.

The serial access memory according to the thirtieth embodiment of the present invention has a basic construction according to the circuit diagram of FIG. 29, wherein each of the output-sequence converting circuits 70A and 70B has a construction according to the circuit shown in FIG. 18 illustrating the ninth embodiment, and the common output circuit 100 has the construction shown in FIG. 26 illustrating the twenty-second embodiment. Therefore, the present embodiment can bring about operations and effects similar to those obtained by the output-sequence converting circuits 70A and 70B employed in the ninth embodiment and the common output circuit 100 in FIG. 26 illustrating the twenty-second embodiment.

A serial access memory according to a thirty-first embodiment of the present invention will now be described below.

The serial access memory according to the thirty-first embodiment of the present invention has a construction according to the circuit diagram of FIG. 29, wherein each of the output-sequence converting circuits 70A and 70B has a construction according to the circuit shown in FIG. 20 illustrating the tenth embodiment and the common output circuit 100 has the construction shown in FIG. 26 illustrating the twenty-second embodiment. Therefore, the present embodiment can bring about operations and effects similar to those obtained by the output-sequence converting circuits 70A and 70B employed in the tenth embodiment and the output circuit 100 in FIG. 26 illustrating the twenty-second embodiment.

Serial access memories according to a thirty-second embodiment of the present invention will now be described below.

The serial access memories according to the thirty-second embodiment of the present invention have a basic construction as shown in FIG. 29. According to the thirty-second embodiment, independent serial address groups SYADDA and SYADDB are employed, as an alternative to the common serial address group SYADD, for separate input to the respective serial address circuits 8A and 8B shown in FIG. 29, in any of the twenty-eighth, twenty-ninth, thirtieth and thirty-first embodiments.

In the serial access memories according to the present embodiment, the serial address groups SYADDA and SYADDB are different from each other, as in the eleventh embodiment. Therefore, data stored in data registers 7A and 7B at different addresses can be serially output. Further, a common output circuit 100 is provided on the output sides of output-sequence converting circuits 70A and 70B, in a manner similar to each of the twenty-eighth to thirty-first embodiments. Therefore, a serial read output on either one of read data buses 9A and 9B can be output from one output terminal DOUTA, as if the output circuit 100 of a two-port output type could be activated in the form of one port, by controlling the level of an output mode conversion signal $\overline{\text{TFT}}$. Accordingly, the present embodiment can bring about the advantage provided by the eleventh embodiment and the advantages provided by the twenty-eighth to thirty-first embodiments.

A serial access memory according to a thirty-third embodiment of the present invention will now be described below.

Figure 30:
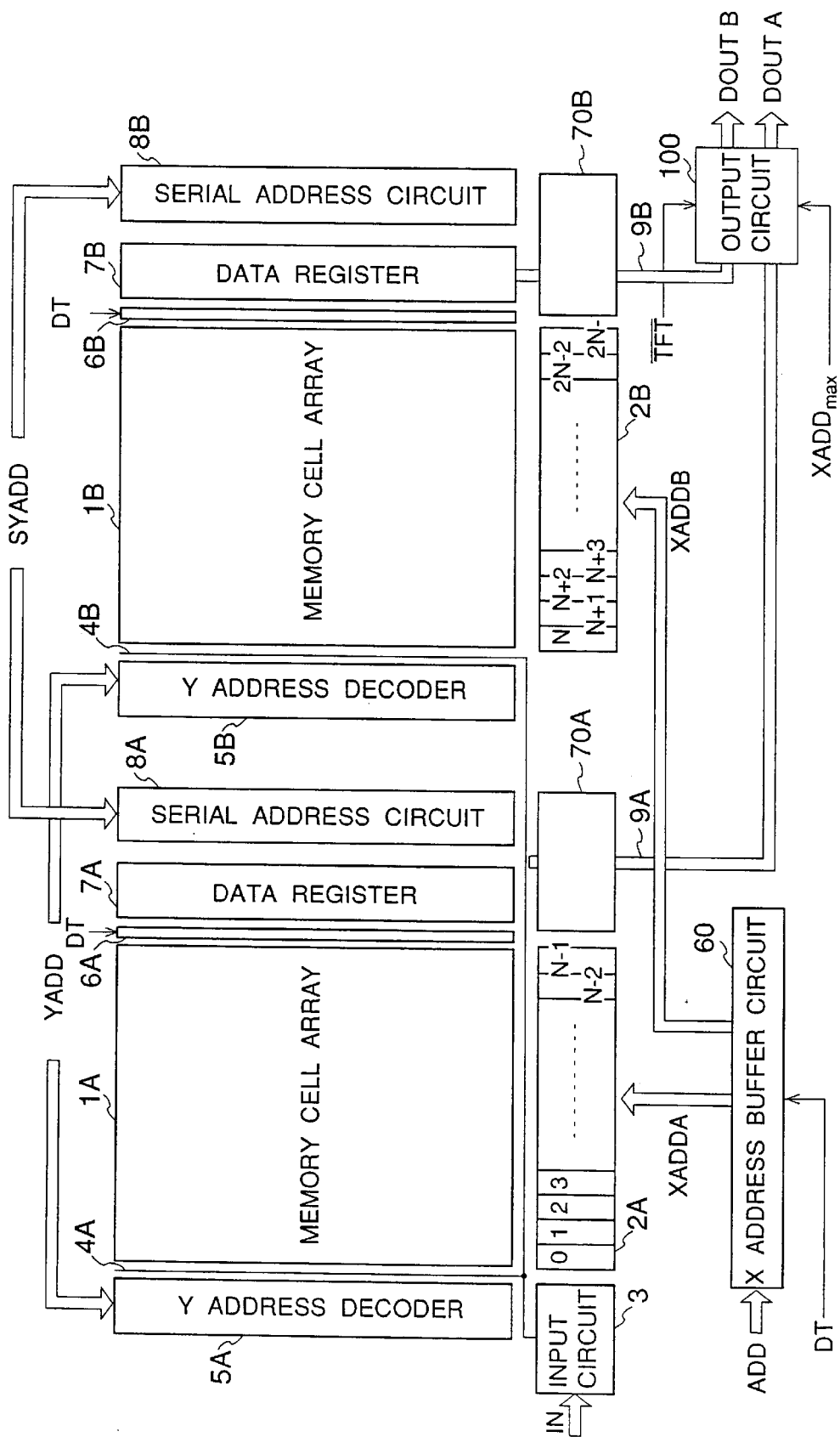
FIG. 30 is a block diagram illustrating the structure of a serial access memory according to a thirty-third embodiment of the present invention.

FIG. 30 is a block diagram schematically showing the structure of the serial access memory according to the thirty-third embodiment of the present invention. Elements common to those in FIG. 23, illustrating the twelfth embodiment, and those in FIG. 26, illustrating the twenty-second embodiment, are denoted by common reference numerals.

The serial access memory according to the present thirty-third embodiment is obtained by substituting the common output circuit 100 of FIG. 26 for the serial output circuits 10A and 10B, in FIG. 23 illustrating the twelfth embodiment illustrated in FIG. 23, with the output circuit 100 electrically connected to the outputs of output-sequence converting circuits 70A and 70B.

The serial access memory according to the present embodiment is activated in basically the same manner that the twelfth embodiment is activated. However, since the common output circuit 100 is provided, the serial access memory of the present embodiment operates differently than the twelfth embodiment. That is, the common output circuit 100 has a function to receive therein an output mode conversion signal $\overline{\text{TFT}}$, and a maximum X address XADD$_{max}$ brought into an "L" state when an X address decoder 2A is selected, and an "H" state when an X address decoder 2B is selected. The output circuit 100 outputs serial data from the output-sequence converting circuits 70A and 70B to output terminals DOUTA and DOUTB respectively. Thus, a serially read output on either one of read data buses 9A and 9B can be output from the output terminal DOUTA based on the maximum X address XADD$_{max}$, and the output circuit 100 (of a two-port output type) can be activated provide one port by controlling the level of the output mode conversion signal $\overline{\text{TFT}}$. At this time, the output terminal DOUTB corresponding to the other port is brought into a high-impedance state. Moreover, such as output operation can be effected even in the case of a serial access memory of such a type that serial outputs are respectively generated from the same X addresses in the respective memory cell arrays 1A and 1B, as has been described above with regard to the twelfth embodiment.

The present embodiment has advantages substantially similar to those provided by the twelfth embodiment. Further, since there is provided the common output circuit 100, the present embodiment can bring about the following advantage in a manner similar to the twenty-second embodiment. The output circuit 100 corresponding to the identical device can be freely set to output data from either one port or two ports, depending on the purpose, by simply controlling the level of the output mode conversion signal $\overline{\text{TFT}}$. Therefore, the serial access memory has advantages of increased convenience and breadth of use.

A serial access memory according to a thirty-fourth embodiment of the present invention provides output-sequence converting circuits having the construction shown in FIG. 16, illustrating the eighth embodiment, as circuits 10A and 10B in the serial access memory of FIG. 30 illustrating the thirty-third embodiment. Therefore, the present embodiment performs operations and provides effects, substantially similar to those provided by the eighth and thirty-third embodiments.

A serial access memory according to a thirty-fifth embodiment of the present invention provides output-sequence converting circuits having the consruction shown in FIG. 18, illustrating the ninth embodiment, as circuits 70A and 70B of the serial access memory of FIG. 30, illustrating the thirty-third embodiment. Therefore, the present embodiment performs operations and provides effects, substantially similar to those obtained in the ninth and thirty-third embodiments.

A serial access memory according to a thirty-sixth embodiment of the present invention provides output-sequence converting circuits having the construction shown in FIG. 20, illustrating the tenth embodiment, as circuits 70A and 70B of the serial access memory of FIG. 30, illustrating the thirty-third embodiment. Therefore, the present embodiment performs operations and provides effects substantially similar to those obtained in the tenth and thirty-third embodiments.

Serial access memories according to a thirty-seventh embodiment of the present invention will now be described below.

The serial access memories according to the present thirty-seventh embodiment of the present invention have a basic construction as shown in FIG. 30. According to the thirty-seventh embodiment, independent serial address groups SYADDA and SYADDB are used in place of the common serial address group SYADD, for separate input to the respective serial address circuits 8A and 8B shown in FIG. 30, in any of the thirty-third, thirty-fourth, thirty-fifth and thirty-sixth embodiments. Thus, since the serial address groups SYADDA and SYADDB are different from each other, data stored at different addresses in the respective data registers 7A and 7B, can be serially output in a manner similar to the manner in which data is output by the sixteenth embodiment. Accordingly, the present embodiment can bring about the advantages provided by the sixteenth embodiment and the advantages provided by the thirty-third, thirty-fourth, thirty-fifth, or thirty-sixth embodiment.

A serial access memory according to a thirty-eighth embodiment of the present invention will now be described below.

Figure 31:
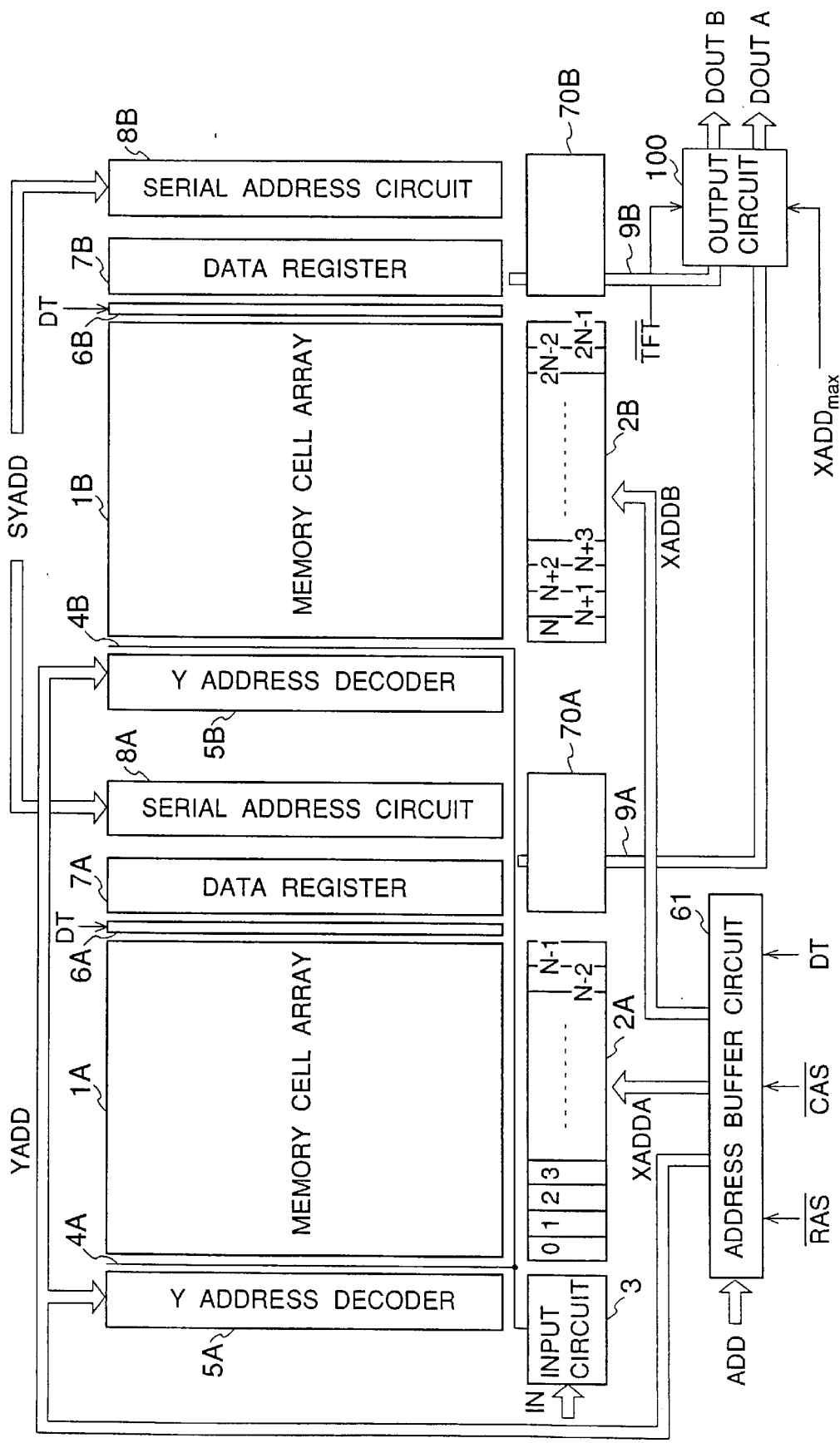
FIG. 31 is a block diagram showing the structure of a serial access memory according to a thirty-eighth embodiment of the present invention.

FIG. 31 is a block diagram schematically showing the structure of the serial access memory according to the thirty-eighth embodiment of the present invention. Elements common to those shown in FIG. 24, illustrating the seventeenth embodiment, and FIG. 25, illustrating the twenty-second embodiment, are denoted by common reference numerals.

In the serial access memory referred to above, the common output circuit 100 in FIG. 25, illustrating the twenty-second embodiment, is provided as an alternative to the serial output circuits 8A and 8B in FIG. 24, illustrating the seventeenth embodiment.

The serial access memory according to the present embodiment is operated in a manner basically similar to the seventeenth embodiment. Since, however, the common output circuit 100 in FIG. 25, illustrating the twenty-second embodiment, is provided in place of the serial output circuits 10A and 10B, the serial access memory of this embodiment operates differently than the seventeenth embodiment. That is, the common output circuit 100 has a function to receive therein an output mode conversion signal $\overline{TFT}$, and a maximum X address $XADD_{max}$, which takes on an "L" state when an X address decoder 2A is selected and an "H" state when an X address decoder 2B is selected. The circuit 100 outputs serially read outputs respectively on read data buses 9A and 9B, to the output terminals DOUTA and DOUTB. Therefore, the serially read output on either one of the read data buses 9A and 9B can be output from the output terminal DOUTA, based on the maximum X address $XADD_{max}$, and the output circuit 100 (of a two-port output type) can be activated to provide one port, by controlling the level of the output mode conversion signal $\overline{TFT}$. At this time, the output terminal DOUTB, corresponding to the other port, is brought into a high-impedance state. Thus, the present embodiment can bring about the advantages obtained in the seventeenth and twenty-second embodiments.

A serial access memory according to a thirty-ninth embodiment of the present invention provides the output-sequence converting circuits having the construction shown in FIG. 16, illustrating the eighth embodiment, as circuits 70A and 70B of the serial access memory of FIG. 31, illustrating the thirty-eighth embodiment. Therefore, the present embodiment can bring about operations and effects substantially similar to those obtained in the eighth and thirty-eighth embodiments.

A serial access memory according to a fortieth embodiment of the present invention provides output-sequence converting circuits having the construction shown in FIG. 18, illustrating the ninth embodiment, as circuits 70A and 70B of the serial access memory of FIG. 31, illustrating the thirty-eighth embodiment. Therefore, the present embodiment can bring about operations and effects substantially similar to those obtained in the ninth and thirty-eighth embodiments.

A serial access memory according to a forty-first embodiment of the present invention provides output-sequence converting circuits having the construction shown in FIG. 20, illustrating the tenth embodiment, as circuits 70A and 70B of the serial access memory of FIG. 31, illustrating the thirty-eighth embodiment is comprised of the circuit in FIG. 20 illustrating the tenth embodiment. Therefore, the present embodiment can bring about operations and effects substantially similar to those obtained in the tenth and thirty-eighth embodiments.

Serial access memories according to a forty-second embodiment of the present invention will now be described below.

The serial access memories according to the forty-second embodiment of the present invention have a basic construction as shown in FIG. 31. According to the fourty-second embodiment, independent serial address groups SYADDA and SYADDB are used as an alternative to the common serial address group SYADD, for separative input to the respective serial address circuits 8A and 8B shown in FIG. 31, in any of the thirty-eighth, thirty-ninth, fortieth and forty-first embodiments.

In the present embodiment, data stored at different addresses in the respective data registers 7A and 7B, can be serially output in a manner similar to the manner in which data is output by the twenty-first embodiment, because the serial address groups SYADDA and SYADDB are different from each other. Thus, the present embodiment can bring about the operations and advantageous effects obtained in the twenty-first embodiment as well as operations and advantageous effects similar to those obtained in each of the thirty-eighth, thirty-ninth, or fortieth embodiments or those obtained in the forty-first embodiment.

While the present invention has been described wit reference to illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A serial access memory, comprising:
   a first memory cell array including a plurality of memory cells each storing data therein, and a plurality of first word lines for applying respective first selection signals to the respective memory cells;
   a second memory cell array including a plurality of memory cells each storing data therein, and a plurality of second word lines for applying respective second selection signals to the respective memory cells;
   a first data register, coupled to the first memory cell array, for latching the data transferred from the first memory cell array;
   a second data register, coupled to the second memory cell array, for latching the data transferred from the second memory cell array;
   a first address decoder, connected to the first memory cell array, for outputting the first selection signals selectively to the first word lines, so as to select any of the first word lines in response to first address data applied to said first address decoder;
   a second address decoder, connected to the second memory cell array, for outputting the second selection signals selectively to the second word lines, so as to select any of the second word lines in response to second address data applied to said second address decoder; and
   a control circuit, receiving address data that includes a most significant bit, the address data having a first portion which specifies addresses less than a predetermined address value and a second portion which specifies addresses equal to or greater than the predetermined address value, for converting the most significant bit of the address data to a predetermined bit value, applying the first portion of the address data, including the predetermined bit value, to the first address decoder as the first address data at a time that the data is transferred from the first and second memory cell arrays respectively to the first and second registers, and simultaneously applying the second portion of the address data, including the predetermined bit value, to the second address decoder as the second address data.

2. The serial access memory according to claim 1, in combination with a display device comprising,
   a first display part coupled to the first data register, for displaying first visual data corresponding to the data latched in the first data register, and
   a second display part coupled to the second data register, for displaying second visual data corresponding to the data latched in the first data register.

3. The serial access memory according to claim 1, further comprising:
   an input circuit for applying write data to each of the first and second memory cell arrays;
   a plurality of first bit line pairs connected between the memory cells of the first memory cell array and the first data register;
   a plurality of second bit line pairs connected between the memory cells of the second memory cell array and the second data register;
   a third address decoder, responsive to further address data, for connecting any of the first bit line pairs with the input circuit; and
   a fourth address decoder, responsive to additional address data, for connecting any of the second bit line pairs with the input circuit,
   wherein the control circuit receives a row address strobe signal and a column address strobe signal, and applies the first and second address data to the first and second address decoders, respectively, when the row address strobe signal is received therein, and applies to the further and additional address data to the third and fourth decoders, respectively, when the column address strobe signal is received therein.

4. A serial access memory, comprising:
   a set of memory cells, the set of memory cells having a first memory cell group and a second memory cell group, each including a plurality of memory cells formed in rows and columns, each memory cell storing respective data;
   data register means for latching stored data transferred from the set of memory cells during a transferring period;
   a control circuit, receiving address data that includes a most significant bit, the address data having a first portion which specifies addresses less than a predetermined address value and a second portion which specifies addresses equal to or greater than the predetermined address value, for converting the most significant bit during the transferring period, so that the first portion of the address data is equal to the second portion of the address data; and
   address decoder means, to which the first and second portions of the address data are applied by said control circuit, for selecting memory cells in the first memory cell group in response to the first portion of the address data and for selecting memory cells in the second memory cell group in response to the second portion of the address data.

5. The serial access memory according to claim 4, in combination with a display device having a first display part and a second display part, corresponding respectively to the first and second memory cell groups, for displaying first visual data corresponding to the data stored in the first memory cell group and displaying second visual data corresponding to the data stored in the second memory cell group, respectively.

6. A serial access memory, comprising:
   a first memory cell array, including a plurality of memory cells storing data therein;
   a second memory cell array, including a plurality of memory cells storing data therein;
   a first data register coupled to the first memory cell array, for latching stored data transferred from the first memory cell array;
   a second data register, coupled to the second memory cell array, for latching stored data transferred from the second memory cell array;
   a first address decoder, connected to the first memory cell array, for selecting memory cells from among the memory cells of the first memory cell array, in response to first address data applied thereto;
   a second address decoder, connected to the second memory cell array, for selecting memory cells from among the memory cells of the second memory cell array, in response to second address data applied thereto; and
   a control circuit, receiving address data that includes a most significant bit, the address data having a first portion which corresponds to the first address data and which specifies addresses less than a predetermined address value and a second portion which corresponds to the second address data and which specifies addresses equal to or greater than the predetermined address value, for converting the most significant bit, at a time that the stored data is transferred from the first and second memory cell arrays to the first and second data registers, respectively, so that the first address data is equal to the second address data, and for applying the first address data and the second address data to the first and second address decoders, respectively.

7. The serial access memory according to claim 6, in combination with a display device, comprising,
   a first display part, coupled to the first data register, for displaying first visual data corresponding to the data latched in the first data register, and
   a second display part, coupled to the second data register, for displaying second visual data corresponding to the data latched in the second data register.

8. The serial access memory according to claim 6, further comprising:
   an input circuit for applying write data to the first and second memory cell arrays, respectively;
   a plurality of first bit line pairs, connected between the memory cells of the first memory cell array and the first data register;
   a plurality of second bit line pairs, connected between the memory cells of the second memory cell array and the second data register;
   a third address decoder for connecting any of the first bit line pairs with the input circuit, in response to further address data applied thereto; and
   a fourth address decoder for connecting any of the second bit line pairs with the input circuit, in response to additional address data applied thereto,
   wherein the control circuit receives a row address strobe signal and a column address strobe signal, applies the first and second address data to the first and second address decoders, respectively, when the row address strobe signal is inputted therein, and applies the further and additional address data to the third and fourth address decoders, respectively, when the column address strobe signal is inputted therein.

9. A serial access memory, comprising:
   a set of memory cells, the set of memory cells having a first memory cell group and a second memory cell group, each group including a plurality of memory cells formed in rows and columns, each memory cell storing respective data;
   data register means for latching data transferred from the set of memory cells during a transferring period;
   control circuit means for receiving input address data having a most significant bit, for controlling the most significant bit to convert the input address data to first address data and second address data, the first address data being equal to the second address data, and for outputting the first and second address data during the transferring period; and
   address decoder means, receiving the first and second address data from the control circuit, for selecting memory cells in the first memory cell group in response to the first address data, and for selecting memory cells in the second memory cell group in response to the second address data.

10. The serial access memory according to claim 9, in combination with a display device having first and second display parts corresponding respectively to the first and second memory cell groups, for displaying first visual data corresponding to the data stored in the first memory cell group, and displaying second visual data corresponding to the data stored in the second memory cell group.

11. The serial access memory according to claim 9, wherein the address data has a first portion which specifies addresses less than a threshold address value and a second portion which specifies addresses equal to or greater than the threshold address value, the first portion corresponding to the first address data and the second portion corresponding to the second address data, the control circuit converting the most significant bit during the transferring period so that the first address data is equal to the second address data, and applying the first address data and the second address data to the address decoder means.

12. A serial access memory, comprising:
   a first memory cell array which includes a plurality of word lines and memory cells connected to the word lines;
   a second memory cell array which includes a plurality of word lines and memory cells connected to the word lines;
   a bus having a plurality of pairs of lines, each pair of lines corresponding to a bit of an address signal which has a most significant bit, the pairs of lines including an MSB pair which corresponds to the most significant bit;
   means for applying the bits in inverted and non-inverted form to the corresponding pairs of lines;
   a first address decoder connected between the bus and the word lines of the first memory cell array;
   a second address decoder connected between the bus and the word lines of the second memory cell array; and
   MSB control means for bringing both of the MSB pair of lines a common digital state simultaneously during a data-reading operation.

13. The serial access memory of claim 12, further comprising:
   a first data register, coupled to the first memory cell array, to latch a plurality of stored values transferred from the first memory cell array during the data-reading operation;
   a second data register, coupled to the second memory cell array, to latch a plurality of stored values transferred from the second memory cell array during the data-reading operation;
   means for serially reading out values latched in the first data register to provide a first serial signal; and
   means for serially reading out values latched in the second data register to provide a second serial signal.

14. The serial access memory of claim 13, further comprising an output circuit having first and second input ports and first and second output ports, the first serial signal being received by the first input port and the second serial signal being received by the second input port, the output circuit including output mode means, responsive to the most significant bit and to an output mode conversion signal, for outputting the first serial signal via the first output port and the second serial signal via the second output port when the output mode conversion signal has a predetermined digital value and for outputting both the first and second serial signals via one of the first and second output ports when the output mode conversion signal has another digital value.

15. The serial access memory of claim 14, wherein the output mode means comprises means for inverting the first and second serial signals before the first and second serial signals are output from the output circuit.

16. The serial access memory of claim 12, further comprising:
a first read data bus;
means for reading out first groups of values stored in the first memory cell array onto the first read data bus;
a first serial output circuit;
first output converting circuit means, connected between the first read data bus and the first serial output circuit and receiving a further address signal, for selecting an order in which the values in the first groups will be serially output;
a second read data bus;
means for reading out second groups of values stored in the second memory cell array onto the second read data bus;
a second serial output circuit; and
second output converting circuit means, connected between the second read data bus and the second serial output circuit and receiving the further address signal, for selecting an order in which the values in the second groups will be serially output.

17. The serial access memory of claim 16, wherein the first output converting circuit means comprises a plurality of transistor switches connected to the first read data bus, and means for decoding the further address signal to close a transistor switch selected by the further address signal.

18. The serial access memory of claim 17, further comprising means for generating the further address signal, the means for generating the further address signal including a shift register.

19. The serial access memory of claim 13, in combination with a display device having a first portion which receives the first serial signal and a second portion which receives the second serial signal.

* * * * *